United States Patent
Ibane

(10) Patent No.: US 7,107,815 B2
(45) Date of Patent: Sep. 19, 2006

(54) METHOD FOR CALIBRATING SEMICONDUCTOR TEST INSTRUMENTS

(75) Inventor: Toru Ibane, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/352,087

(22) Filed: Feb. 11, 2006

(65) Prior Publication Data

US 2006/0123878 A1 Jun. 15, 2006

Related U.S. Application Data

(62) Division of application No. 10/479,726, filed as application No. PCT/JP02/05604 on Jun. 6, 2002, now Pat. No. 7,043,959.

(30) Foreign Application Priority Data

| Jun. 7, 2001 | (JP) | ............................... 2001-172210 |
| Feb. 7, 2002 | (JP) | ............................... 2002-30576 |
| Mar. 19, 2002 | (JP) | ............................... 2002-75316 |

(51) Int. Cl.
*G01R 35/00* (2006.01)

(52) U.S. Cl. ...................................................... 73/1.42
(58) Field of Classification Search ................ 73/1.42; 324/766
See application file for complete search history.

(56) References Cited

U.S. PATENT DOCUMENTS

| 4,929,888 | A | 5/1990 | Yoshida | |
| 5,894,081 | A | 4/1999 | Ashuri | 75/1.42 |
| 6,327,678 | B1 | 12/2001 | Nagai | 714/700 |
| 6,417,682 | B1 | 7/2002 | Suzuki et al. | 324/755 |
| 6,570,397 | B1 | 5/2003 | Mayder et al. | 324/754 |
| 6,812,727 | B1 * | 11/2004 | Kobayashi | 324/765 |
| 2006/0123879 | A1 * | 6/2006 | Ibane | 73/1.42 |
| 2006/0123880 | A1 * | 6/2006 | Ibane | 73/1.42 |
| 2006/0123881 | A1 * | 6/2006 | Ibane | 73/1.42 |
| 2006/0123882 | A1 * | 6/2006 | Ibane | 73/1.42 |

FOREIGN PATENT DOCUMENTS

| DE | 10061962 | 3/2002 | |
| EP | 919823 | 6/1999 | |
| JP | 63-015179 | 1/1988 | ................ 370/476 |
| JP | 02-062983 | 3/1990 | |
| JP | 04-127073 | 4/1992 | ................ 714/724 |
| JP | 04-225180 | 8/1992 | ................ 324/765 |
| JP | 8-226957 | 9/1996 | |
| JP | 9-80118 | 3/1997 | |
| JP | 2638274 | 4/1997 | |
| JP | 11-190760 | 7/1999 | |
| JP | 11-287844 | 10/1999 | |
| JP | 2000-199781 | 7/2000 | |
| JP | 2000-31464 | 11/2000 | |
| JP | 2001-183432 | 7/2001 | |
| JP | 2002-139556 | 5/2002 | |

* cited by examiner

*Primary Examiner*—Thomas P. Noland
(74) *Attorney, Agent, or Firm*—Dellett & Walters patenttm.us

(57) ABSTRACT

A method for calibrating a semiconductor test instrument leading cost reduction, simplified work, and short working time. Drivers are related to comparators in one-to-one correspondence. A clock signal and a strobe signal have a one-to-one correspondence. The phase of either a clock signal or a strobe signal is adjusted with reference to the phase of the other signal. The relative phase difference between clock signals or between strobe signals are determined. The phases of the clock and strobe signals are adjusted with reference to the relative phase difference.

16 Claims, 67 Drawing Sheets

F/G. 11

F I G. 14
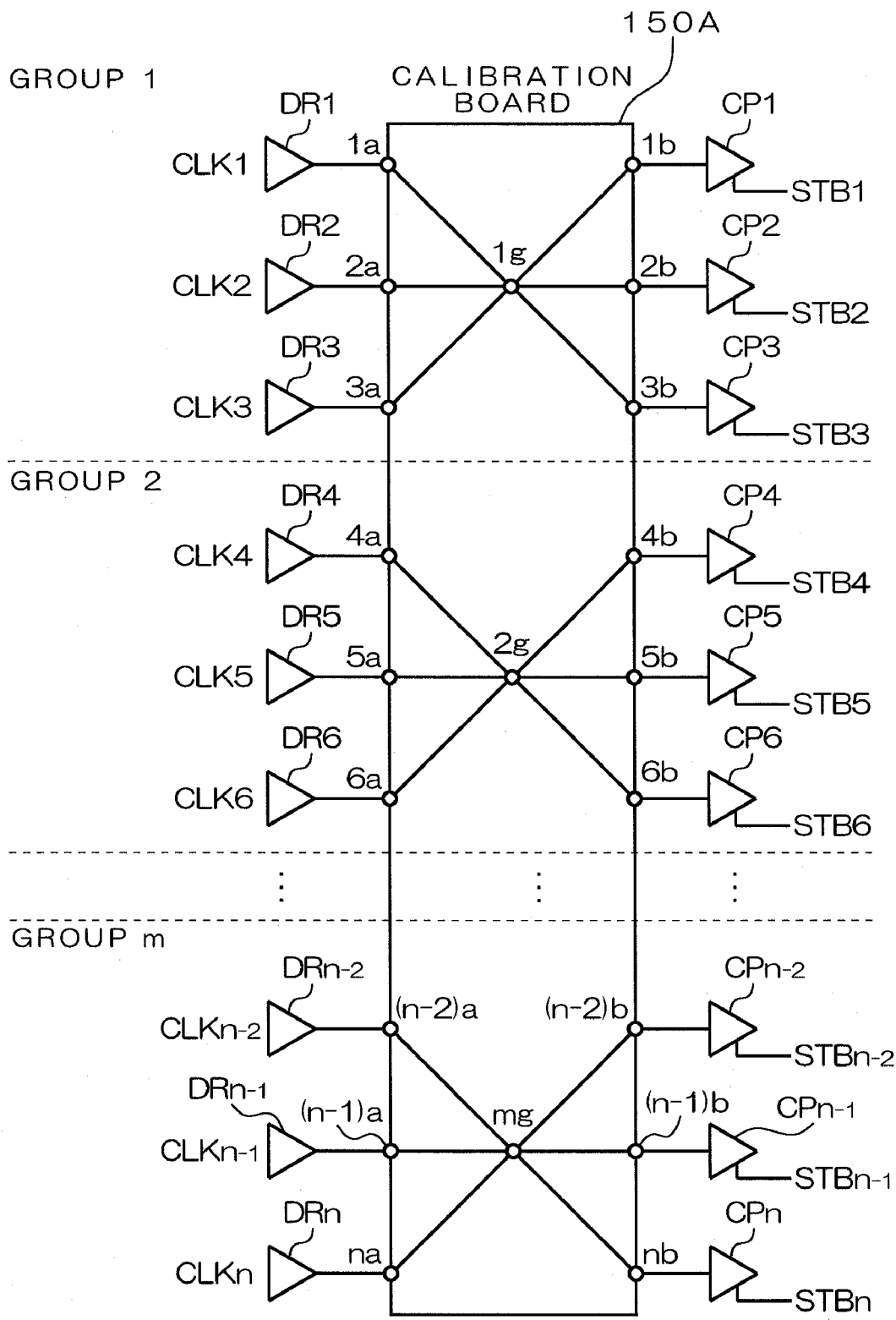

F/G. 38

F I G. 42
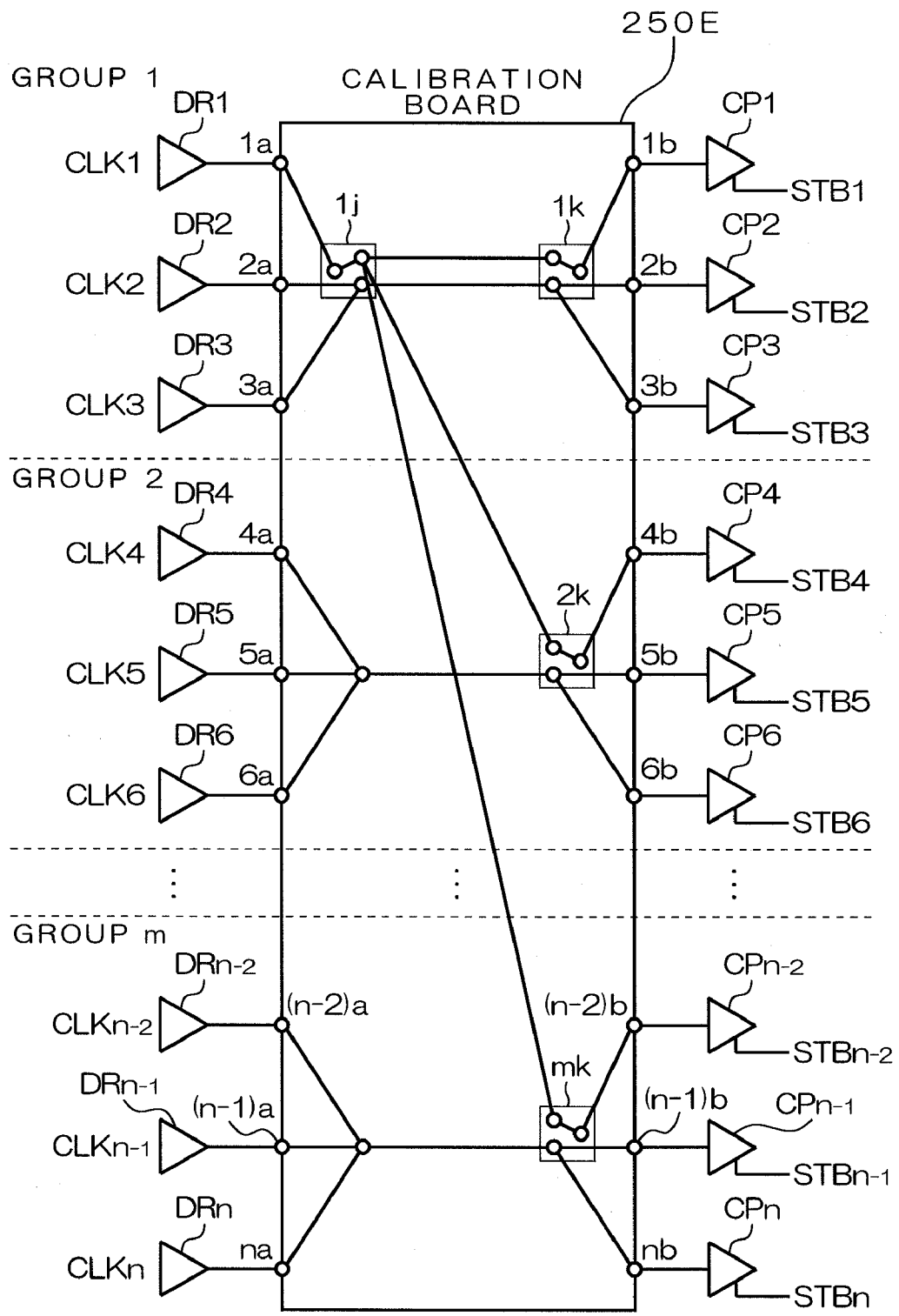

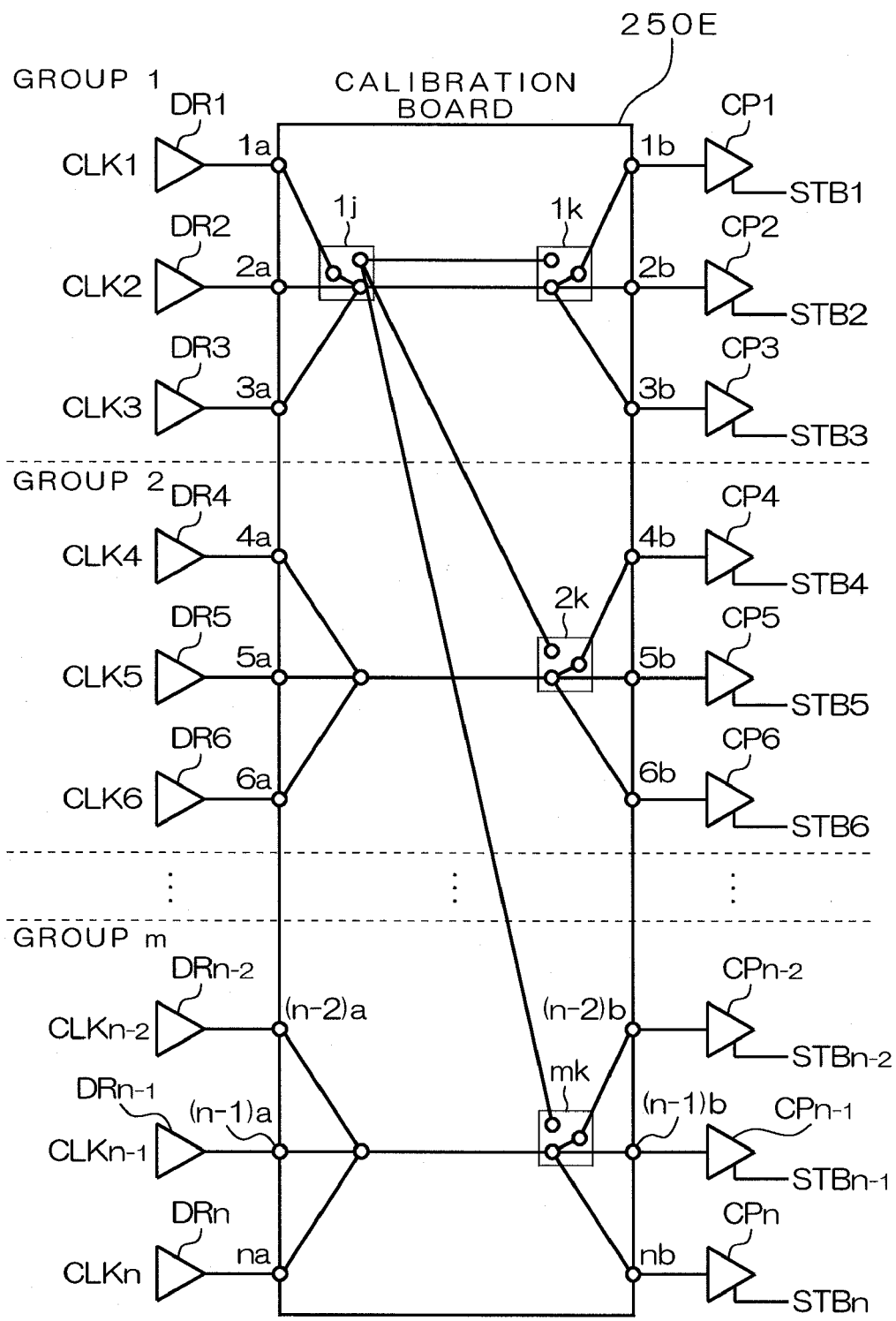
F I G. 43

F I G. 67
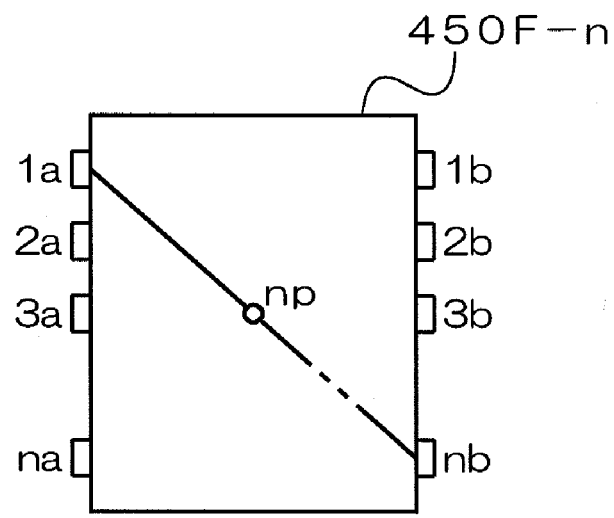
F I G. 68
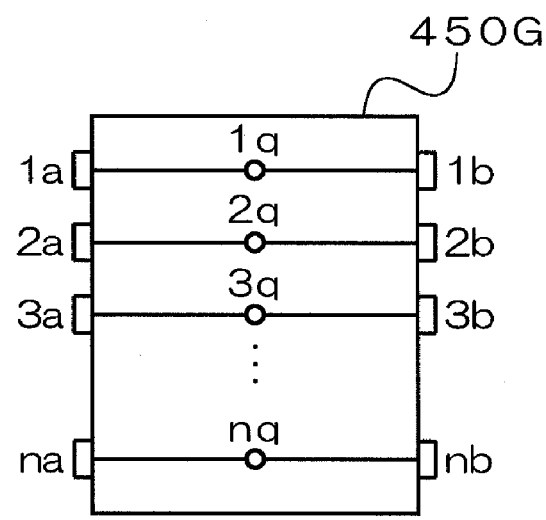

METHOD FOR CALIBRATING SEMICONDUCTOR TEST INSTRUMENTS

TECHNICAL FIELD

The present invention relates to a method for calibrating a semiconductor test instrument for adjusting operation timings of a driver and a comparator in pin electronics of the semiconductor test instrument.

BACKGROUND ART

The pin electronics of a semiconductor test instrument includes a driver for applying a signal to a device under test and a comparator for determining the logic of a signal output from the device under test correspondingly to the signal. The driver outputs a signal synchronizing with an input clock signal. Moreover, the comparator determines synchronously with an input strobe signal.

In the initial state of the semiconductor test instrument, because the time length of a signal route for each input/output pin of the device under test fluctuates, the timing for outputting a signal from the driver or the determination timing of the comparator shifts from an expected timing. Therefore, timing calibration is applied to the device under test before various tests are executed.

FIG. 73 is an illustration showing a conventional configuration of a semiconductor test instrument for performing timing calibration. In FIG. 73, a semiconductor test instrument 90 is connected to a socket board 94 through an exclusive cable 93 provided for a performance board 92. For example, to apply various tests to a device under test having a BGA (Ball Grid Array) type package, the socket board 94 on whose surface many pogo pins are provided. A test board 96 is used to simplify the operation for bringing a probe 99 extended from a reference driver/comparator (DR/CP) section 98 into contact with these pogo pins provided for the surface of the socket board 94 and has a structure in which pads provided for the surface and back are electrically connected each other.

FIG. 74 is an electrical layout diagram of the conventional configuration shown in FIG. 73. The semiconductor test instrument 90 is provided with a plurality of sets of drivers and comparators and each set of a driver and a comparator is connected to a common device socket end through the performance board (PB) 92 and socket board (SB) 94. In FIG. 74, a test board 96 is omitted.

FIGS. 75, 76, and 77 are illustrations showing the outline of conventional timing calibration. As shown in FIG. 75, phases (skews) of clock signals CLK1 to CLKn and strobe signals STB1 to STBn input to n drivers DR1 to DRn and n comparators CP1 to CPn respectively are shifted in the initial state of a semiconductor test instrument.

First, the probe 99 of the reference driver/comparator section 98 is connected to any device socket end through the test board 96 to make the phase of the strobe signal STB1 (timing of comparison by comparator CP1) coincide with the rise timing of a reference driver signal (reference DR) (FIG. 76). Then, after the phase of a reference comparator signal (reference CP) is made to coincide with the rise timing of an output signal of the reference driver, the phase of the clock signal CLK1 input to the driver DR1 is adjusted so that the rise timing of a signal output from the driver DR1 coincides with the output timing of the reference comparator signal (timing of comparison by reference comparator) (FIG. 77). The above timing calibration operation is performed every device socket end.

Because the timing calibration method of the above conventional semiconductor test instrument performs timing correction at a device socket end, it is necessary to repeat movement of the probe 99 provided for the reference driver/comparator section 98 and contact of the front end of the probe 99. Therefore, to automate the above operation, a special apparatus is necessary. It is considered to make a robot perform the above operation. However, this type of the robot is generally expensive and it is not easy to handle the robot in order to secure a high optional accuracy in many cases. Therefore, there is a problem that operation contents are complicated. It is possible to manually align the probe 99 without using a robot. However, when a device under test has many pins or there are many devices under test that are tested at the same time, the number of times for repeating movement and contact of the probe 99 greatly increases. Therefore, there is a problem that the working time until timing calibration is completed increases.

DISCLOSURE OF THE INVENTION

The present invention is created to solve the above problems and its object is to provide a method for calibrating a semiconductor test instrument capable of reducing the cost, simplifying operation contents, and shortening the working time.

A method of the present invention for calibrating a semiconductor test instrument is constituted by including first to third steps in order to perform the timing calibration of a semiconductor test instrument provided with a driver for generating a signal synchronizing with a clock signal and a comparator for performing the comparison synchronizing with a strobe signal. In the first step, phases of one of clock signals and strobe signals set in one-to-one correspondence are adjusted on the basis of the other while each of a plurality of drivers corresponds to each of a plurality of comparators. In the second step, relative phase differences between clock signals corresponding to a plurality of drivers respectively or relative phase differences between strobe signals corresponding to a plurality of comparators respectively are obtained. In the third step, phases of a plurality of clock signals and phases of a plurality of strobe signals are adjusted in accordance with relative phase differences. Because an exclusive reference driver/comparator section for performing only timing calibration, a probe connected to the section, and an exclusive robot for automating movement and contact of a probe are unnecessary though they have been necessary so far, it is possible to greatly reduce the cost.

Particularly, it is preferable to perform the phase adjustment to be executed in the above first step by varying the phase of a clock signal so that timings for performing comparisons by comparators in accordance with strobe signals coincide with timings for changing signals output from drivers and input to comparators. Or, it is preferable to perform the phase adjustment to be executed in the above first step by varying phases of strobe signals so that timings for performing comparisons by comparators in accordance with strobe signals coincide with timings for changing signals output from drivers and input to comparators. Moreover, it is preferable to perform phase difference obtainment to be executed in the above second step by measuring the phase difference of either of clock signals and strobe signals set in one-to-one correspondence on the basis of the other signals while changing combinations of drivers with comparators in the first step. By varying phases of clock signals or strobe signals while observing results of comparisons by comparators, it is possible to easily adjust phases or measure relative phase differences.

Moreover, it is preferable to insert delay elements for varying phases of signals into supply routes of clock signals to drivers and supply routes of strobe signals to comparators. By individually varying the delay value of each delay element, it is possible to adjust the phase of each clock signal and strobe signal corresponding to each device socket end to an optional value.

Furthermore, it is preferable that the first step is executed by using a first calibration board in which the output end of a corresponding driver and the input end of a corresponding comparator are connected to each short connection point through wirings having equal time lengths. Furthermore, it is preferable that the second step is executed by using a second calibration board different in wiring combination from the first calibration board in which the output end of a corresponding driver and the input end of a corresponding comparator are connected to each short connection point through wirings having equal time lengths. It is possible to adjust phases of clock signals and strobe signals and measure phase differences of strobe signals or phase differences of clock signals by using the first or second calibration board. Therefore, it is possible to simplify operation contents compared to a conventional method in which the phase of a clock signal or probe signal is adjusted every device socket end by using a probe.

Furthermore, it is preferable to include the fourth step of exchanging the first calibration board with the second calibration board between the first step and the second step. Because mechanical working includes only exchange of the first calibration board with the second calibration board, it is possible to greatly shorten the working time in the whole timing calibration.

Furthermore, it is preferable that the first step is executed by using a third calibration board in which the output end of a corresponding driver and the input end of a corresponding comparator are connected to each short connection point through wirings having equal time lengths and the second step is executed by changing wiring states of the third calibration board so that the output end of a corresponding driver and the input end of a corresponding comparator are connected to each short connection point through wirings having equal time lengths. By using the third calibration board capable of changing wiring contents, the exchange of calibration boards is unnecessary. Therefore, it is possible to further shorten the whole working time.

Furthermore, because a plurality of changeover switches for changing wiring states is included in the third calibration board, it is preferable to perform operations in the first and second steps by changing connection states of these switches. Thereby, it is possible to easily change wiring states of the third calibration board.

Furthermore, instead of using the above various calibration boards, it is allowed to use a calibration device or calibration wafer in which the same wiring is made. Particularly, by exchanging calibration devices by using a handler, it is possible to automate the exchanging operation.

Furthermore, a method of the present invention for calibrating a semiconductor test instrument is constituted by including the first to third steps in order to perform the timing calibration of the semiconductor test instrument provided with a driver for generating a signal synchronizing with a clock signal and a comparator for performing the comparison synchronizing with a strobe signal. In the first step, phases of a clock signal and a strobe signal are adjusted by making timings for changing signals output from a plurality of drivers and input to a plurality of comparators coincide with timings for performing comparisons by a plurality of comparators every group when the drivers and the comparators are divided into m number of groups so that two or more drivers or comparators are included. In the second step, relative phase differences of clock signals corresponding to the drivers or relative phase differences of strobe signals corresponding to the comparators are obtained for different groups. In the third step, phases of clock signals corresponding to drivers and phases of strobe signals corresponding to comparators included in a plurality of groups are adjusted in accordance with relative phase differences. Because an exclusive reference driver/comparator section for performing only timing calibration, a probe connected to the section, and an exclusive robot for automating movement and contact of the probe are unnecessary though they have been necessary so far, it is possible to greatly reduce the cost. Moreover, by performing calibration every group, it is possible to average adjustment errors in the group. Therefore, it is possible to reduce calibration errors caused by fluctuation of measurement results.

Furthermore, it is preferable to insert a delay element for varying the phase of a signal into each of supply routes of clock signals to the drivers and each of supply routes of strobe signals to the comparators. By individually varying the delay value of each delay element, it is possible to adjust phases of a clock signal and a strobe signal to optional values and thereby, it is simplified to adjust phases of these signals.

Furthermore, it is preferable that the first step is executed by using a first calibration board in which the output end of a driver and the input end of a comparator are connected each other through a first common short connection point for each of groups. Furthermore, it is preferable that the second step is executed by using a second calibration board in which the output end of a driver included in one group and the input end of a comparator included in the other group are connected each other through a second common connection point. Because calibration is performed by exchanging the first calibration board with the second calibration board, it is possible to simplify working contents compared to a conventional method for individually adjusting phases of a clock signal and a strobe signal by using a probe.

Furthermore, it is preferable to equally set the length of the wiring for connecting the driver with the first and second short connection points and the length of the wiring for connecting the comparator with the first and second short connection points. Thereby, it is possible to adjust every clock signal and strobe signal under the same condition and realize calibration by observing the output of a comparator.

Furthermore, it is preferable to include a fourth step of changing the first calibration board to the second calibration board between the first and second steps. Because mechanical working includes only exchange of the first calibration board with the second calibration board, it is possible to greatly shorten the working time in the whole timing calibration.

Furthermore, it is preferable that the first step is executed by using a third calibration board in which the output end of a driver and the input end of a comparator included in each group are connected through wirings having equal time lengths for every group and the second step is executed by changing wiring states of the third calibration board so that the output end of a driver included in one group and the input end of a comparator included in the other group are connected each other through wirings having equal time lengths. By using the third calibration board capable of changing wiring contents, it is unnecessary to exchange calibration boards and thereby it is possible to further shorten the whole working time.

Furthermore, because a plurality of changeover switches for changing wiring states is included in the third calibration board, it is preferable to perform operations in the first and second steps by changing connection states of these switches. Thereby, it is possible to easily change wiring states of the third calibration board.

Furthermore, instead of using the above various calibration boards, it is allowed to use a calibration device or calibration wafer in which the same wiring is made. Particularly, by exchanging calibration devices by using a handler, it is possible to automate the exchanging operation.

Furthermore, a method of the present invention for calibrating a semiconductor test instrument is constituted by including first to third steps in order to perform the timing calibration of the semiconductor test instrument provided with a driver for generating a signal synchronizing with a clock signal and a comparator for performing the comparison synchronizing with a strobe signal. In the first step, while a plurality of drivers and a plurality of comparators are divided into m number of groups so that two or more drivers or comparators are included, the phase of a clock signal corresponding to an in-group common driver included in each group is adjusted on the basis of a strobe signal corresponding to a comparator serving as a common comparator. In the second step, phases of strobe signals corresponding to comparators included in the same group are adjusted on the basis of a clock signal corresponding to the in-group common driver in each of m number of groups. In the third step, phases of clock signals corresponding to drivers included in the same group are adjusted on the basis of the phase of a strobe signal corresponding to an optional comparator in each of m number of groups.

Or, a method of the present invention for calibrating a semiconductor test instrument is constituted by including first to third steps in order to perform the timing calibration of the semiconductor test instrument provided with a driver for generating a signal synchronizing with a clock signal and a comparator for performing the comparison synchronizing with a strobe signal. In the first step, while a plurality of drivers and a plurality of comparators are divided into m number of groups so that two or more drivers or comparators are included, the phase of a strobe signal corresponding to an in-group common comparator included in each group is adjusted on the basis of a clock signal corresponding to a driver serving as a common driver. In the second step, phases of clock signals corresponding to drivers included in the same group are adjusted on the basis of a strobe signal corresponding to an in-group common comparator in each of m number of groups. In the third step, phases of strobe signals corresponding to comparators included in the same group are adjusted on the basis of the phase of a clock signal corresponding to an optional driver in each of m number of groups.

Because an exclusive reference driver/comparator section for performing only timing calibration, a probe connected to the section, and an exclusive robot for automating movement and contact of the probe are unnecessary though they have been necessary so far, it is possible to greatly reduce the cost. Moreover, because adjustments in the second and third steps can be performed in parallel every group, it is possible improve the working efficiency and shorten the working time.

It is preferable to perform the adjustment of a phase to be executed in each of the first to third steps by varying the phase of a clock signal or strobe signal so that the timing for performing comparison by a comparator in accordance with a strobe signal coincides with the timing for changing a signal output from each driver and input to each comparator. By varying the phase of a clock signal or strobe signal while observing a result of the comparison by a comparator, it is possible to easily adjust these phases and measure relative phase differences.

Moreover, it is preferable that a delay element for varying the phase of a signal is inserted into the supply route of a clock signal to the driver and that of a strobe signal to the comparator. By individually varying the delay value of each delay element, it is possible to adjust phases of a clock signal and a strobe signal to optional values and the phasing of these signals is simplified.

Furthermore, it is preferable that the first step is executed by using a first calibration board in which the input end of a common comparator and the output end of an in-group common driver are connected each other through a first common short connection point. Or, it is preferable that the first step is executed by using a first calibration board in which the output end of the common driver and the input end of an in-group common comparator are connected each other through the first common connection point. Moreover, it is preferable that the second and third steps are executed by using a second calibration board in which the output end of a driver and the input end of a comparator are connected each other through a second common short connection point for each of groups. Because calibration is performed by exchanging the first calibration board with the second calibration board, it is possible to simplify working contents compared to a conventional method for individually adjusting phases of a clock signal and strobe signal by using a probe.

Furthermore, it is preferable to set the length of a wiring for connecting the driver with the first and second short connection points and the length of a wiring for connecting the comparator with the first and second short connection points so that the lengths are all equalized. Thereby, it is possible to adjust every clock signal and strobe signal under the same condition and thereby, calibration is realized by observing an output of a comparator.

Furthermore, it is preferable to include a fourth step of exchanging the first calibration board with the second calibration board between the first and second steps. Because mechanical working includes only exchange of the first calibration board with the second calibration board, it is possible to greatly shorten the working time in the whole timing calibration.

Furthermore, it is preferable that the first step is executed by using a third calibration board in which the input end of a common comparator and the output end of an in-group common driver included in each of m number of groups are connected each other through wiring having equal time lengths for all groups and the second and third steps are executed by changing wiring states of the third calibration board so that the output end of a driver and the input end of a comparator included in each group are connected each other through wirings having equal time lengths for all groups. Or, it is preferable that the first step is executed by using the third calibration board in which the output end of a common driver and the input end of an in-group common comparator included in each of m number of groups are connected each other through wirings having equal time lengths for all groups and the second and third steps are executed by changing wiring states of the third calibration board so that the output end of a driver and the input end of a comparator included in each group are connected each other through wirings having equal time lengths for all groups. By using the third calibration board capable of changing wiring states, exchange of calibration boards is unnecessary. Therefore, it is possible to further shorten the whole working time.

Furthermore, because a plurality of changeover switches for changing wiring states is included in the third calibration board, it is preferable to perform operations in the first, second, and third steps by changing connection states of these changeover switches. Thereby, it is possible to easily change wiring states of the third calibration board.

Furthermore, instead of using the above various calibration boards, it is also allowed to use a calibration device or calibration wafer in which the same wiring is made. Particularly, by exchanging calibration devices by using a handler, it is possible to automate the exchanging operation.

Furthermore, a method of the present invention for calibration a semiconductor test instrument is constituted by including first and second steps in order to perform the timing calibration of the semiconductor test instrument provided with a driver for generating a signal synchronizing with a clock signal and a comparator for performing the comparison synchronizing with a strobe signal. In the first step, the phase of a strobe signal corresponding to each of a plurality of comparators is adjusted on the basis of a clock signal corresponding to a driver. In the second step, the phase of a clock signal corresponding to each of a plurality of drivers is adjusted on the basis of a strobe signal whose phase adjustment is completed in the first step.

Or, a method of the present invention for calibrating a semiconductor test instrument is constituted by including first and second steps in order to perform the timing calibration of the semiconductor test instrument provided with a driver for generating a signal synchronizing with a clock signal and a comparator for performing the comparison synchronizing with a strobe signal. In the first step, the phase of a clock signal corresponding to each of a plurality of drivers is adjusted on the basis of a strobe signal corresponding to a comparator. In the second step, the phase of a strobe signal corresponding to each of a plurality of comparators is adjusted on the basis of a clock signal whose phase adjustment is completed in the first step.

Because an exclusive reference driver/comparator section for performing only timing calibration, a probe connected to the section, and an exclusive robot for automating movement and contact of the probe are unnecessary, it is possible to greatly reduce the cost.

Moreover, it is preferable to perform adjustments of phases to be executed in the first and second steps by varying the phase of a clock signal or strobe signal so that the timing for performing comparison by a comparator in accordance with the strobe signal coincides with the timing for changing a signal output from each driver and input to each comparator. By varying the phase of the clock signal or strobe signal while observing a result of the comparison by the comparator, it is possible to easily adjust these phases and measure relative phase differences.

Furthermore, it is preferable that a delay element for varying the phase of a signal is inserted into the supply route of a clock signal to the driver and that of a strobe signal to the comparator. By individually varying the delay value of each delay element, it is possible to adjust phases of a clock signal and strobe signal to optional values and the phasing of these signals is simplified.

Furthermore, it is preferable that the first step is executed by using a plurality of first calibration boards in which the output end of a driver and the input end of each of a plurality of comparators are separately connected each other through a first short connection point. Or, it is preferable that the first step is executed by a plurality of first calibration boards in which the output end of each of a plurality of drivers and the input end of a comparator are separately connected each other through the first short connection point. Moreover, it is preferable that the second step is executed by using a second calibration board in which each of a plurality of drivers corresponds to each of a plurality of comparators and the output end of a corresponding driver and the input end of a corresponding comparator are connected each other. Because calibration is performed by exchanging the first calibration board with the second calibration board, it is possible to simplify working contents compared to a conventional method in which phases of a clock signal and strobe signal are individually adjusted by a probe.

Furthermore, it is preferable to set the length of a wiring for connecting the driver with the first and second short connection points and the length of a wiring for connecting the comparator with the first and second short connection points so that the lengths are equalized. Thereby, it is possible to adjust every clock signal and strobe signal under the same condition and realize the calibration by observing an output of the comparator.

Furthermore, instead of using the above various calibration boards, it is also allowed to use a calibration device or calibration wafer in which the same wiring is made. Particularly, by exchanging calibration devices by using a handler, it is possible to automate the exchanging operation.

BRIEF DESCRIPTION OF THE DRAWINGS

FIG. 14 is an illustration showing a wiring state of one calibration board used to perform calibration in a third embodiment;

FIG. 42 is an illustration showing a configuration of a calibration board of a modification having functions of two types of calibration boards different from each other in wiring contents;

FIG. 43 is an illustration showing a configuration of a calibration board of a modification having functions of two types of calibration boards different from each other in wiring contents;

FIG. 67 is an illustration showing a calibration device realizing the same wiring state as the case of the calibration board used for the eighth embodiment;

FIG. 68 is an illustration showing a calibration device realizing the same wiring state as the case of the calibration board used for the eighth embodiment;

BEST MODE FOR CARRYING OUT THE INVENTION

A method of an embodiment providing the present invention for calibrating a semiconductor test instrument is described below in detail.

[First Embodiment]

Figure 1:
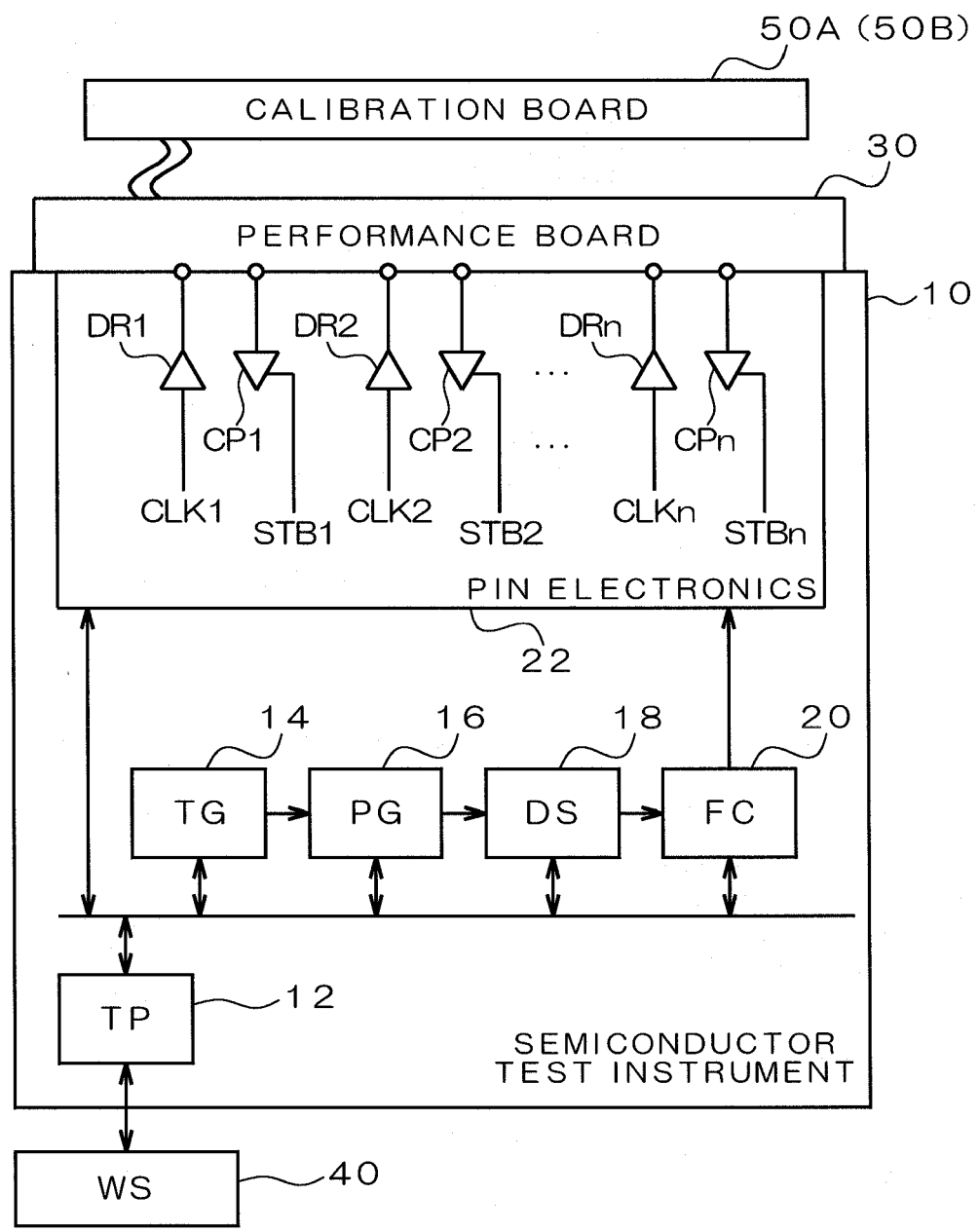
FIG. 1 is an illustration showing a general configuration of a semiconductor test instrument to which timing calibration will be applied.

FIG. 1 is an illustration showing a general configuration of a semiconductor test instrument to which the timing calibration performed in the first embodiment will be applied. The semiconductor test instrument is constituted by including a semiconductor test instrument 10 and a work station (WS) 40 in order to apply a predetermined test to a device under test (DUT) (not illustrated).

The work station 40 controls a series of test operations such as a functional test and the whole timing calibration and realizes an interface with users.

The semiconductor test instrument 10 applies various tests to a DUT by executing a predetermined test program transferred from the work station 40. Moreover, the semiconductor test instrument 10 performs timing calibration by executing an exclusive program transferred from the work station 40. To execute the above operations, the semiconductor test instrument 10 has a tester control section (TP) 12, a timing generator (TG) 14, a pattern generator (PG) 16, a data selector (DS) 18, a format control section (FC) 20, and a pin electronics 22.

The tester control section 12 is connected with component sections of the timing generator 14 or the like through a bus to perform the control necessary for various test operations and calibrations for the component sections.

The timing generator 14 sets a basic cycle of test operations and generates various timing edges included in the basic cycle. The pattern generator 16 generates pattern data to be input to each pin of a DUT. The data selector 18 relates various pattern data values output from the pattern generator 16 with pins of the DUT for receiving the various pattern data values. The format control section 20 controls waveforms of the DUT in accordance with the pattern data generated by the pattern generator 16 and selected by the data selector 18 and the timing edge generated by the timing generator 14.

The pin electronics 22 forms a physical interface between the pin electronics 22 and the DUT and generates signals to be transferred actually to and from the DUT in accordance with a clock signal CLK or strobe signal STB generated through the waveform control by the format control section 20. To execute the above operations, the pin electronics 22 is constituted by including n drivers DR1 to DRn and n comparators CP1 to CPn.

The driver DR1 generates a signal synchronizing with a clock signal CLK1 and changes an output signal from low level to high level when the clock signal CLK1 rises. Similarly, the drivers DR2 to DRn generate signals synchronizing with input clock signals CLK2 to CLKn and respectively change an output signal from low level to high level when a corresponding clock signal rises.

In the case of not only this embodiment but also other embodiments, an output signal of a driver changes the same as the case of a clock signal, that is, the output signal of the driver rises synchronously with the rise of the clock signal and falls synchronously with the fall of the clock signal. However, it is also allowed that the output signal of the driver falls synchronously with the rise of the clock signal and rises synchronously with the fall of the clock signal.

The comparator CP1 performs the comparison synchronizing with a strobe signal STB1 output from the format control section 20 and determines the logic of a signal input from a corresponding pin of the DUT when the strobe signal STB1 is input. Similarly, the comparators CP2 to CPn perform comparisons synchronizing with input strobe signals STB2 to STBn and respectively determine the logic of a signal input from a corresponding pin of the DUT when a corresponding strobe signal is input.

To perform the comparison synchronizing with a strobe signal by a comparator, the following cases are considered: a case of performing comparison by a comparator synchronously with the rise of a strobe signal and a case of performing comparison by the comparator synchronously with the fall of the strobe signal. In the case of not only this embodiment but also other embodiments, it is allowed to use either of comparison timings because there is no essential difference in the relation with the present invention.

The above driver DR1 and comparator CP1 correspond to one input/output pin of the DUT as one set. Moreover, the driver DR2 and comparator CP2 correspond to another input/output pin as one set. Thus, a set of a driver and a comparator is provided by relating them to each input/output pin of the DUT.

Furthermore, a performance board 30 is mounted on the semiconductor test instrument 10 and the above pin electronics 22 is connected to a calibration board 50A (or 50B) through the performance board 30.

Special internal wirings different from each other are applied to the calibration boards 50A and 50B in order to perform timing calibration.

Figure 2:
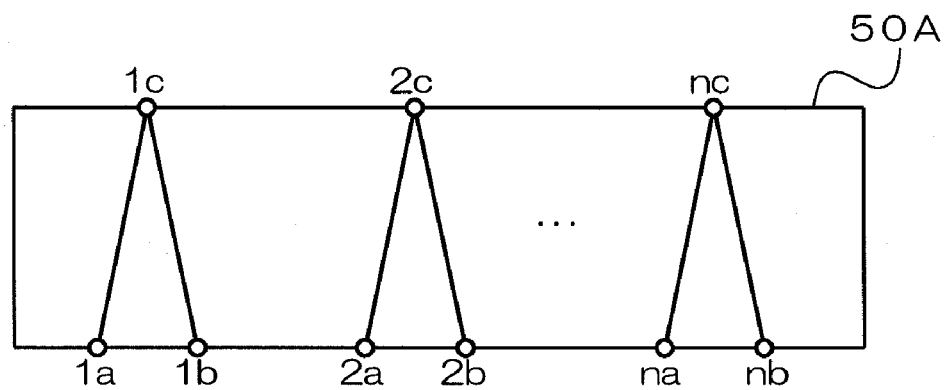
FIG. 2 is an illustration showing a wiring state of one calibration board.

FIG. 2 is an illustration showing a wiring state of the calibration board 50A. In FIG. 2, two terminals 1a and 1b are connected with a short connection point (device socket end) 1c in common and moreover, set so that their wiring lengths (time lengths) in terms of signal delay time are equalized. Moreover, two terminals 2a and 2b are connected with a short connection point 2c in common and moreover, set so that their wiring lengths in terms of signal delay time are equalized. Furthermore, two terminals na and nb are connected with a short connection point nc in common and set so that their wiring lengths in terms of signal delay time are equalized. Furthermore, the above wiring lengths are equally set for all short connection points.

Figure 3:
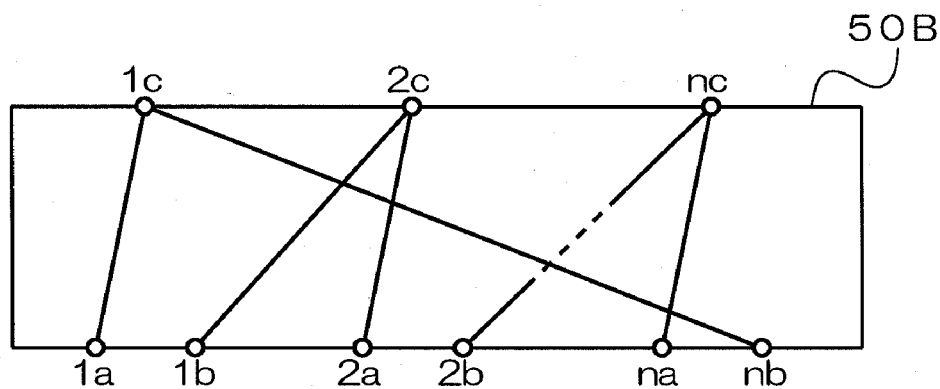
FIG. 3 is an illustration showing a wiring state of the other calibration board.

FIG. 3 is an illustration showing a wiring state of the other calibration board 50B. In FIG. 3, two terminals 1a and nb are connected with the short connection point 1c in common and set so that their wiring lengths in terms of signal delay time are equalized. Moreover, two terminals 2a and 1b are connected with the short connection point 2c in common and set so that their wiring lengths in terms of signal delay time are equalized. Furthermore, two terminals na and 2b are connected with the short connection point nc in common and set so that their wiring lengths in terms of signal delay time are equalized. Furthermore, the above wiring lengths are equally set for all short connection points of two types of calibration boards 50A and 50B.

A semiconductor test instrument of the present invention has the above configuration and the calibration using the instrument is described below.

Figure 4:
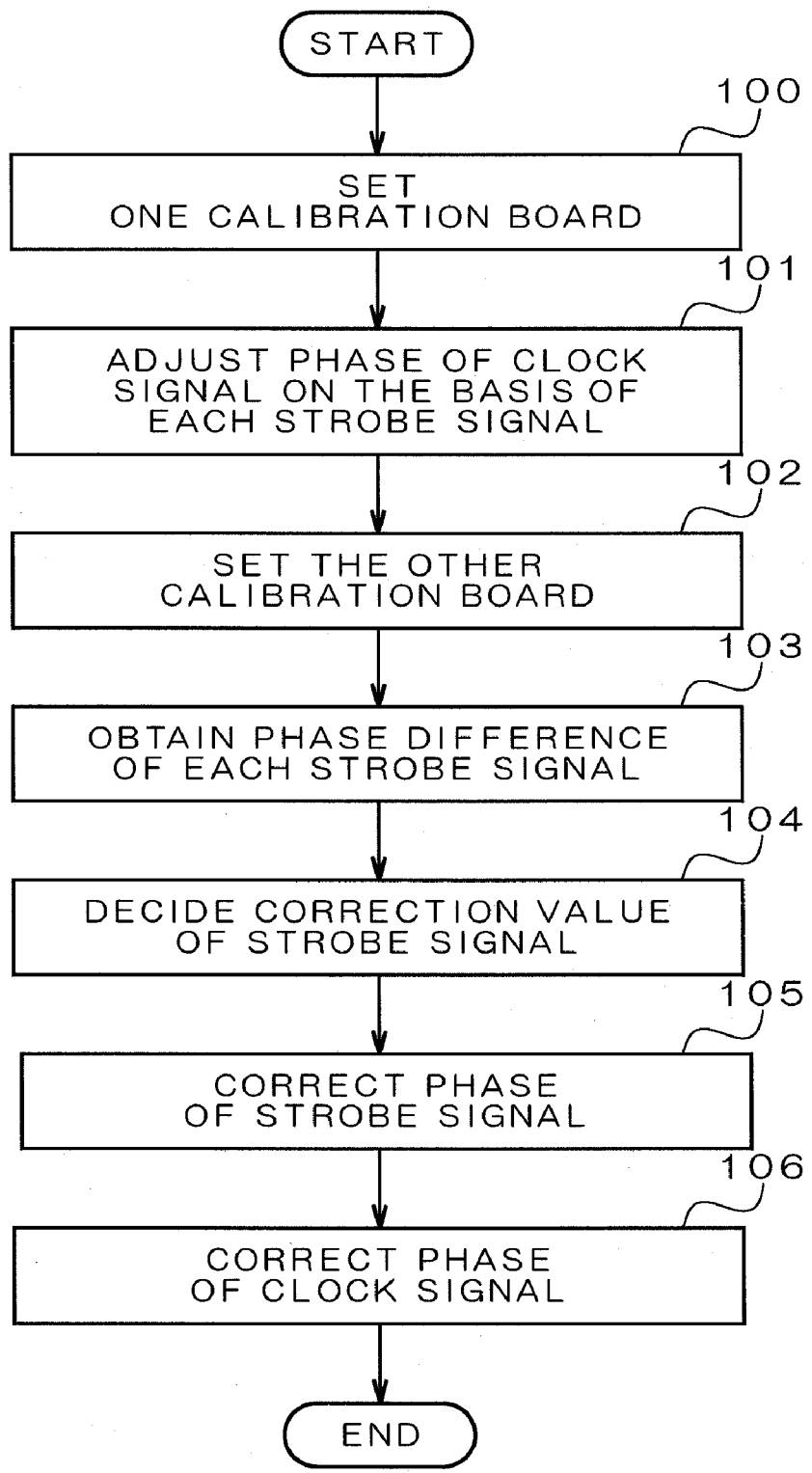
FIG. 4 is a flow chart showing a calibration procedure of a first embodiment.

FIG. 4 is a flow chart showing a calibration procedure of this embodiment. After one calibration board 50A is set to the performance board 30 (step 100), the tester control section 12 adjusts the phase of a clock signal on the basis of a strobe signal every short connection point of the calibration board 50A (step 101).

In the above step 101, the phase adjustment of a clock signal is performed by observing the level of an output signal when a strobe signal is output (raised) and comparison is performed by a comparator while changing the rise timing of a clock signal little by little and obtaining the phase of the clock signal when the level of the output signal of the comparator is just inverted.

Figure 5:
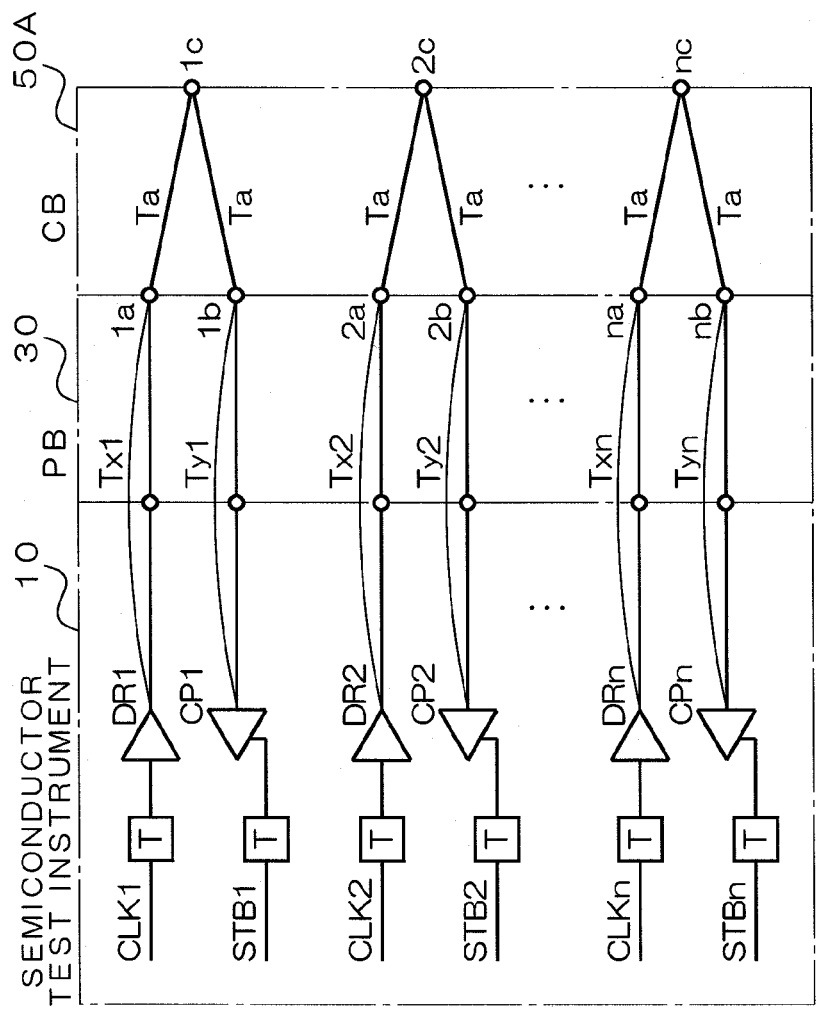
FIG. 5 is an illustration showing a state in which one calibration board (CB) is set to a semiconductor test instrument.

FIG. 5 is an illustration showing a state in which the calibration board (CB) 50A is set to the semiconductor test instrument 10 through the performance board (PB) 30. In FIG. 5, Tx1 to Txn respectively denote a delay time caused by a wiring from the output end of each driver up to a terminal of the calibration board 50A, Ty1 to Tyn respectively denote a delay time caused by a wiring from a terminal of the calibration board 50A up to the input end of each comparator, and Ta denotes a delay time caused by each wiring in the calibration board 50A. For example, it is assumed that Tx1 to Txn and Ty1 to Tyn are all set to the same value.

As shown in FIG. 5, a delay element T is set to routes through which a clock signal is supplied to the drivers DR1 to DRn in order to adjust the phase (change timing) of the clock signal. By varying the element constant of each delay element, it is possible to optionally and independently adjust phases of clock signals to the drivers DR1 to DRn. Similarly, a delay element T is set to routes through which a strobe signal is supplied to the comparators CP1 to CPn in order to adjust the phase of the strobe signal. By varying element constants of the delay elements T, it is possible to optionally and independently adjust the phase of the strobe signal to the comparators CP1 to CPn.

For this embodiment and embodiments from the second embodiment downward, a case is described in which wiring lengths from terminals of a calibration board up to the output end of a driver and the input end of a comparator are equally set. However, it is also allowed to differentiate these wiring lengths and adjust differences between the wiring lengths by the above delay element T.

Figure 6:
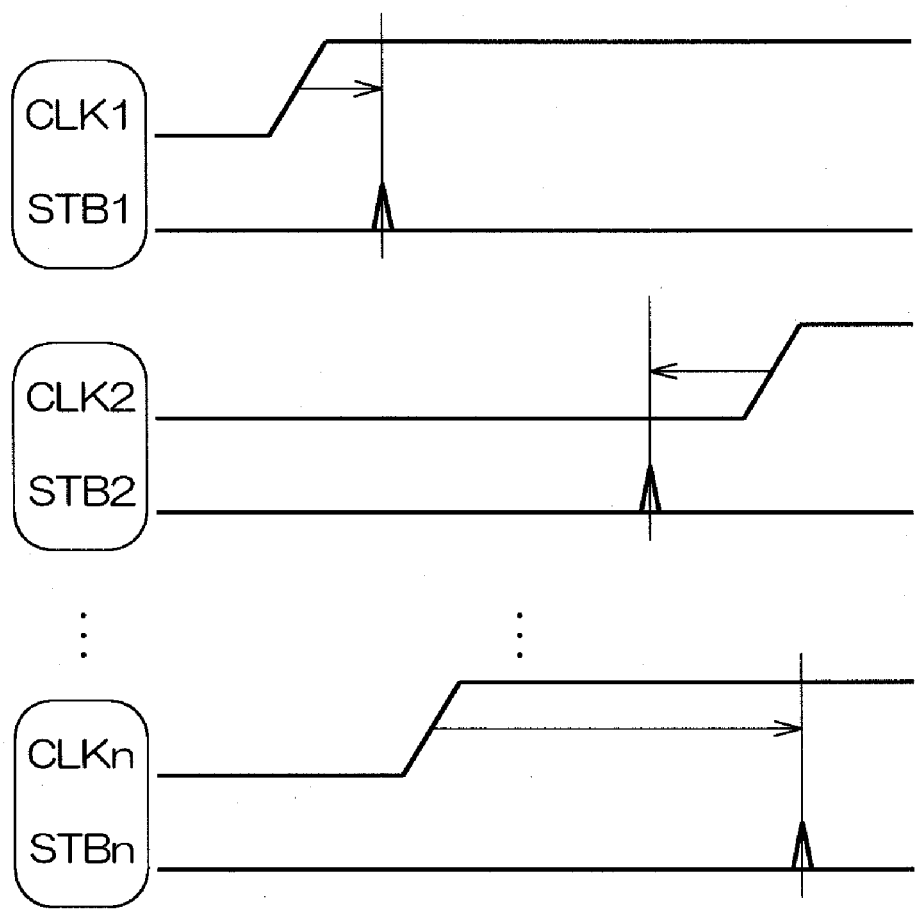
FIG. 6 is an illustration showing the outline of the clock signal phasing to be executed in step 101.
Figure 7:
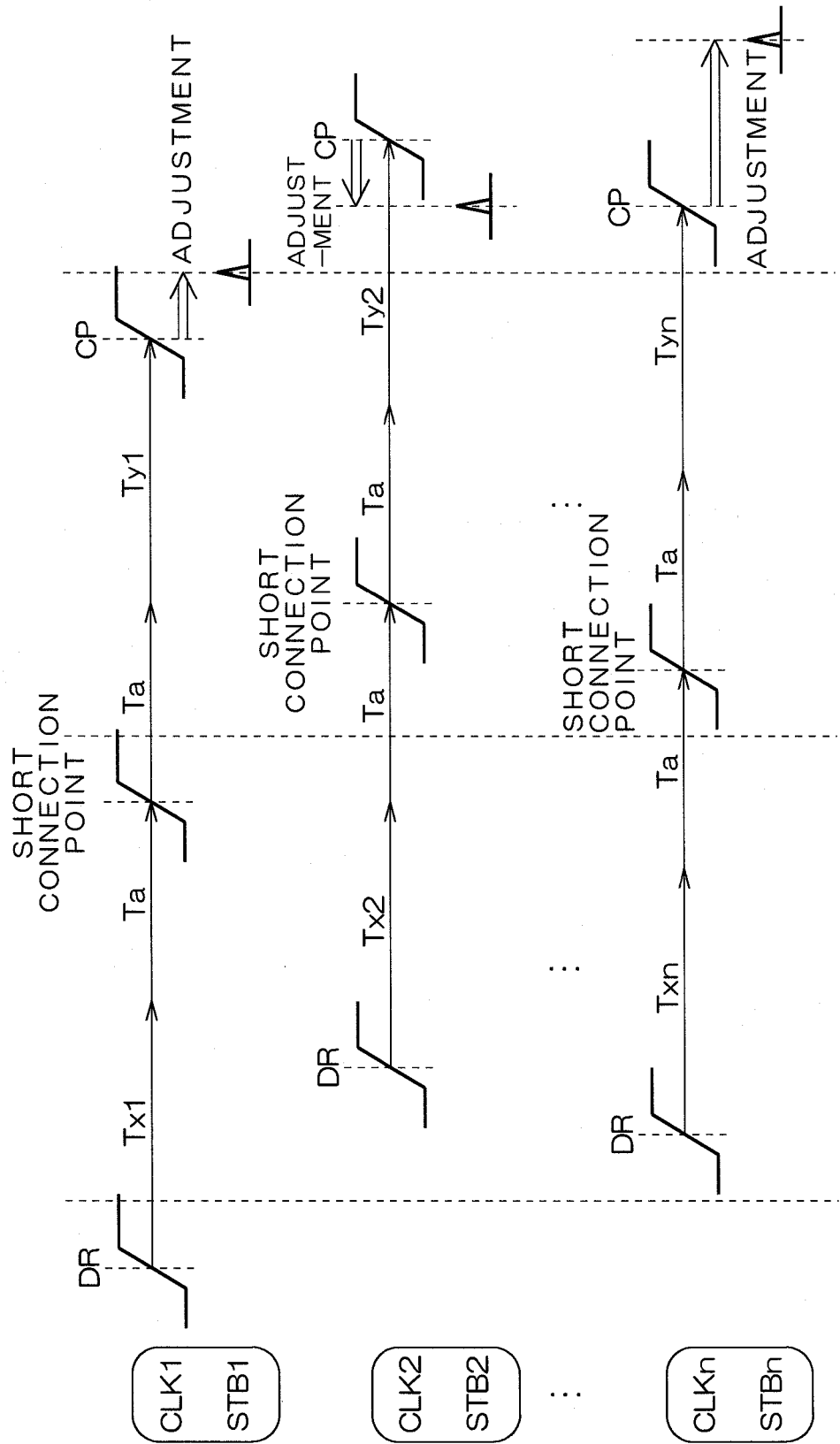
FIG. 7 is an illustration showing details of the adjustment of phases of clock signals shown in FIG. 6.

FIG. 6 is an illustration showing the outline of the clock signal phase adjustment to be executed in the above step 101. Moreover, FIG. 7 is an illustration showing details of the clock signal phase adjustment shown in FIG. 6. In FIG. 7, "DR", "short connection point", and "CP" shown correspondingly to each clock signal respectively denote the timing at which a signal output from a driver correspondingly to each clock signal passes or arrives. When noticing the clock signal CLK1, a signal is output from the driver DR1 correspondingly to the clock signal CLK1 at the timing shown by "DR". This signal arrives at a short connection point (device socket end) at the timing shown by "short connection point" and moreover, arrives at the comparator CP1 at the timing shown by "CP". FIG. 6 notices the timing shown by "CP" in FIG. 7 and omits other portions.

First, the tester control section 12 notices the short connection point 1c, fixes the phase (timing for comparison) of the strobe signal STB1 input to the converter CP1, thereby varies the phase of the clock signal CLK1 input to the driver DR1, and thus adjusts a signal output from the driver DR1 correspondingly to the clock signal CLK1 so that the signal rises when it is input to the comparator CP1 via the short connection point 1c and terminal 1b. Then, the tester control section 12 notices the short connection point 2c, fixes the phase (timing for comparison) of the strobe signal STB2 input to the comparator CP2, thereby varies the phase of the clock signal CLK2 input to the driver DR2, and thus adjusts a signal output from the driver DR2 correspondingly to the clock signal CK2 so that the signal rises when it is input to the comparator CP2 via the short connection point 2c and terminal 2b. Thus, the tester control section 12 notices each of short connection points up to the short connection point nc, fixes the phase (timing for comparison) of the strobe signal STBi (i=1, 2, . . . , n) input to a comparator CPi, thereby varies the phase of the clock signal CLKi input to a driver DRi, and thus adjusts a signal output from a driver DRi correspondingly to the clock signal CLKi so that the signal rises when it is input to the comparator CPi via a short connection point 1c and terminal 1b.

Thus, when the phase adjustment of the clock signals CLK1 to CLKn corresponding to all the short connection pints 1c to nc is completed by using one calibration board 50A, the other calibration board 50B is set (step 102). It is considered to set the calibration boards 50A and 50B manually or by using an exclusive robot in order to automate the working in steps 100 and 102.

Figure 8:
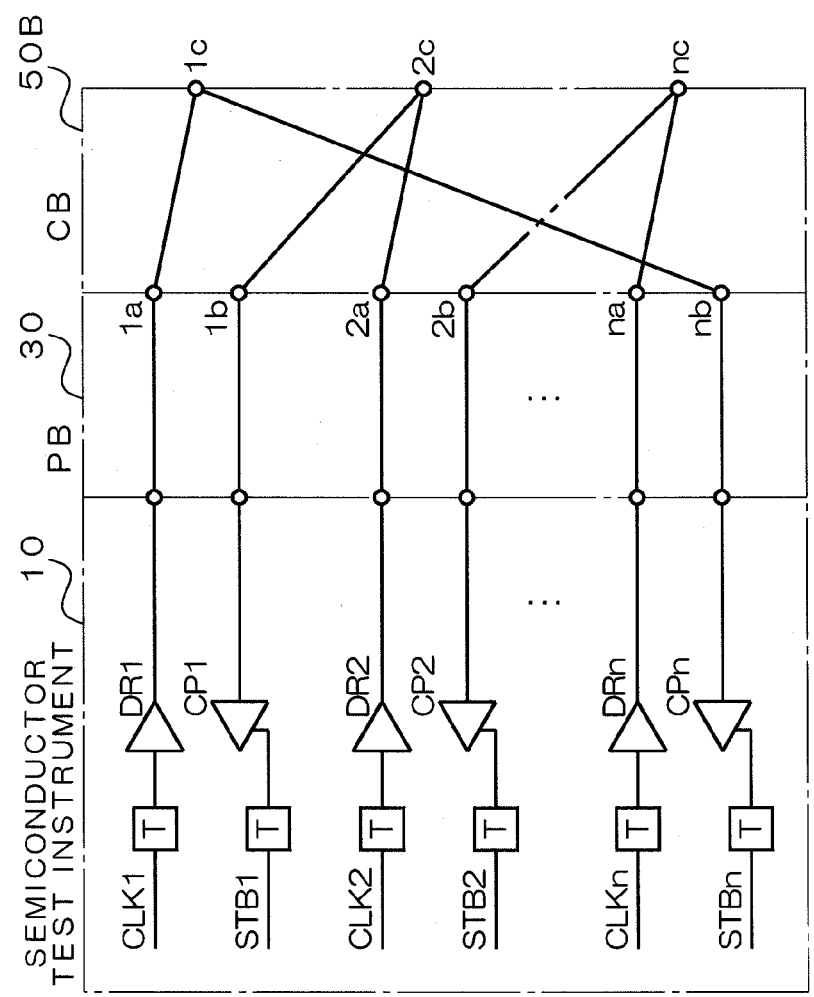
FIG. 8 is an illustration showing a state in which the other calibration board is set to the semiconductor test instrument.

FIG. 8 is an illustration showing a state in which the calibration board 50B is set to the semiconductor test instrument 10.

Then, the tester control section 12 obtains phase differences of strobe signals through measurement every short connection point (step 103).

Figure 9:
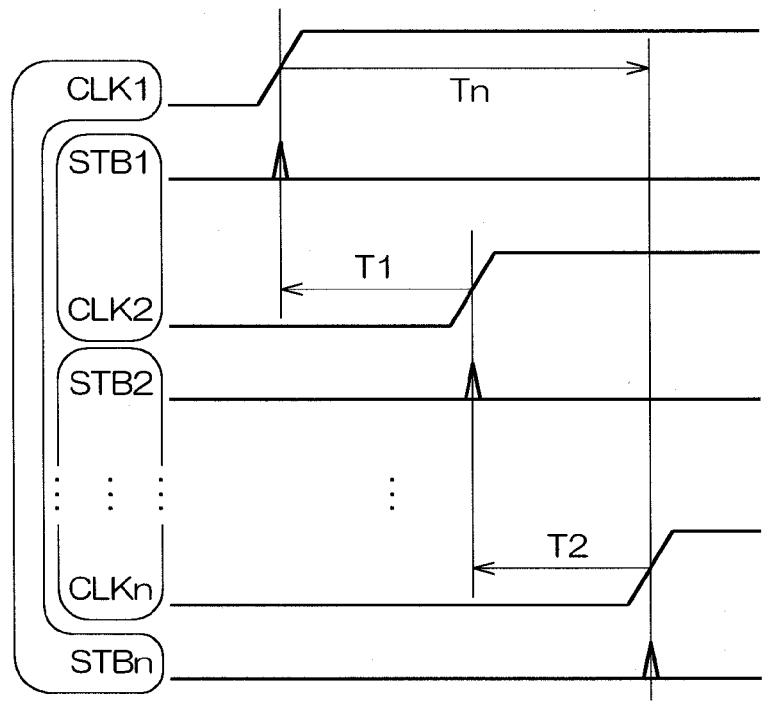
FIG. 9 is an illustration showing the outline of the strobe signal phase difference obtainment to be executed in step 103.

FIG. 9 is an illustration showing the outline of the strobe signal phase difference obtainment to be executed in step 103. First, the tester control section 12 notices the short connection point 1c of the calibration board 50B to measure the phase difference Tn of the strobe signal STBn input to the comparator CPn on the basis of the phase of the clock signal CLK1 input to the driver DR1 (more accurately, on the basis of the timing at which a signal output from the driver DR1 correspondingly to the clock signal CLK1 rises at the input end of the comparator CPn). The above measurement can be performed by scanning the phase of the strobe signal STBn in a predetermined range while fixing the phase of the clock signal CLK1. Specifically, the output timing of the strobe signal STBn is changed little by little until the level of an output signal of the comparator CPn is inverted while the rise timing of a signal output from the driver DR1 correspondingly to the clock signal CLK1 and input to the comparator CPn via the short connection point 1c. Thus, a change value when changing the phase of the strobe signal STBn corresponds to the phase difference Tn of the strobe signal STBn to be measured.

Then, the tester control section 12 notices the short connection point 2c of the calibration board 50B to measure the phase difference T1 of the strobe signal STB1 input to the comparator CP1 on the basis of the phase of the clock signal CLK2 input to the driver DR2. Thus, the tester control section 12 notices each of short connection points up to the short connection point nc of the calibration board 50B to measure the phase difference Tj (j=n, 1, 2, ..., n−1) of a strobe signal STBj input to a comparator CPj on the basis of the phase of a clock signal CLKi (i=1, 2, ... n) input to each driver DRi corresponding to the next set.

Thus, by using the other calibration board 50B, relative phase differences of all strobe signals STB1 to STBn are obtained.

Then, the tester control section 12 decides a correction value of a strobe signal by using phase differences of the strobe signals STB1 to STBn (step 104). Specifically, in the case of obtainment of phase differences of strobe signals in step 103, a relative displacement between phases of two strobe signals input to two comparators corresponding to two adjacent short connection points respectively can be known. Therefore, by using the phase of a strobe signal input to a comparator corresponding to a certain short connection point as a criterion, it is possible to decide a correction value necessary to adjust the phase of a strobe signal input to another comparator to the phase of the strobe signal serving as the criterion. Thereafter, the tester control section 12 corrects phases of the strobe signals STB1 to STBn input to the comparators CP1 to CPn by using the decided correction value (step 105).

Figure 10:
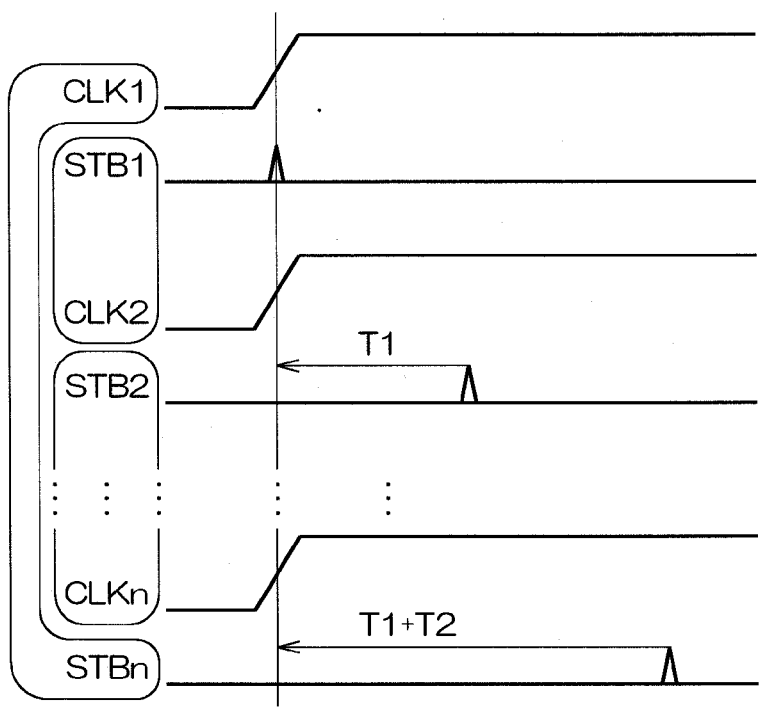
FIG. 10 is an illustration showing outlines of the strobe signal correction value decision and strobe signal correction to be executed in steps 104 and 105.

FIG. 10 is an illustration showing the outline of the strobe signal correction value decision and strobe signal correction to be executed in steps 104 and 105. For example, when the phase difference of the strobe signal STB2 is T1 when using the phase (output timing) of the strobe signal STB1 as a criterion, the tester control section 12 adjusts the phase of the strobe signal STB2 to the phase of the strobe signal STB1 by shifting the phase of the strobe signal STB2 by T1.

Thereby, it is possible to adjust the timing of the comparison by the comparator CP1 synchronizing with the strobe signal STB1 to the timing of the comparison by the comparator CP2 synchronizing with the strobe signal STB2.

Moreover, when the phase difference of the strobe signal STBn is T1+T2 when using the phase (output timing) of the strobe signal STB1 as a criterion, the tester control section 12 adjusts the phase of the strobe signal STBn to the phase of the strobe signal STB1 by shifting the phase of the strobe signal STBn by T1+T2. Thus, it is possible to make timings of comparisons by all comparators coincide with each other.

Then, the tester control section 12 corrects phases of the clock signals CLK1 to CLKn input to the drivers DR1 to DRn respectively (step 106). This correction is performed by using the correction value of a strobe signal input to a comparator corresponding to each driver.

Figure 11:
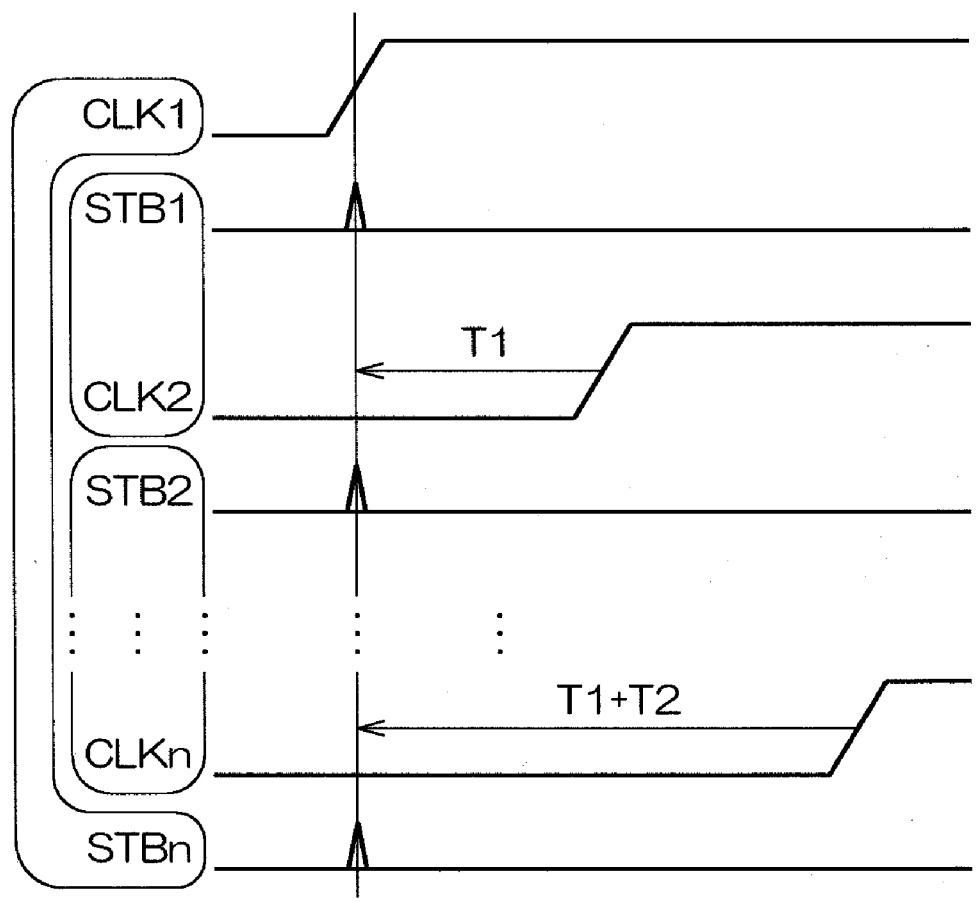
FIG. 11 is an illustration showing the outline of the clock signal phase correction to be executed in step 106.

FIG. 11 is an illustration showing the outline of the clock signal correction to be executed in step 106. First, the tester control section 12 corrects the phase of the clock signal CLK2 corresponding to the strobe signal STB2 whose correction is completed in step 105 so as to coincide with the phase of the strobe signal STB2. Moreover, the tester control section 12 corrects phases of corresponding clock signals up to the clock signal CLKn so as to coincide with phases of strobe signals up to the strobe signal STBn. Thus, it is possible to make the timings at which signals output from drivers rise synchronously with rises of clock signals coincide with each other.

Thus, in the case of the semiconductor test instrument of this embodiment, the phase of a clock signal is first adjusted on the basis of a strobe signal every socket device end by using one calibration board 50A. Then, by using the other calibration board 50B, the difference between phases of two strobe signals at adjacent short connection points is measured and then, the phase of any strobe signal or clock signal is corrected on the basis of a clock signal or strobe signal corresponding to any short correction point. Therefore, in the case of the calibration by the semiconductor test instrument of this embodiment, it is not necessary to bring a probe into contact with an object every short connection point but it is only necessary to set the calibration boards 50A and 50B. Therefore, it is possible to simply the working contents necessary for calibration. Moreover, it is unnecessary to use a special configuration including another reference driver/comparator section and an exclusive robot for repeating contact or movement of a probe and thus, it is possible to greatly reduce the cost. Furthermore, because an operation followed by a mechanical movement before calibration is completed is only setting of the calibration boards 50A and 50B, it is possible to greatly shorten the working time compared to the conventional case of repeating movement and contact of a probe by the number of short contact points.

In the case of the above embodiment, by first using one calibration board 50A, the phase of a clock signal is adjusted on the basis of each strobe signal. However, it is also allowed to adjust the phase of a strobe signal on the basis of the phase of each clock signal. Moreover, though the phase of a clock signal is adjusted (step 106 in FIG. 4) after adjusting the phase of a strobe signal by using the other calibration board 50B (step 105 in FIG. 4), it is also allowed to reverse the above sequence.

[Second Embodiment]

In the case of the above-described embodiment, calibration is performed by using two types of calibration boards 50A and 50B in order. However, it is also allowed to save labor by using one type of a calibration board having functions of these two types of calibration boards 50A and 50B.

Figure 12:
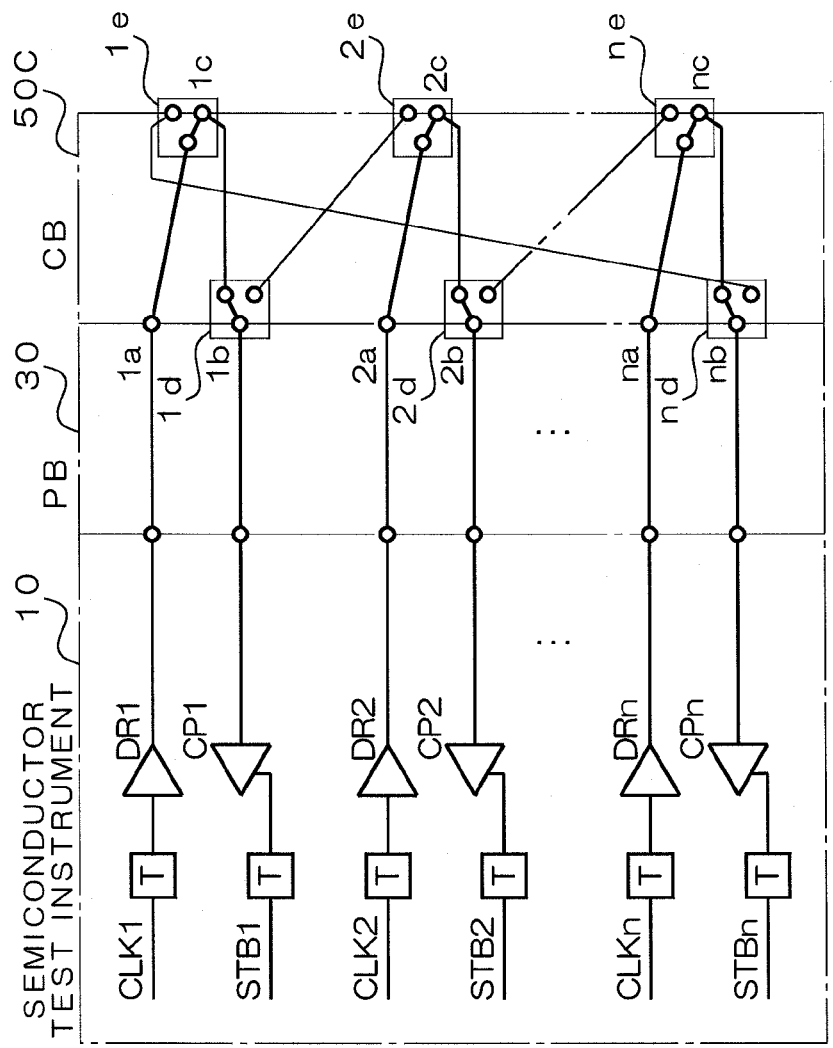
FIG. 12 is an illustration showing a configuration of a calibration board of a second embodiment having functions of two types of calibration boards different from each other in wiring contents.
Figure 13:
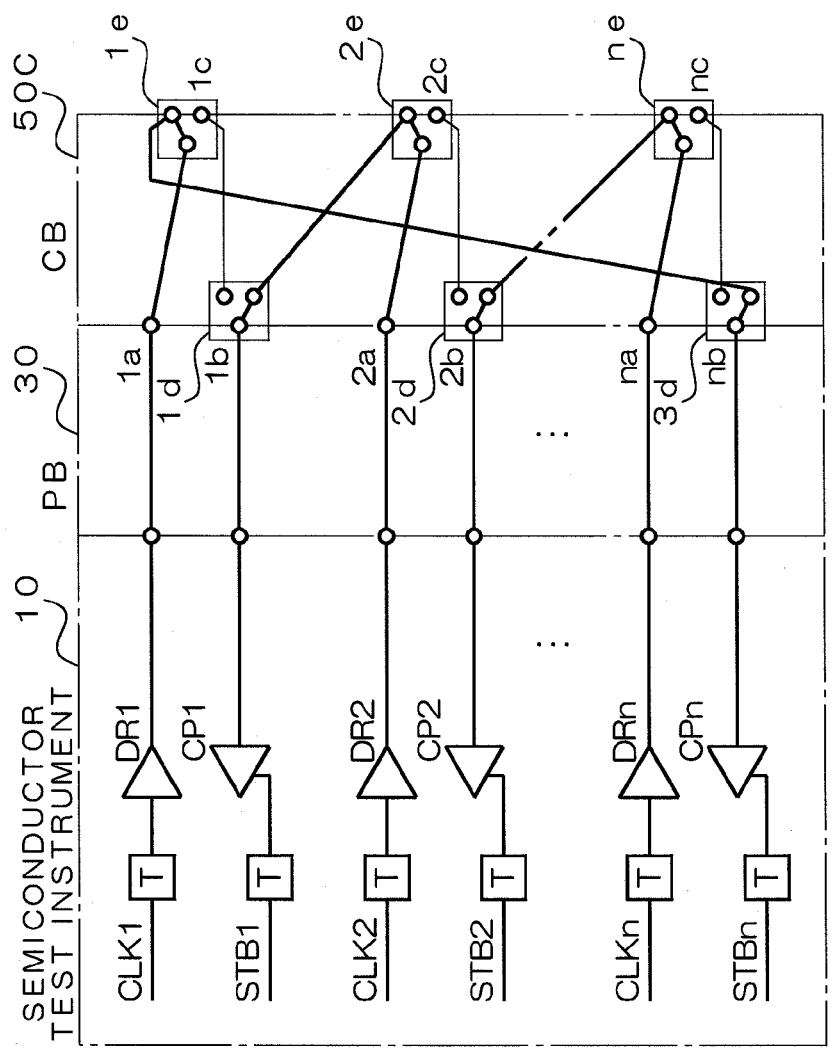
FIG. 13 is an illustration showing a configuration of the second embodiment having functions of two types of calibration boards different from each other in wiring contents.

FIGS. 12 and 13 are illustrations showing a configuration of a calibration board 50C of a second embodiment having functions of two types of calibration boards 50A and 50B, in which the calibration board 50C is connected to a semiconductor test instrument 10 through a performance board 30. The calibration board 50C shown in FIGS. 12 and 13 is provided with two changeover switches correspondingly to each short connection point.

Specifically, a changeover switch 1e is set nearby a short connection point 1c correspondingly to the short connection point 1c and a changeover switch 1d is set nearby a terminal 1b corresponding to a comparator CP1. By changing over the changeover switch 1d, it is possible to selectively connect the terminal 1b to either of the short connection points 1c and 2c. Moreover, by changing over the changeover switch 1e, it is possible to selectively realize a state of connecting the short connection point 1c to terminals 1a and 1b in common and a state of connecting the short connection point 1c to terminals 1a and nb in common. The same is applied to another switch 2d and the like. Wiring lengths between short connection points 1c to nc and terminals 1a and 1b and the like are set so that delay times of all signals are equalized.

As shown in FIGS. 12 and 13, by changing over the changeover switch 1d and the like, it is possible to selectively realize wiring contents of two types of calibration boards 50A and 50B. Therefore, by using the calibration board 50C and thereby changing over the changeover switches to perform calibration, exchange of, calibration boards is unnecessary and it is possible to further simplify working contents, reduce the cost, and shorten the working time.

[Third Embodiment]

In the case of the above embodiments, calibration is performed by combining one driver with one comparator. However, it is also allowed to perform calibration every group formed by combining a plurality of drivers with a plurality of comparators.

FIG. 14 is an illustration showing a wiring state of one calibration board 150A used to perform calibration in this embodiment. Device socket ends 1 g to 1 mg serving as m short connection points shown in FIG. 14 correspond to the short connection points 1c to nc of the calibration board 50A shown in FIG. 2. In FIG. 14, these connection points are drawn in a calibration board 150A according to convenience. However, in the case of the calibration board 50A shown in FIG. 2 and the calibration board 150A shown in FIG. 14, it is not always necessary that each short connection point is exposed to the outside when noticing only calibration. Therefore, as illustrated in FIG. 14, it is allowed that each short connection point 1g or the like is embedded in a calibration board.

In FIG. 14, n terminals 1a to na connected with n drivers DR1 to DRn form m number of groups by collecting every a predetermined number of terminals (for examples, such as three terminals). The first group (group 1) includes terminals 1a to 3a corresponding to the drivers DR1 to DR3 respectively and these terminals 1a to 3a are connected to one short connection point 1g in common. The second group (group 2) includes terminals 4a to 6a corresponding to the drivers DR4 to DR6 respectively and these terminals 4a to 6a are connected to one short connection point 2g in common. The same is applied to terminals other than the terminals 1a to 6a. The m-th group (group m) includes terminals (n−2) a to na corresponding to drivers DRn-2 to DRn and these terminals are connected to one short connection point mg in common.

Moreover, n terminals 1b to nb connected with n comparators CP1 to CPn form m number of groups by collecting every a predetermined number of terminals. The first group includes the terminals 1b to 3b corresponding to the comparators CP1 to CP3 respectively and the terminals 1b to 3b are connected to one short connection point 1g in common. The second group includes the terminals 4b to 6b corresponding to the comparators CP4 to CP6 respectively and the terminals 4b to 6b are connected to one short connection point 2g in common. The same is applied to terminals other than the above terminals. The m-th group (group m) includes the terminals (n−2) b to nb corresponding to the comparators CPn-2 to CPn respectively and these terminals are connected to one short connection point mg in common.

Thus, the total of six terminals corresponding to three drivers and three comparators respectively are connected to the short connection points 1g to mg respectively. Wirings for connecting terminals with short connection points are set so that their lengths (time length) in terms of signal delay time are all equalized.

Figure 15:
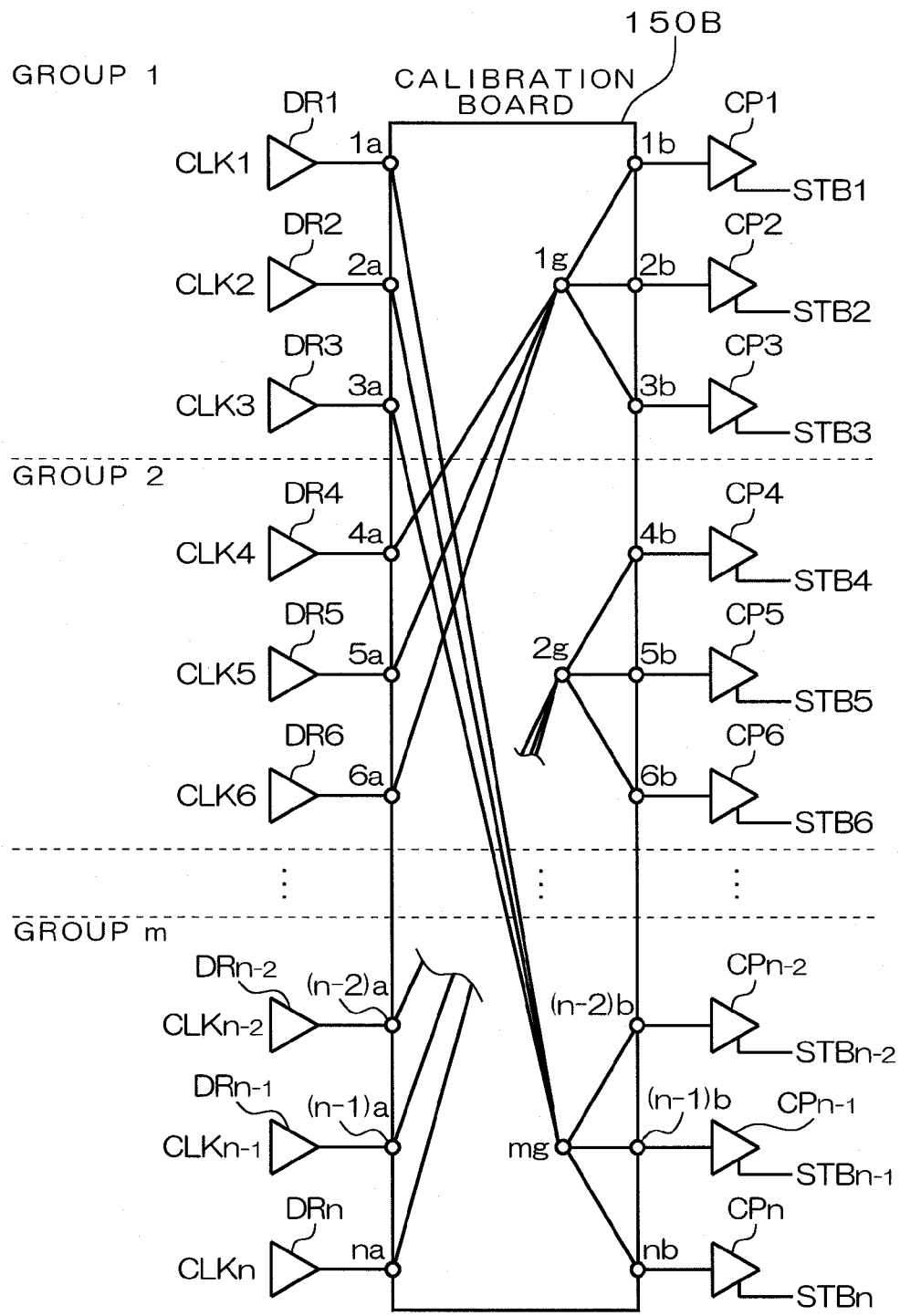
FIG. 15 is an illustration showing a wiring state of the other calibration board used to perform calibration in the third embodiment.

FIG. 15 is an illustration showing a wiring state of the other calibration board 150B used for calibration in this embodiment.

The calibration board 150B shown in FIG. 15 is different from the calibration board 150A shown in FIG. 14 only in the corresponding relation between the short connection points 1g to mg and the terminals 1a to na connected to drivers. Specifically, the terminals 1a to 3a corresponding to the drivers DR1 to DR3 included in the first group are connected to the short connection point mg included in the m-th group in common. Moreover, the terminals 4a to 6a corresponding to the drivers DR4 to DR6 included in the second group are connected to the short connection point 1g in common. Thus, terminals corresponding to drivers and short connection points are set so that the corresponding relation between the terminals and the points is shifted one group by one group. Also in the case of the calibration board 150B, wirings for connecting terminals with short connection points are set so that their wiring lengths (time lengths) in terms of signal delay time are equalized. That is, lengths of wirings for connecting terminals with short connection points included in the two calibration boards 150A and 150B are set so that they are all equalized.

The calibration boards 150A and 150B of this embodiment have the above configurations. Then, calibrations using these calibration boards 150A and 150B are described below. It is assumed that the semiconductor test instrument 10, performance board 30, and workstation 40 described for the first embodiment are used for calibration boards other than the calibration boards 150A and 150B.

Figure 16:
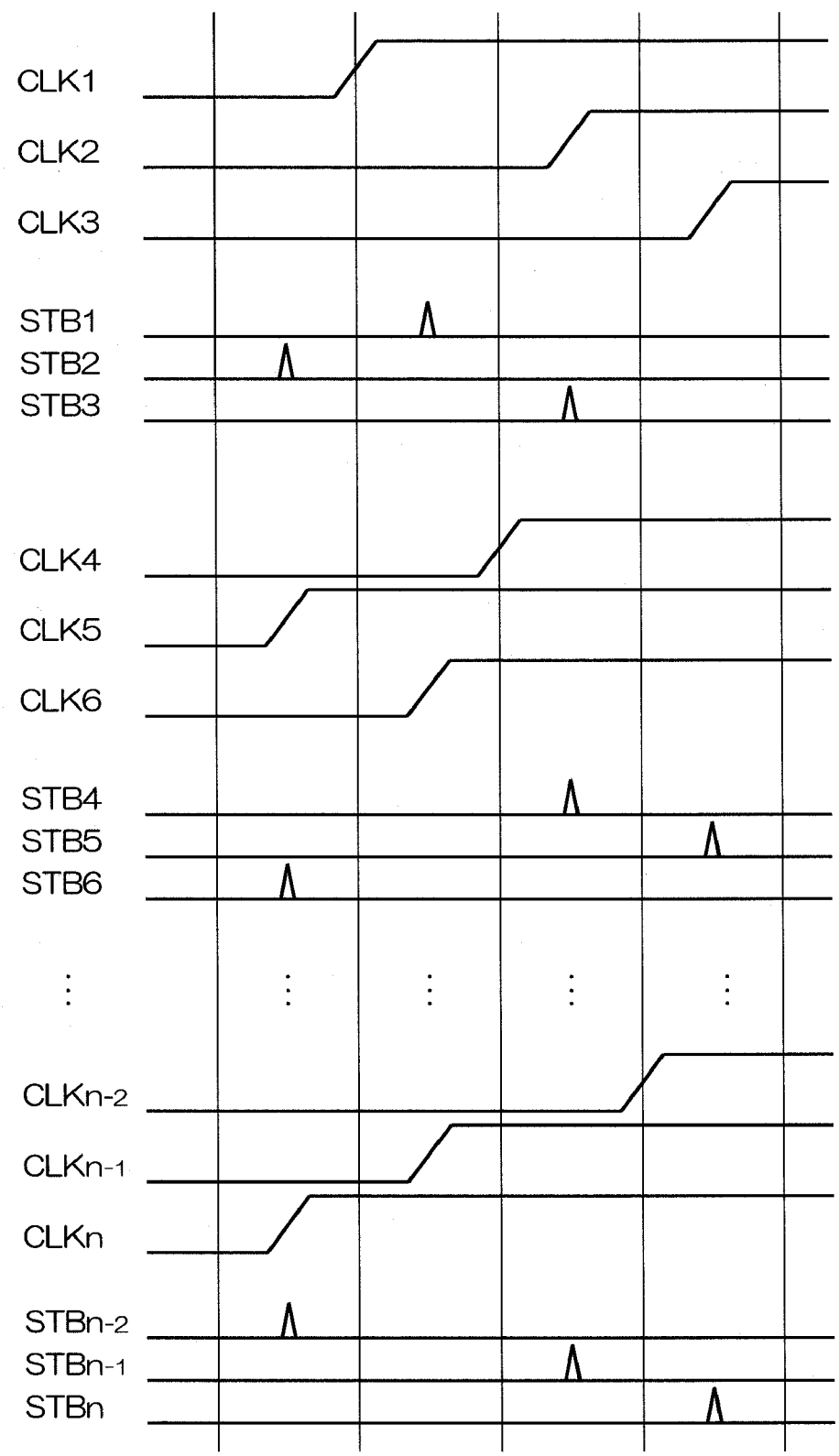
FIG. 16 is an illustration showing initial states of a clock signal and a strobe signal in a semiconductor test instrument before performing calibration.

FIG. 16 is an illustration showing initial states of a clock signal and a strobe signal in the semiconductor test instrument 10 before performing calibration. FIG. 16 notices the timing at which a signal output from each driver reaches each comparator the same as the case of FIG. 6 used for the first embodiment. As shown in FIG. 16, in an initial state, the timing at which a signal output from each driver and input to each comparator correspondingly to each of the clock signals CLK1 to CLKn does not coincide with the timing at which each of the strobe signals STB1 to STBn is input to each comparator.

Figure 17:
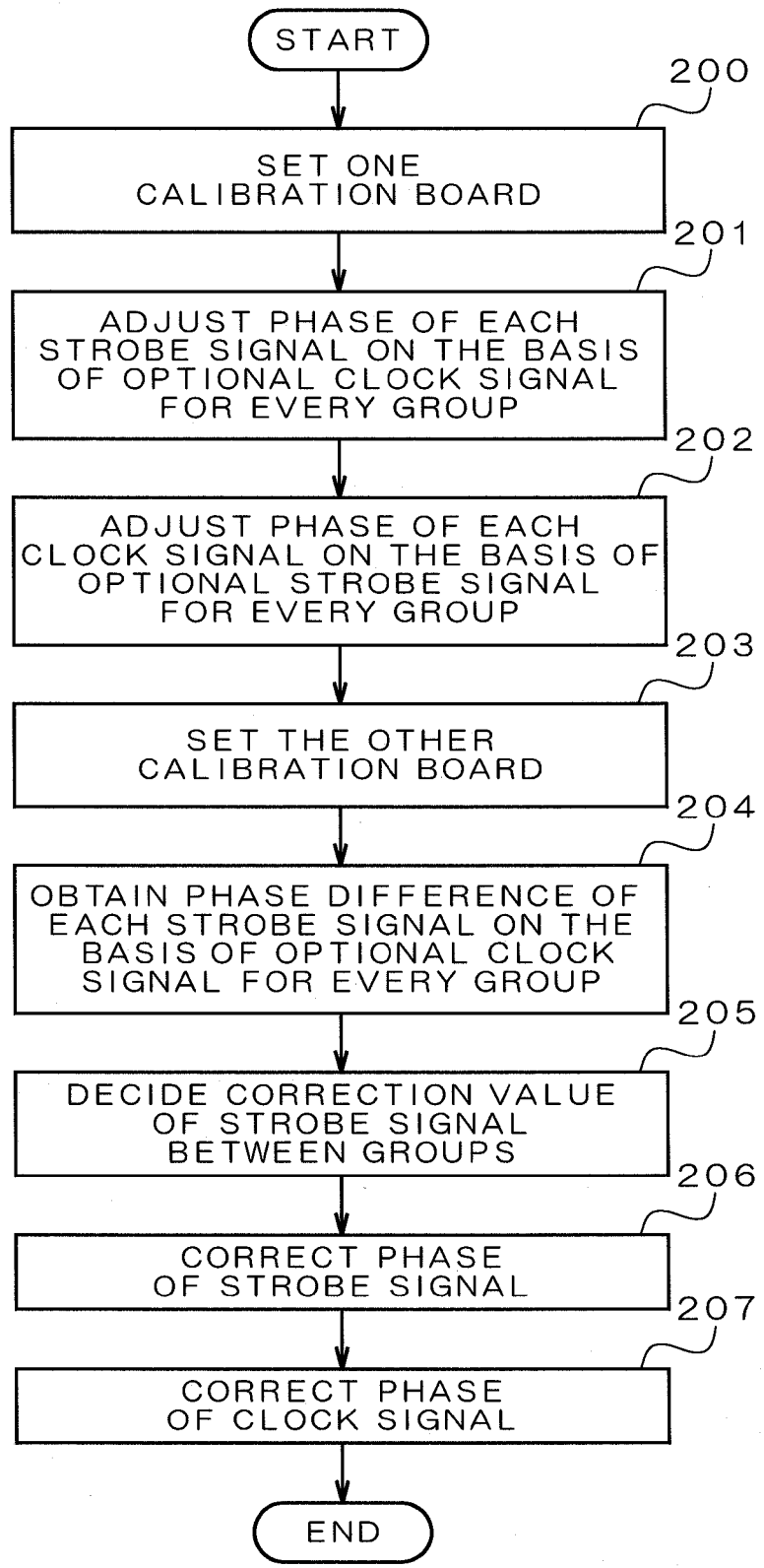
FIG. 17 is a flow chart showing a calibration procedure of the third embodiment.

FIG. 17 is a flowchart showing a calibration procedure of this embodiment. After one calibration board 150A is set to the performance board 30 (step 200), the tester control section 12 adjusts the phase of each strobe signal on the basis of an optional clock signal every group of the calibration board 150A (step 201).

As described above, this specification notices operations of a comparator when a signal generated by a driver correspondingly to a clock signal is input to the comparator in order to consider adjustment of the phase of a clock signal or strobe signal. Therefore, adjusting the phase of each strobe signal on the basis of an optional clock signal in step 201 just denotes adjusting the timing at which comparison is performed by a comparator to the timing at which a signal output from any driver in each group after inputting a clock signal to the driver and input to each comparator in the same group rises.

Figure 18:
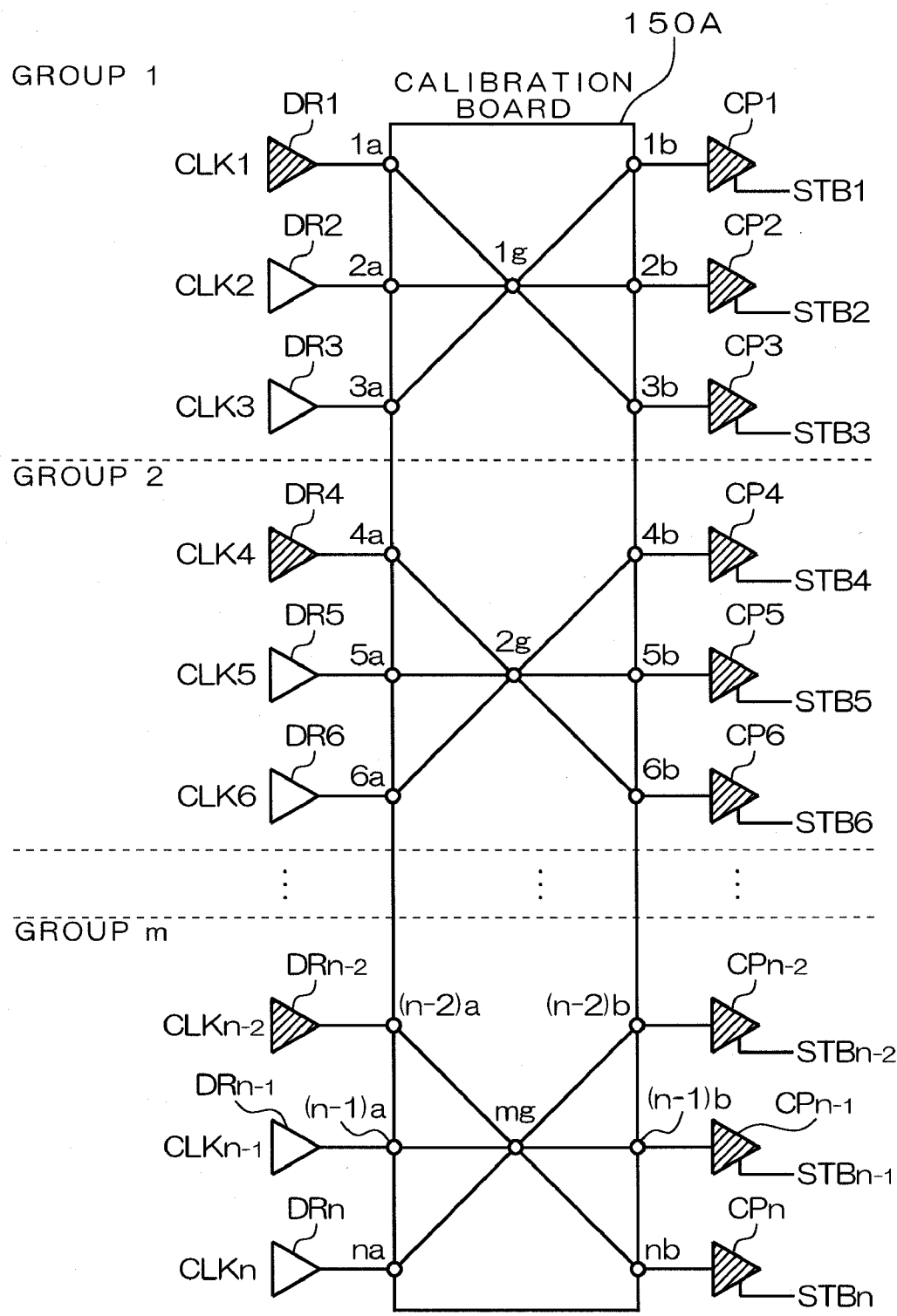
FIG. 18 is an illustration showing drivers and comparators to or from which signals are input or output correspondingly to step 201 shown in FIG. 17.

FIG. 18 is an illustration showing drivers and comparators to or from which signals are input or output correspondingly to step 201. In FIG. 18, drivers or comparators whose operations are valid are hatched. As shown in FIG. 18, operations of the driver DR1 to which the clock signal CLK1 is input becomes valid in the group 1 and operations of three comparators CP1 to CP3 to which a signal output from the driver DR1 is input via the short connection pint 1g become valid. Because the same is applied to other groups, detailed description is omitted.

Figure 19:
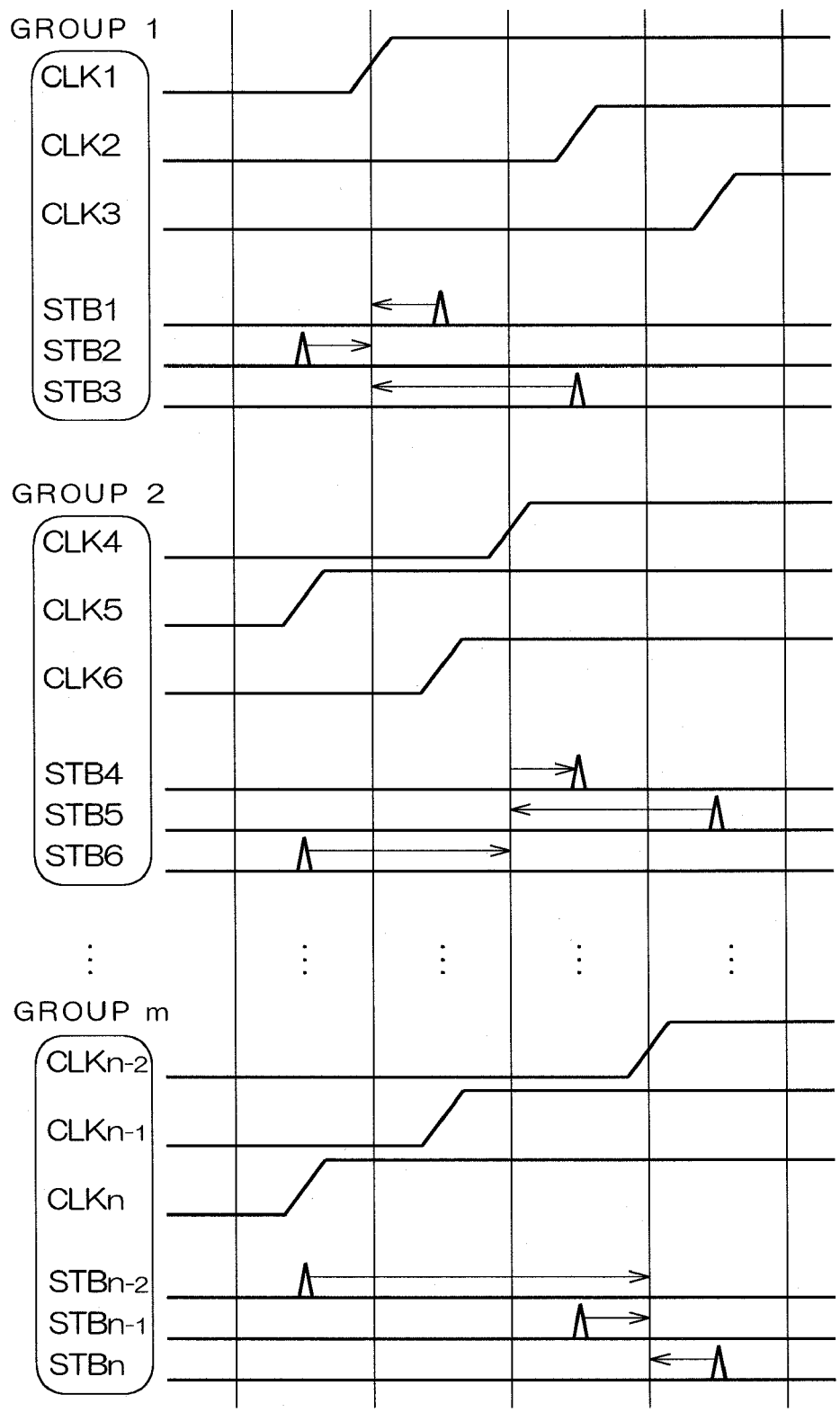
FIG. 19 is an illustration showing the outline of the strobe signal phase adjustment to be executed in step 201 in FIG. 17.

FIG. 19 is an illustration showing the outline of the strobe signal phase adjustment to be executed in step 201. First, the tester control section 12 notices the group 1, fixes the phase of the clock signal CLK1 input to the driver DR1, that is, fixes timings at which signals input to three comparators CP1 to CP3 via the short connection point 1g rise, thereby varies phases of the strobe signals STB1 to STB3, searches positions at which levels of outputs of the comparators CP1 to CP3 are inverted, and thus adjusts phases of the strobe signals STB1 to STB3 on the basis of the clock signal CLK1. Then, the tester control section 12 notices the group 2, fixes the phase of the clock signal CLK4 input to the driver DR4, that is, fixes timings at which signals input to three comparators CP4 to CP6 via the short connection point 2g rise, thereby varies phases of the strobe signals STB4 to STB6, searches positions at which levels of outputs of the comparators CP4 to CP6, and thus adjusts phases of the strobe signals STB4 to STB6 on the basis of the clock signal CLK4. Thus, the tester control section 12 notices each group, fixes the phase of a clock signal input to any driver, thereby varies the phase of strobe signal, searches positions at which levels of outputs of three comparators are inverted, and thus adjusts the phase of each strobe signal on the basis of a clock signal.

Thus, phases of strobe signals are adjusted every group. However, phases of clock signals corresponding to groups used for the above phase adjustment (timings at which signals corresponding to clock signals rise at input ends of comparators) do not coincide with each other. Therefore, at this stage, phases of strobe signals included in different groups do not coincide with each other. Moreover, it is not always necessary to start strobe signal phase adjustment with the group 1 but it is allowed to conform to an optional sequence or perform phase adjustments in parallel.

Then, the tester control section 12 adjusts phases of clock signals on the basis of any strobe signal every group of the calibration board 150A (step 202). In this case, adjusting phases of clock signals on the basis of any strobe signal just denotes adjusting phases of clock signals so that the rise timing of a signal output from each driver coincides with the timing of the comparison performed by any comparator while fixing the phase of a strobe signal input to the comparator.

Figure 20:
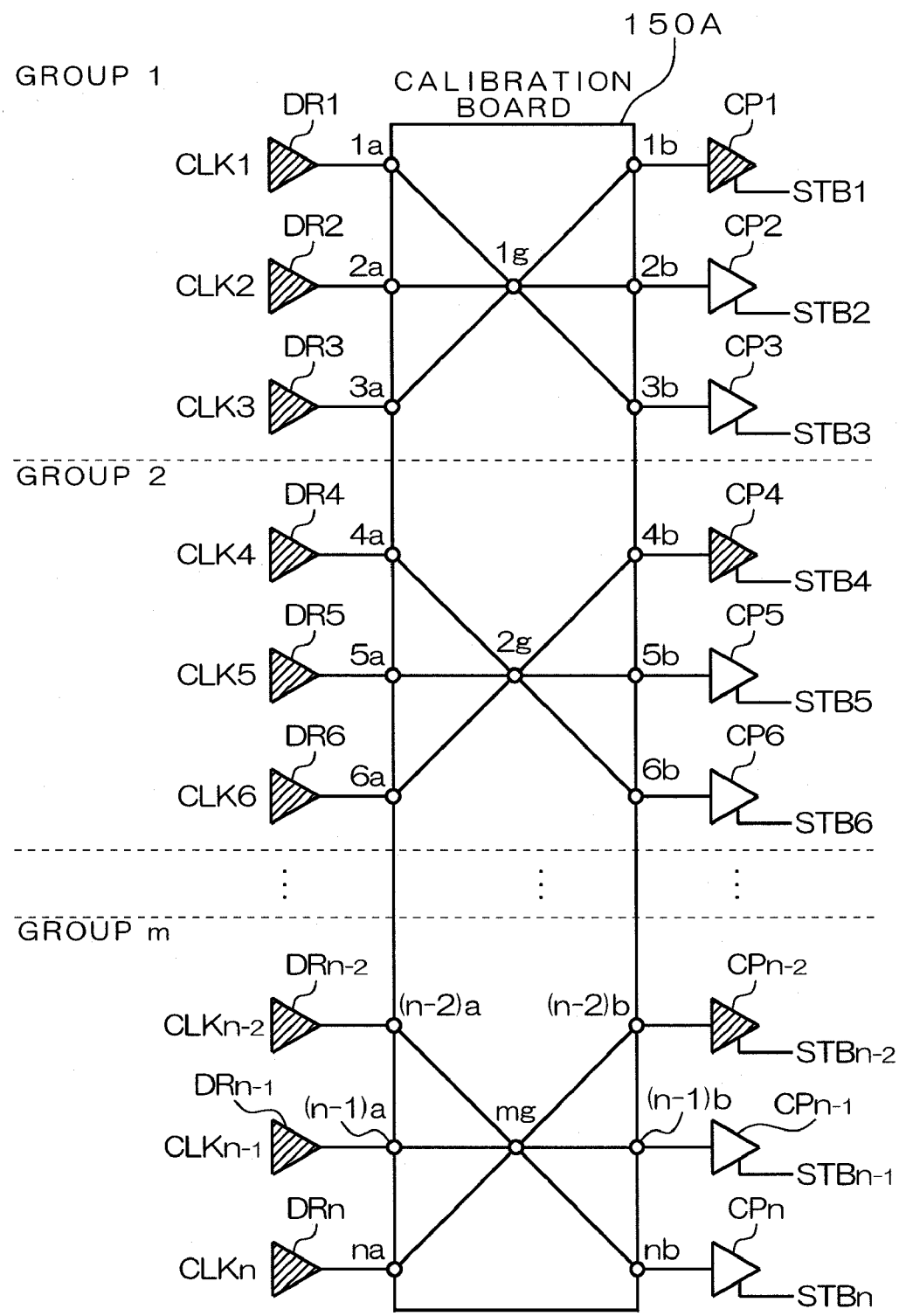
FIG. 20 is an illustration showing drivers and comparators to or from which signals are input or output correspondingly to step 202 shown in FIG. 17.

FIG. 20 is an illustration showing drivers and comparators to or from which signals are input or output correspondingly to step 202. As shown in FIG. 20, for example, operations of three drivers DR1 to DR3 become valid in the group 1 and operations of the comparator CP1 to which output signals of the drivers DR1 to DR3 are selectively input via the short connection point 1g become valid. Because the same is applied to other groups, detailed description is omitted.

Figure 21:
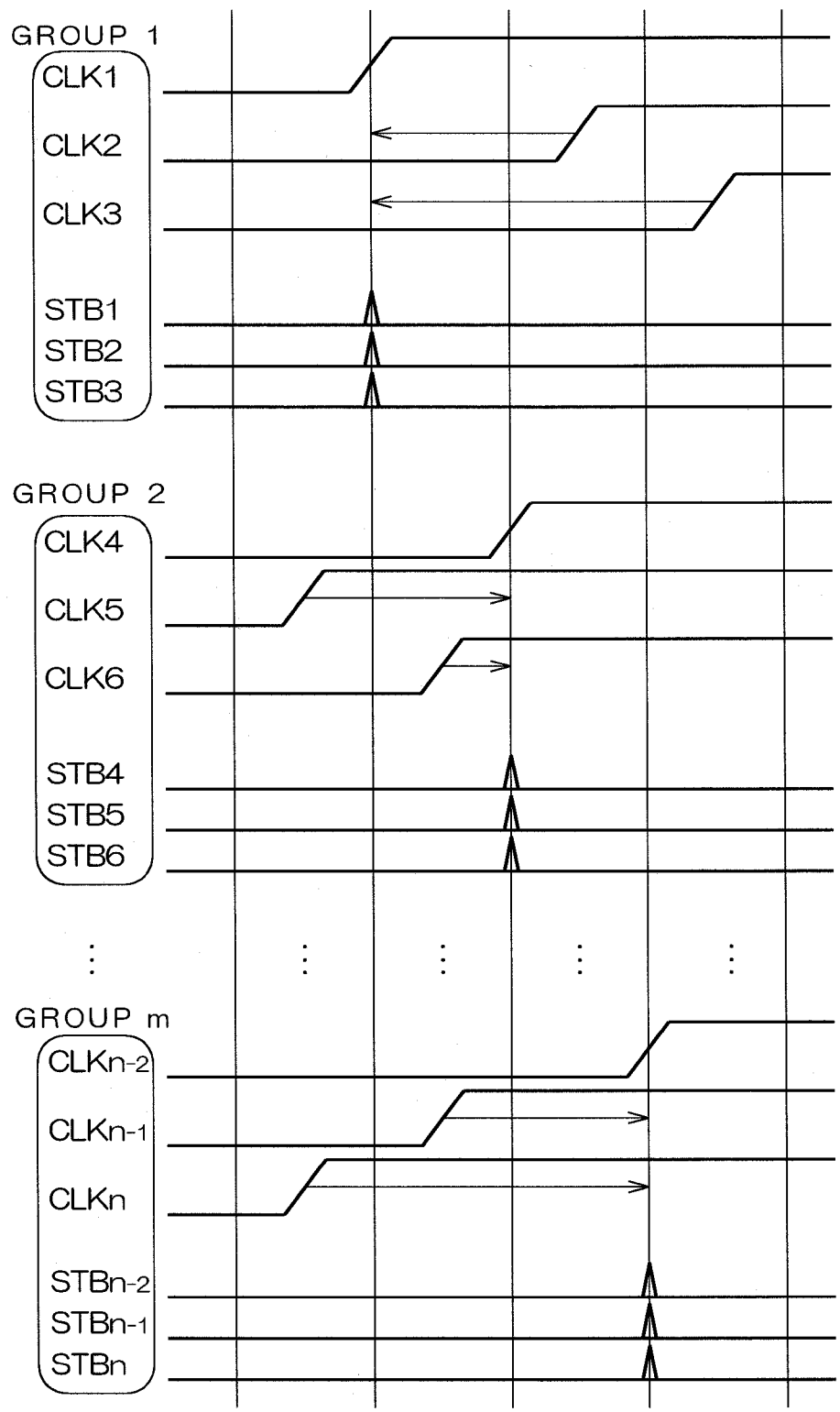
FIG. 21 is an illustration showing the outline of the clock signal phase adjustment to be executed in step 202 shown in FIG. 17.

FIG. 21 is an illustration showing the outline of the clock signal phase adjustment to be executed in step 202. First, the tester control section 12 notices the group 1, fixes the phase of the strobe signal STB1 input to the comparator CP1, that is, fixes the timing of the comparison performed by the comparator CP1 and thereby adjusts the phase of the clock signal CLK2 so that the timing at which a signal output from the driver DR2 and input to the comparator CP1 rises coincides with the comparison timing of the comparator CP1. When the phase adjustment corresponding to the driver DR2 is completed, the phase of the clock signal CLK3 is adjusted also for the driver DR3. Then, the tester control section 12 notices the group 2, fixes the phase of the strobe signal STB4 input to the comparator CP4, that is, fixes the timing of the comparison performed by the comparator CP4, and thereby adjusts the phase of the clock signal CLK5 so that the timing at which a signal output from the driver DR5 and input to the comparator CP4 rises coincides with the comparison timing of the comparator CP4. When the phase adjustment corresponding to the driver DR5 is completed, the phase of the clock signal CLK6 is adjusted also for the driver DR6. Thus, the tester control section 12 notices each group, fixes the phase of a strobe signal input to any comparator, thereby varies the phase of a clock signal input to each driver, makes timings at which outputs of three drivers rise coincide with timings at which comparisons are performed by comparators, and thus adjusts the phase of each clock signal.

Thus, phases of clock signals are adjusted every group. However, phases of strobe signals in each group used for the above phase adjustment do not coincide with each other. Therefore, at this stage, phases of clock signals included in different groups do not coincide with each other. Moreover, it is not always necessary to start strobe signal phase adjustment with the group 1 but it is allowed to perform the adjustment in any sequence or in parallel for groups.

Thus, when operations for adjusting phases of clock signals and strobe signals corresponding to all drivers and comparators included in each group are completed by using one calibration board 150A, the other calibration board 150B is set (step 203). The calibration boards 150A and 150B may be set in steps 200 and 203 manually or by an exclusive robot in order to automate operations.

Then, the tester control section 12 obtains the phase difference of each strobe signal corresponding to a comparator included in a group on the basis of a clock signal corresponding to any driver (step 2204). Thereby, phase differences of strobe signals between groups are obtained.

Figure 22:
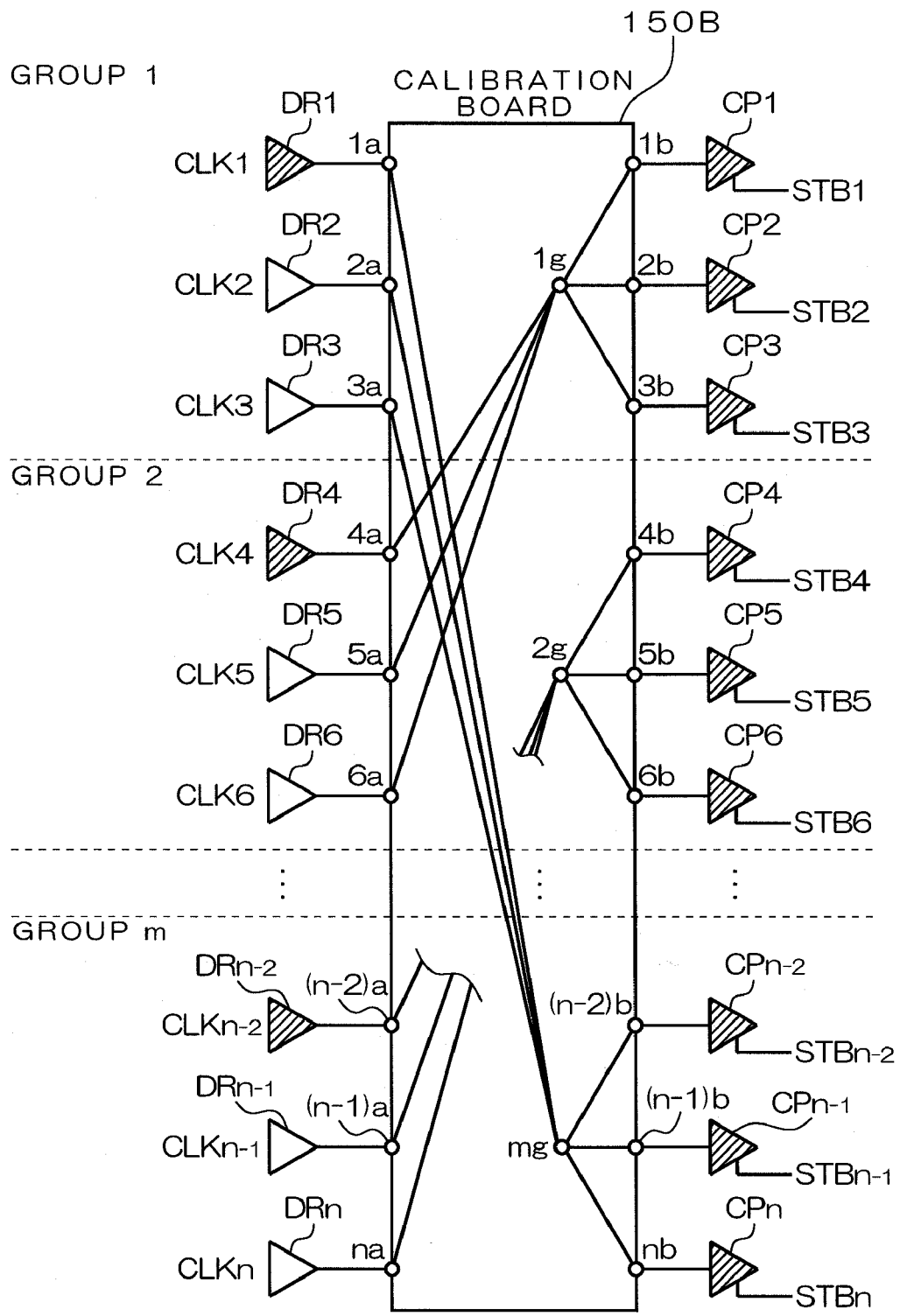
FIG. 22 is an illustration showing a driver and a comparator to or from which signals are input or output correspondingly to step 204 shown in FIG. 17.

FIG. 22 is an illustration showing drivers and comparators to or from which signals are input or output correspondingly to step 204. As shown in FIG. 22, for example, operations of the comparators CP1 to CP3 become valid in the group 1 and operations of the driver DR4 included in the group 2 become valid in order to measure phase differences of the strobe signals STB1 to STB3 corresponding to these three comparators CP1 to CP3. Because the same is applied to other groups, detailed description is omitted.

Figure 23:
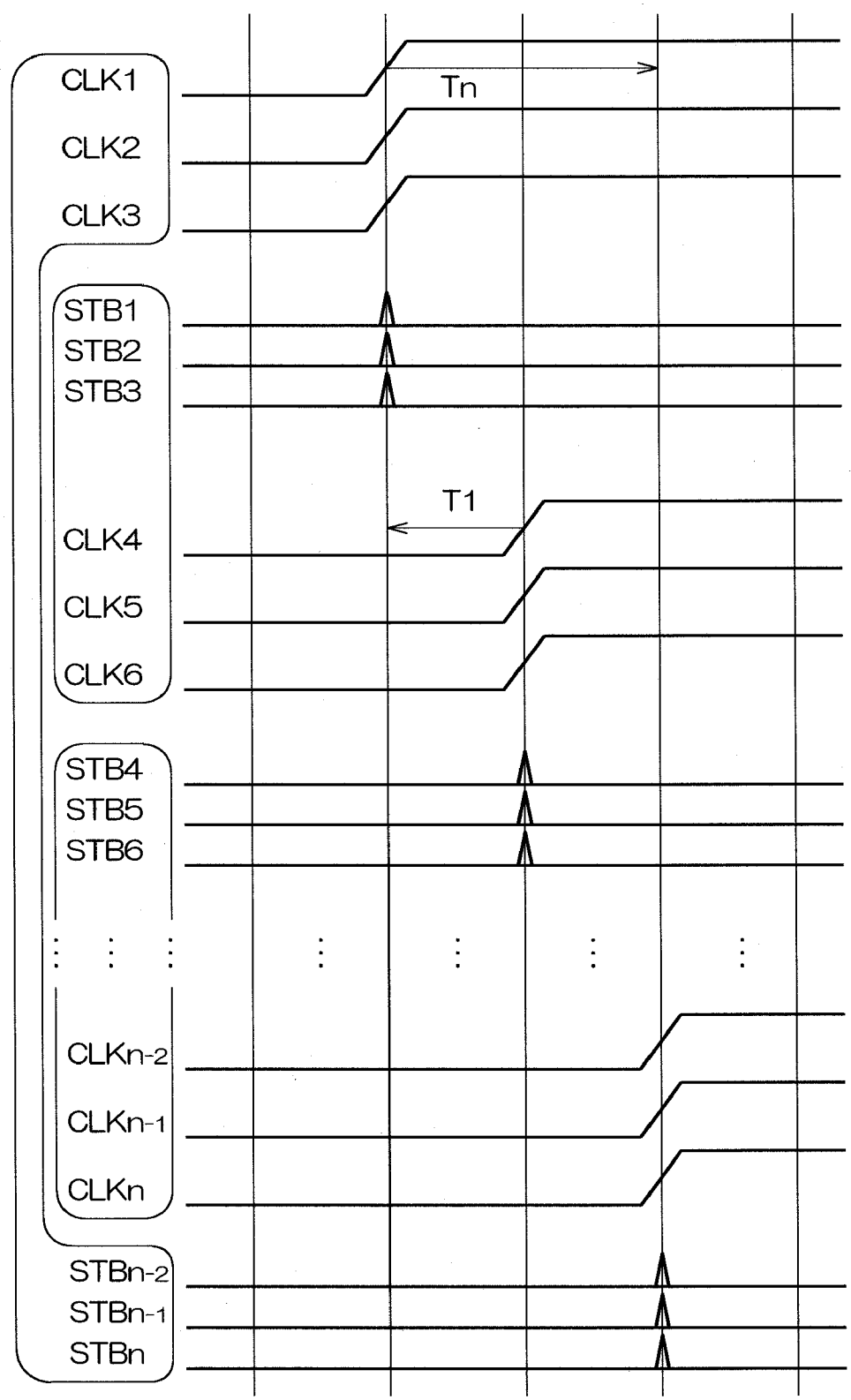
FIG. 23 is an illustration showing the outline of the strobe signal phase difference measurement to be executed in step 204 shown in FIG. 17.

FIG. 23 is an illustration showing the outline of the strobe signal phase difference measurement to be executed in step

204. First, the tester control section 12 measures the phase difference T1 of each of the strobe signals STB1 to STB3 corresponding to the comparators CP1 to CP3 on the basis of the clock signal CLK4 corresponding to the driver DR4 included in the group 2. Specifically, the tester control section 12 fixes phases of the strobe signals STB1 to STB3 input to the comparators CP1 to CP3, that is, fixes comparison timings of three comparators CP1 to CP3 thereby varies the phase of the clock signal CLK4 corresponding to the driver DR4, searches positions at which outputs of the comparators CP1 to CP3 are inverted, and thus measures the change value of the phase of the clock signal CLK4 as the phase difference T1. Then, the tester control section 12 measures phase differences of the strobe signals STB4 to STB6 corresponding to the comparators CP4 to CP6 included in the group 2 on the basis of the clock signal CLK7 corresponding to the driver DR7 included in the group 3. Thus, the tester control section 12 measures the phase difference of a strobe signal corresponding to a comparator included in each group on the basis of a clock signal corresponding to a driver included in a different group. Thereby, it is possible to obtain the phase shift of a strobe signal between groups.

In the above description, the phase of a clock signal is varied. However, it is also allowed to vary the phase of a strobe signal while fixing the phase of a clock signal. Moreover, though phases of strobe signals corresponding to comparators included in each group must coincide with each other through the above phase adjustment in step 201, a fluctuation may occur at the time of actual measurement. Therefore, it is preferable to obtain an averaged phase difference every group by averaging values of phase differences measured for three strobe signals. Or, it is also allowed to obtain and average phase differences of strobe signals on the basis of a clock signal corresponding to another driver in the same group. For example, to measure the phase difference T1 shown in FIG. 23, it is allowed to use the clock signals CLK5 and CLK6. Thus, by averaging measurement results, it is possible to reduce the number of calibration errors caused by the fluctuation of measurement results and improve the measurement accuracy by uniforming measurement results in the measurement performed after calibration.

Then, correction values of strobe signals are decided by using obtained phase differences of the strobe signals between groups (step 205). Specifically, because relative phase differences of strobe signals between two adjacent groups in step 204 are known by obtaining phase differences of strobe signals between groups, it is possible to decide a correction value necessary to adjust, on the basis of the phase of a strobe signal corresponding to one group, the phase of a strobe signal corresponding to the other group to the phase of a strobe signal serving as a criterion.

Thereafter, the tester control section 12 corrects the phase of a strobe signal corresponding to each group by using the decided correction value (step 206).

Figure 24:
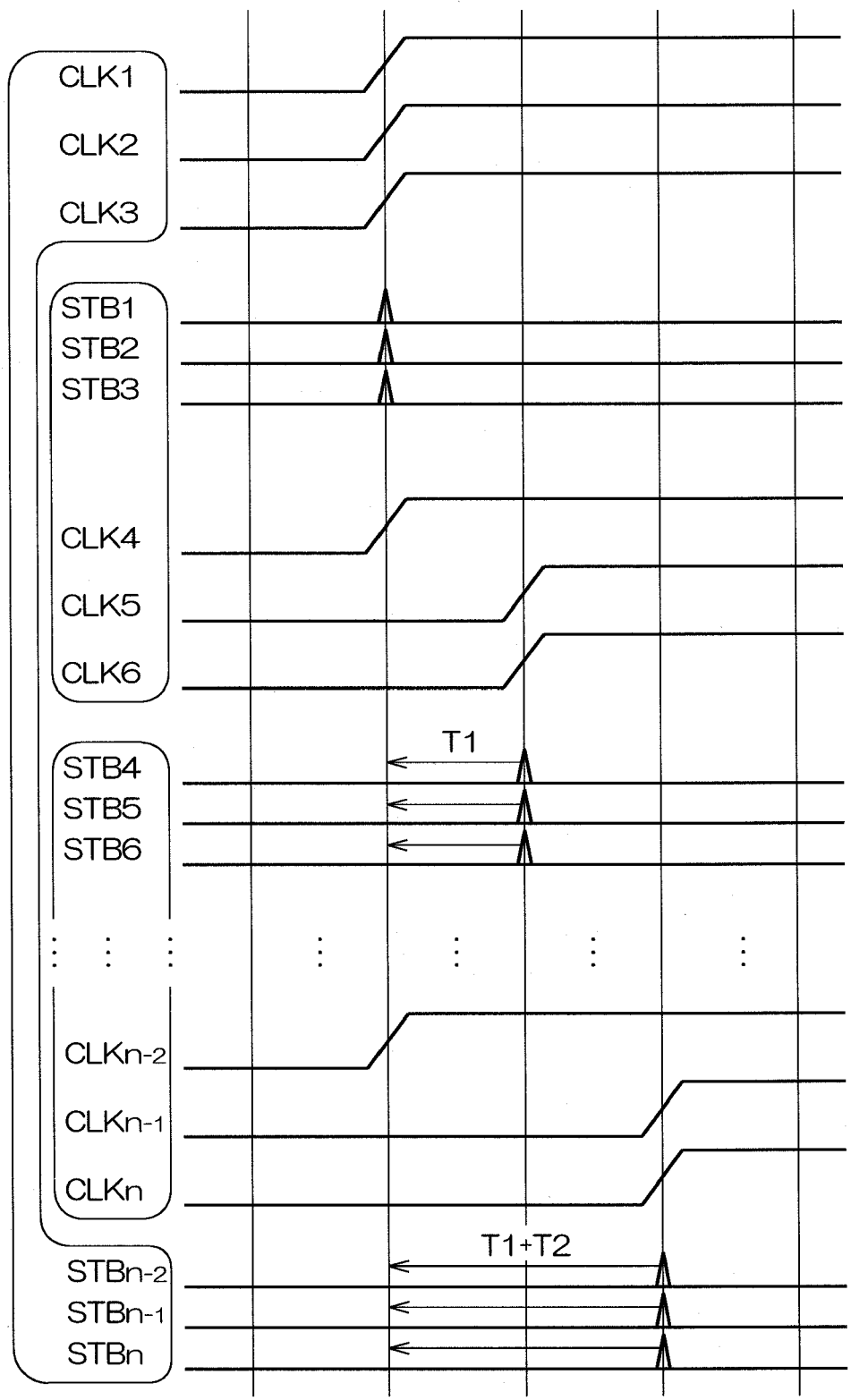
FIG. 24 is an illustration showing the outline of the strobe signal phase correction to be executed in step 206 shown in FIG. 17.

FIG. 24 is an illustration showing the outline of the strobe signal phase correction to be executed in step 206. For example, the tester control section 12 corrects the phases of the strobe signals STB4 to STB6 corresponding to the comparators CP4 to CP6 included in the group 2 by the correction value T1 obtained in step 206 so as to they coincide with the phases of the strobe signals STB1 to STB3 corresponding to the comparators CP1 to CP3 included in the group 1. Thus, the tester control section 12 can make phases of all strobe signals coincide with each other by correcting phases of strobe signals corresponding to comparators in each group by using the correction value obtained in step 206.

Then, the tester control section 12 corrects phases of the clock signals CLK1 to CLKn input to the drivers DR1 to DRn (step 207). This correction is performed on the basis of the phase of a strobe signal corresponding to any comparator in each group.

Figure 25:
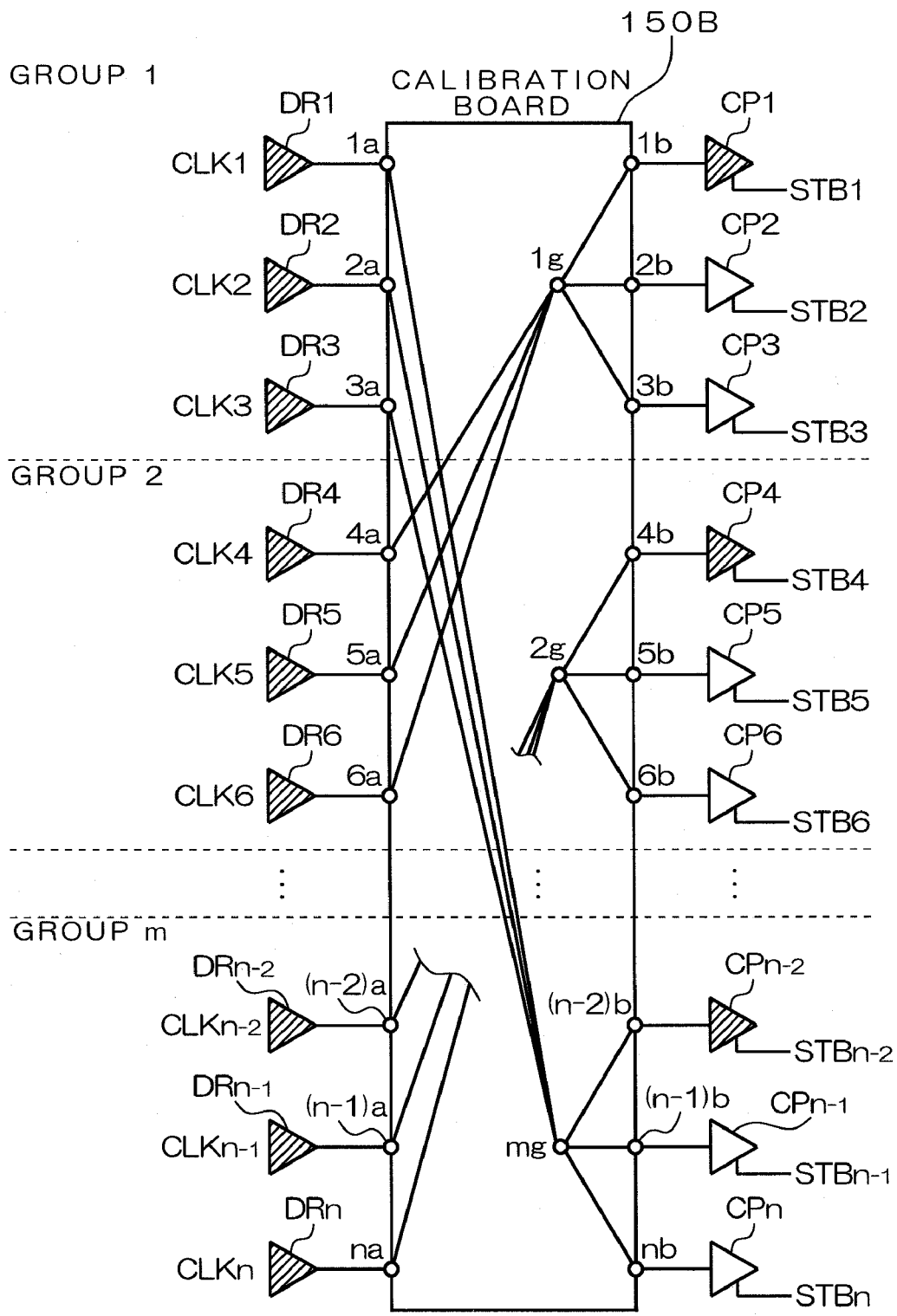
FIG. 25 is an illustration showing drivers and comparators to or from which signals are input or output correspondingly to step 207 shown in FIG. 17.

FIG. 25 is an illustration showing drivers and comparators to or from which signals are input or output correspondingly to step 207. As shown in FIG. 25, for example, operations of three drivers DR1 to DR3 become valid in the group 1 and operations of comparator CPn-2 included in group m become valid in order to correct phases of the clock signals CLK1 to CLK3 corresponding to three drivers DR1 to DR3. Because the same is applied to other groups, detailed description is omitted.

Figure 26:
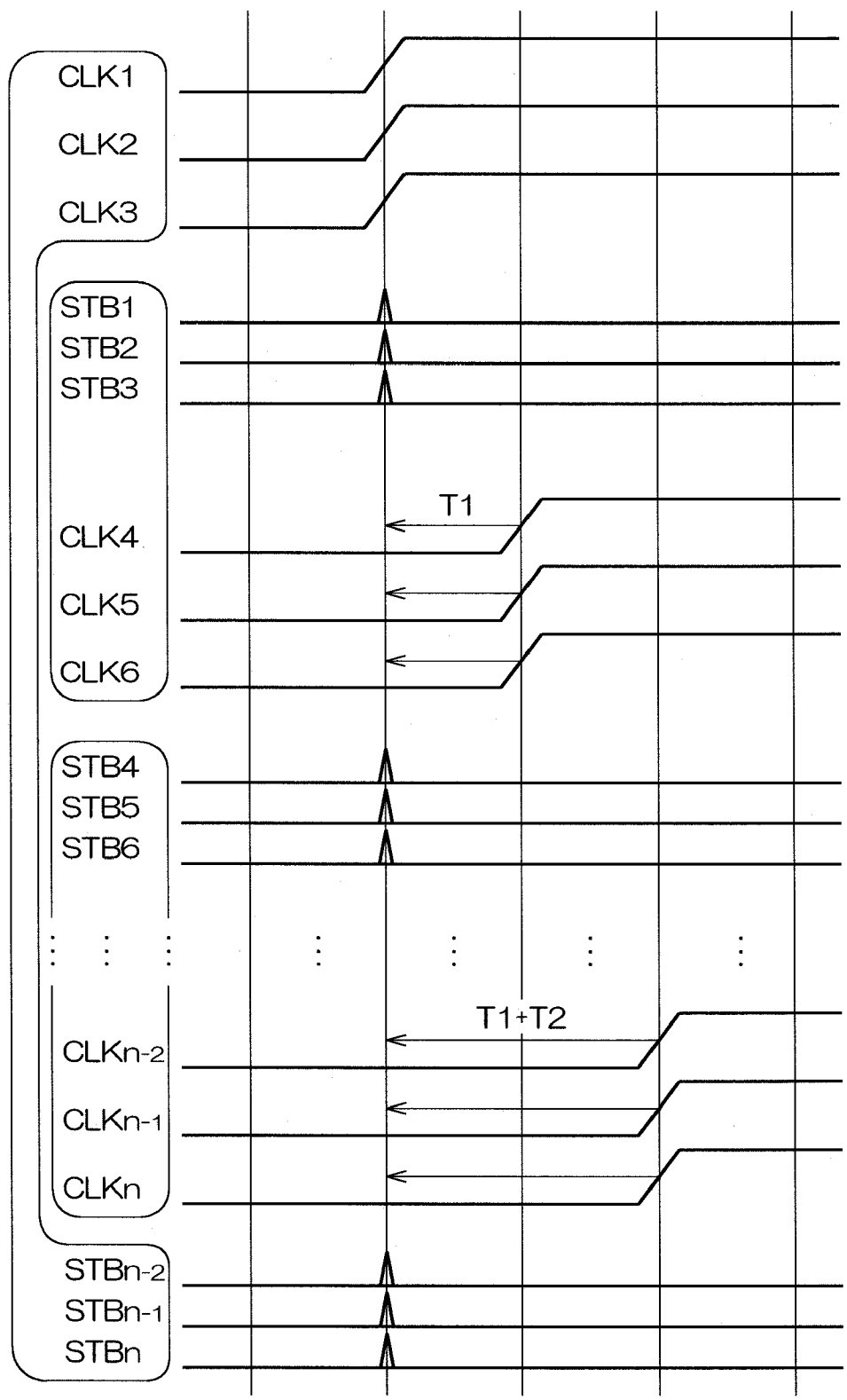
FIG. 26 is an illustration showing the outline of the clock signal correction to be executed in step 207 shown in FIG. 17.

FIG. 26 is an illustration showing the outline of the clock signal correction to be executed in step 207. For example, the tester control section 12 corrects phases of the clock signals CLK4 to CLK6 corresponding to three drivers DR4 to DR6 included in the group 2 on the basis of a strobe signal corresponding to the comparator CP1 in the group 1. Thus, the tester control section 12 corrects phases of clock signals corresponding to three drivers included in each group on the basis of strobe signals corresponding to comparators included in different groups. Thereby, phases of all clock signals and strobe signals coincide with each other.

As described above, in the case of the semiconductor test instrument of this embodiment using the calibration boards 150A and 150B, clock signals and strobe signals are first adjusted every group by using one calibration board 150A. Then, by using the other calibration board 150B, phase differences of strobe signals are measured between groups and phases are corrected so as to eliminate phase differences of strobe signals and clock signals between groups in accordance with the measured phase differences. Therefore, in the case of the calibration by the semiconductor test instrument of this embodiment, it is unnecessary to contact a probe every device socket end and only the calibration boards 150A and 150B are set. It makes possible to simplify working contents necessary for calibration. Moreover, it is unnecessary to separately use a special configuration including a reference driver/comparator section and an exclusive robot for repeating contact and movement of a probe and thus, it is possible to greatly reduce the cost. Furthermore, because the operation followed by mechanical movement before calibration is completed includes only setting of the calibration boards 150A and 150B, it is possible to greatly shorten the working time compared to the conventional case of repeating movement and contact of a probe by the number of device socket ends. Furthermore, by dividing drivers and comparators into a plurality of groups and using the phase difference data measured every group, it is possible to reduce the number of calibration errors caused by the fluctuation of measurement results and improve the measurement accuracy by uniforming measurement errors through actual measurement performed after calibration.

In the case of the above embodiment, the phase of each strobe signal is first adjusted on the basis of an optional clock signal and then, the phase of each clock signal is adjusted in steps 201 and 202 shown in FIG. 17. However, it is also allowed to first adjust the phase of each clock signal on the basis of an optional strobe signal and then adjust the phase of each strobe signal.

Moreover, in step 204 shown in FIG. 17, the phase difference of each strobe signal is obtained on the basis of an optional clock signal. However, it is also allowed to obtain the phase difference of each clock signal on the basis of an optional strobe signal.

Moreover, though the phase of a clock signal is adjusted (step 207 in FIG. 17) after adjusting the phase of a strobe signal by using the calibration board 150B (step 206 in FIG. 17), it is also allowed to reverse the above sequence.

[Fourth Embodiment]

In the case of the above third embodiment, calibration is performed by using two types of the calibration boards 150A and 150B in order. However, it is also allowed to use one type of a calibration board having functions of the two calibration boards 150A and 150B so as to save labor.

Figure 27:
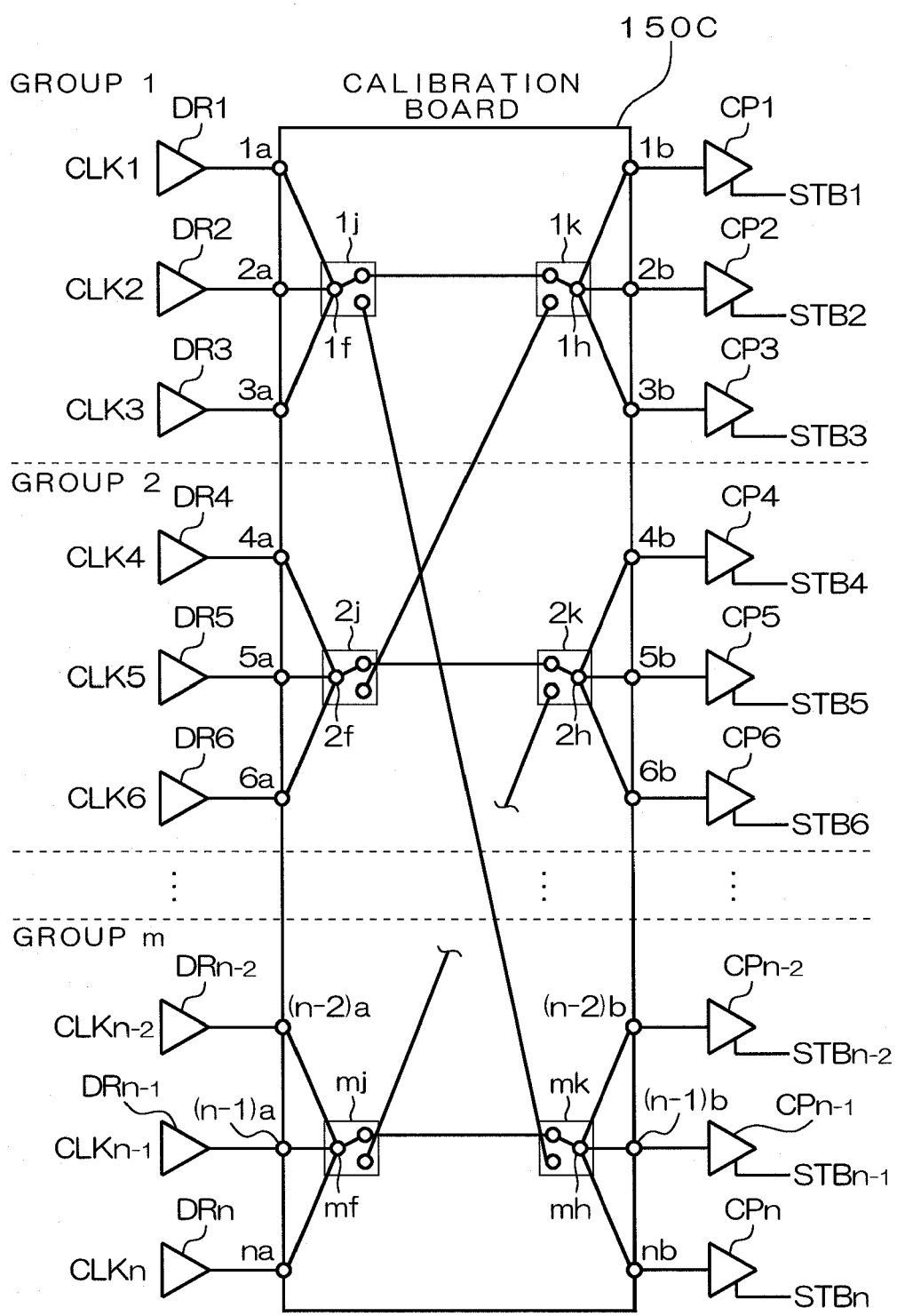
FIG. 27 is an illustration showing a configuration of a calibration board of a fourth embodiment having functions of two types of calibration boards different from each other in wiring contents.
Figure 28:
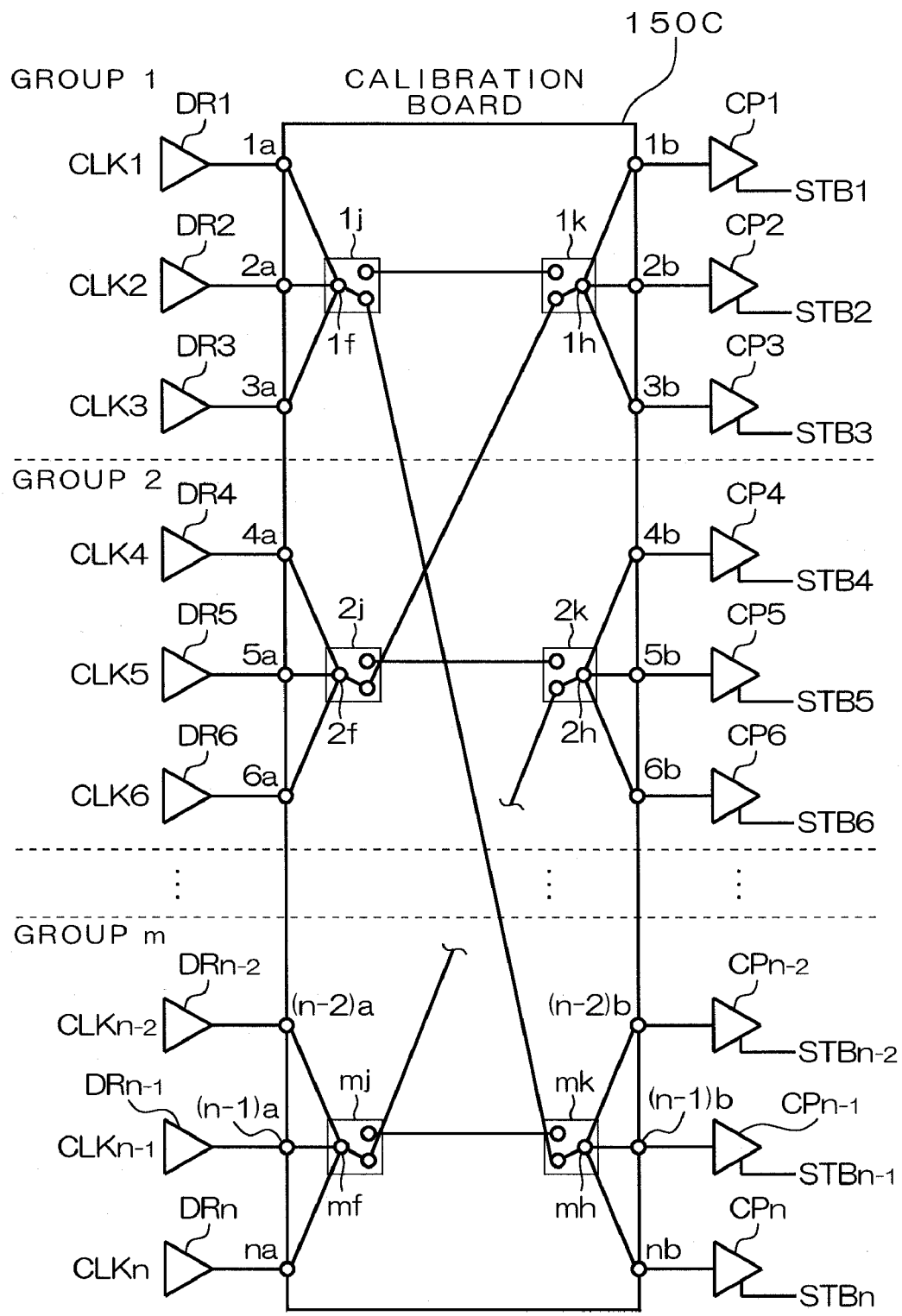
FIG. 28 is an illustration showing a configuration of a calibration board of the fourth embodiment having functions of two types of calibration boards different from each other in wiring contents.

FIGS. 27 and 28 are illustrations showing a configuration of a calibration board 150C of a fourth embodiment having functions of two types of the calibration boards 150A and 150B different from each other in wiring contents. The calibration board 150C shown in FIGS. 27 and 28 is provided with two changeover switches every group.

Specifically, a changeover switch 1j is set nearby a terminal 1f connected to output terminals of three drivers DR1 to DR3 corresponding to the group 1 in common and a changeover switch 1k is set nearby a terminal 1h connected to input terminals of three comparators Cp1 to CP3 in common. Moreover, two changeover switches 2j and 2k are set to the group 2 . . . and changeover switches mj and mk are set to the group m.

By changing over the changeover switch 1j, it is possible to selectively connect output ends of three drivers DR1 to DR3 corresponding to the group 1 to either input ends of three comparators CP1 to CP3 corresponding to the group 1 or input ends of three comparators CPn-2 to CPn corresponding to the group m. The same is applied to other changeover switches and it is possible to selectively realize two connection states. Lengths of wirings for connecting output ends of the drivers with input end of the comparators are set so that signal delay times are all equalized independently of states of changeover switches.

As shown in FIGS. 27 and 28, by changing over the changeover switches 1j and 1k, it is possible to selectively realize wiring contents of two types of the calibration boards 150A and 150B. Therefore, by using the calibration board 150C and thereby changing over changeover switches and performing calibration, exchange of calibration boards is unnecessary and it is possible to further simplify working contents, reduce the cost, and shorten the working time.

[Fifth Embodiment]

Then, a method for calibrating a semiconductor test instrument of a fifth embodiment using having wiring contents different from those of the above described embodiments is described below.

Figure 29:
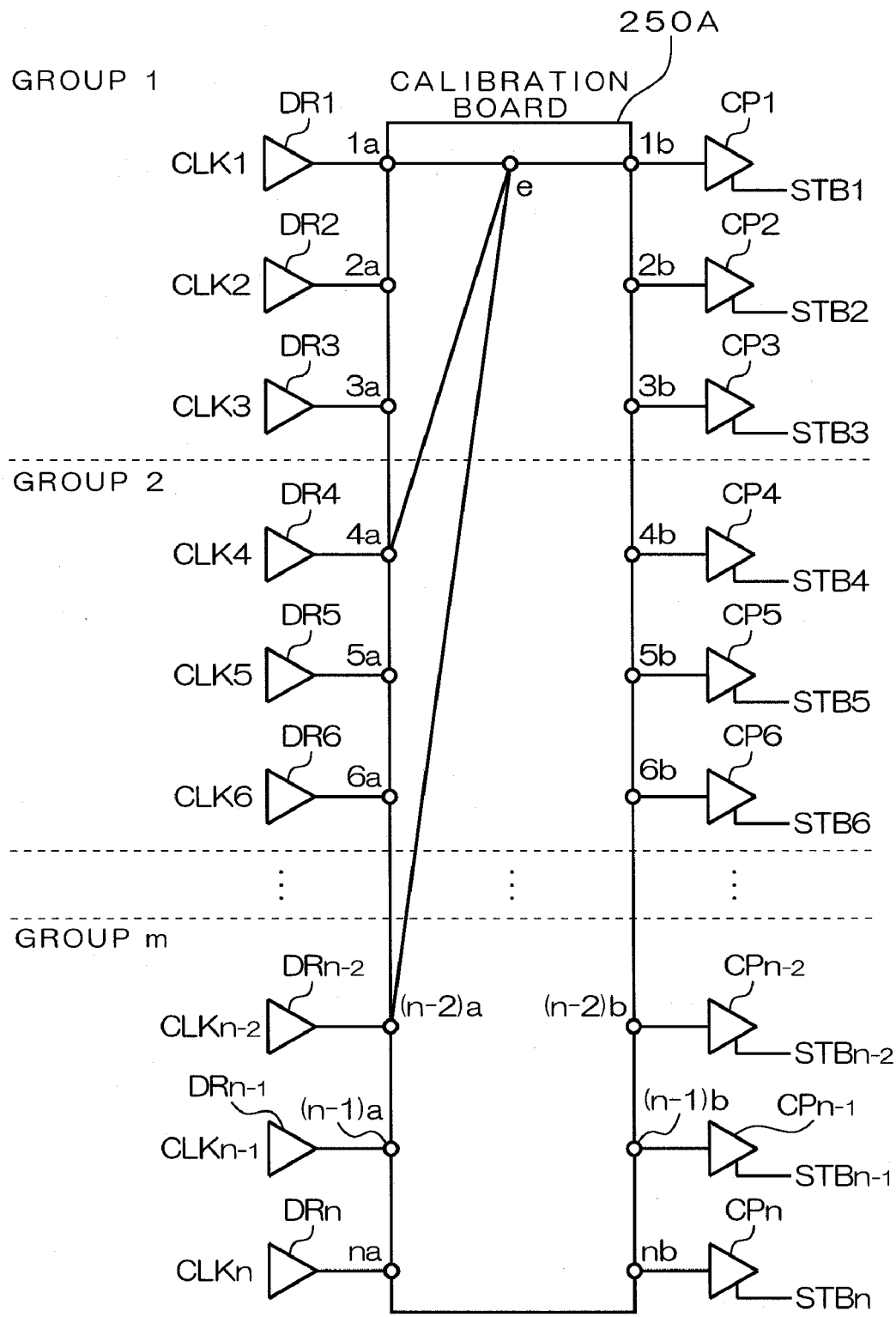
FIG. 29 is an illustration showing a wiring state of one calibration board of a fifth embodiment.

FIG. 29 is an illustration showing a wiring state of one calibration board 250A. A short connection point (device socket end) e shown in FIG. 29 is drawn in the calibration board 250A according to illustration's convenience.

In FIG. 29, n terminals 1a to na connected with n drivers DR1 to DRn form m number of groups by collecting every a predetermined number of terminals (e.g. every three terminals) The first group (group 1) includes the terminals 1a to 3a corresponding to the drivers DR1 to DR3 respectively and among the terminals 1a to 3a, only the terminal 1a is connected to a short connection point e in common. The second group (group 2) includes the terminals 4a to 6a corresponding to the drivers DR4 to DR6 respectively and among the terminals 4a to 6a, only the terminal 4a is connected to the short connection point e in common. The same is applied to other terminals and the m-th group (group m) includes the terminals (n-2) a to na corresponding to the drivers DRn-2 to DRn respectively and among the terminals (n-2) a to na, only the terminal (n-2) a is connected to the short connection point e in common.

Moreover, n terminals 1b to nb connected with n comparators CP1 to CPn form m number of groups by collecting every a predetermined number of terminals. The first group includes the terminals 1b to 3b corresponding to the comparators CP1 to CP3 respectively and among the terminals 1b to 3b, only the terminal 1b is connected to the short connection point e. The second group includes the terminals 4b to 6b corresponding to the comparators CP4 to CP6 respectively. The same is applied to other terminals and the m-th group (group m) includes the terminals (n-2) b to nb corresponding to the comparators CPn-2 to CPn respectively.

Thus, the unique short connection point e set to the calibration board 250A is connected to a terminal corresponding to one driver (this is referred to as in-group common driver) of three drivers included in each group in common and moreover connected to a terminal corresponding to one comparator (this is referred to as common comparator) of three comparators included in the group 1. Wirings for connecting terminals with the short connection point e are set so that their wiring lengths (time lengths) in terms of signal delay time are set so as to be all equalized.

Figure 30:
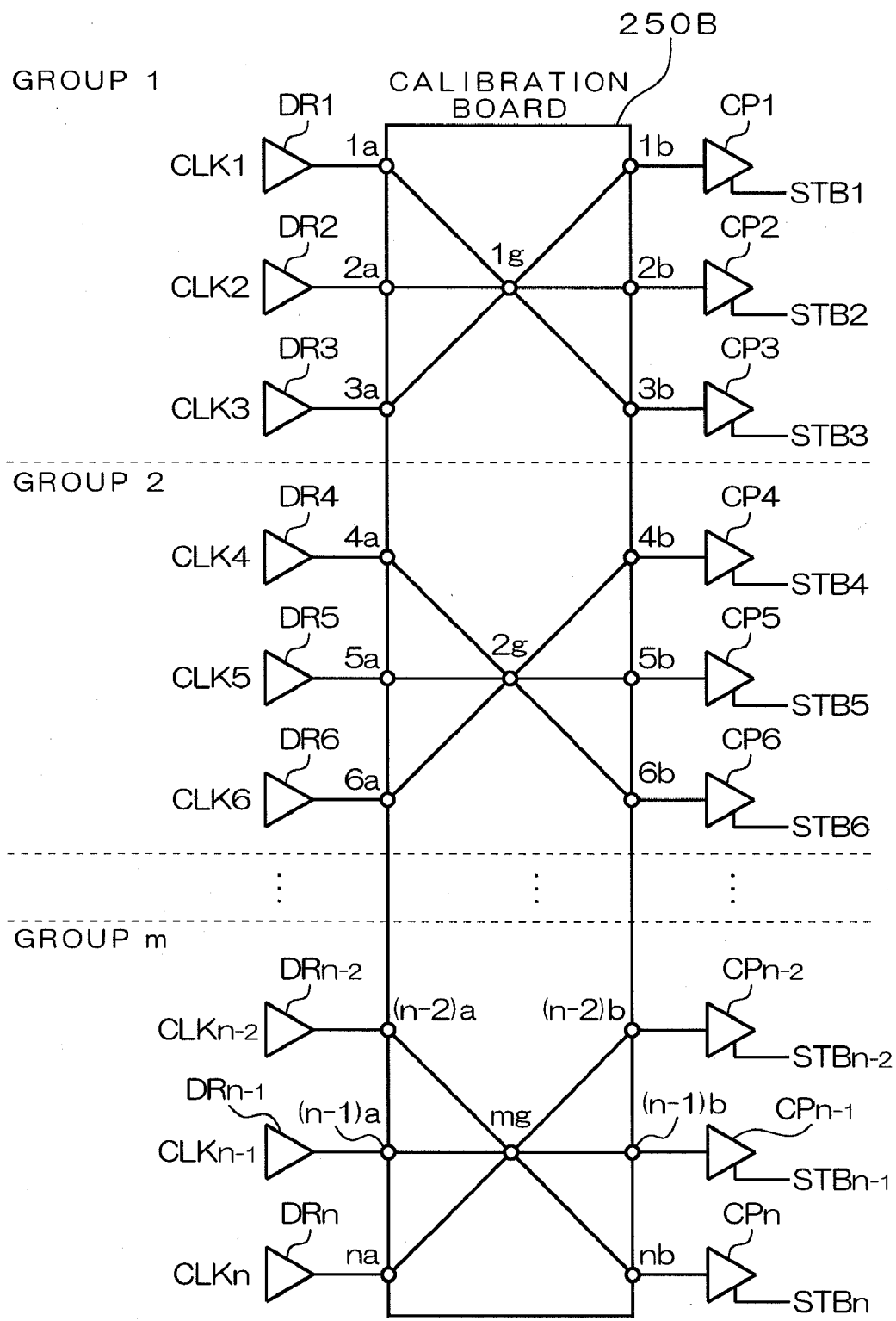
FIG. 30 is an illustration showing a wiring state of the other calibration board of the fifth embodiment.

FIG. 30 is an illustration showing a wiring state of the other calibration board 250B. The m short connection points 1g to mg shown in FIG. 30 are drawn in the calibration board 250B for reasons of illustration. However, because it is not always necessary that each short connection point is exposed to the outside, it is allowed that the short connection point 1g and the like are embedded in the calibration board as illustrated in FIG. 30. The other calibration board 250B shown in FIG. 30 has the same wiring state as the calibration board 150A shown in FIG. 14 and description of a wiring state is omitted.

The calibration boards 250A and 250B of this embodiment have the above configurations. Then, calibrations using these calibration boards are described below. In this case, it is assumed that clock signals and strobe signals in the semiconductor test instrument 10 before calibration are respectively kept in the initial state shown in FIG. 16.

Figure 31:
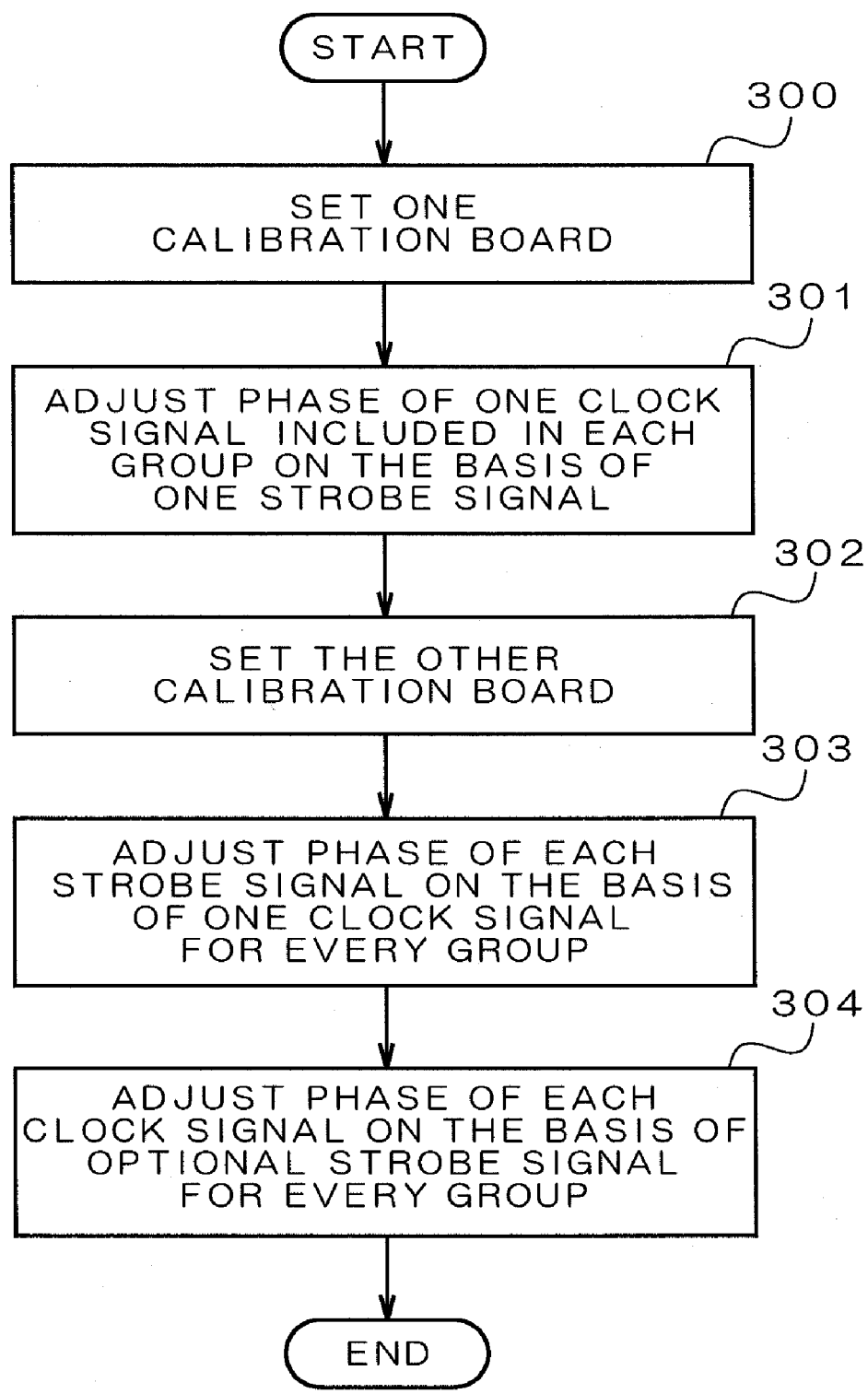
FIG. 31 is a flow chart showing a calibration procedure of the fifth embodiment.

FIG. 31 is a flowchart showing a calibration procedure of this embodiment. After one calibration board 250A is set to a performance board 30 (step 300), a tester control section 12 adjusts phases of clock signals CLK1, CLK4, . . . , and CLKn-2 corresponding to drivers (in-group common drivers) DR1, DR4, . . . , and DRn-2 included in each group on the basis of a strobe signal STB1 corresponding to a comparator CP1 of the calibration board 250A (step 301).

In the above step 3.01, it is necessary to adjust the phase of the clock signal CLK1 or the like on the basis of the strobe signal STB1. Therefore, the phase of the clock signal CLK1 or the like is adjusted by observing the level of an output signal of the comparator CP1 when the strobe signal STB1 is output (raised) and comparison is performed by the comparator CP1 while changing the rise timing of the clock signal CLK1 or the like little by little and obtaining the phase of the clock signal CLK1 or the like when the level of an output signal of the comparator CP1 is just inverted. The above operation is performed for the clock signals CLK1, CLK4, . . . , and CLKn-2 in order.

Figure 32:
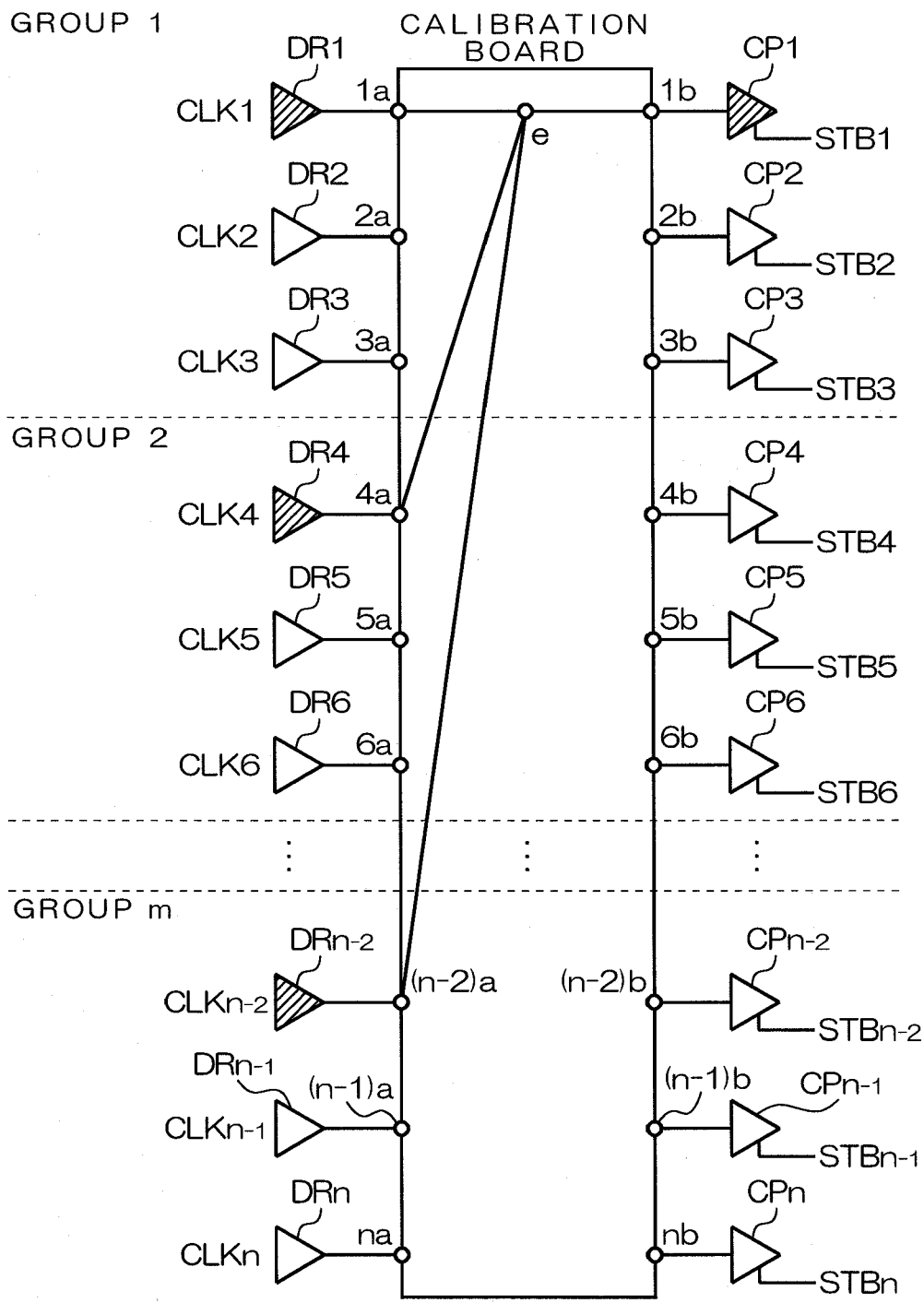
FIG. 32 is an illustration showing a driver and a comparator to or from which signals are input or output correspondingly to step 301 shown in FIG. 31.

FIG. 32 is an illustration showing drivers and comparators to or from which signals are input or output correspondingly to step 301. In FIG. 32, a driver or comparator whose operations are valid is hatched. As shown in FIG. 32, operations of the driver DR1 to which the clock signal CLK1 is input become valid and operations of the comparator CP1 to which a signal output from the driver DR1 is input via the short connection point e become valid in the group 1. Moreover, in another group, operation of a driver to which a clock signal is input becomes valid. For example, operations of the driver DR4 become valid in the group 2 and operations of the driver DRn-2 become valid in the group m.

Figure 33:
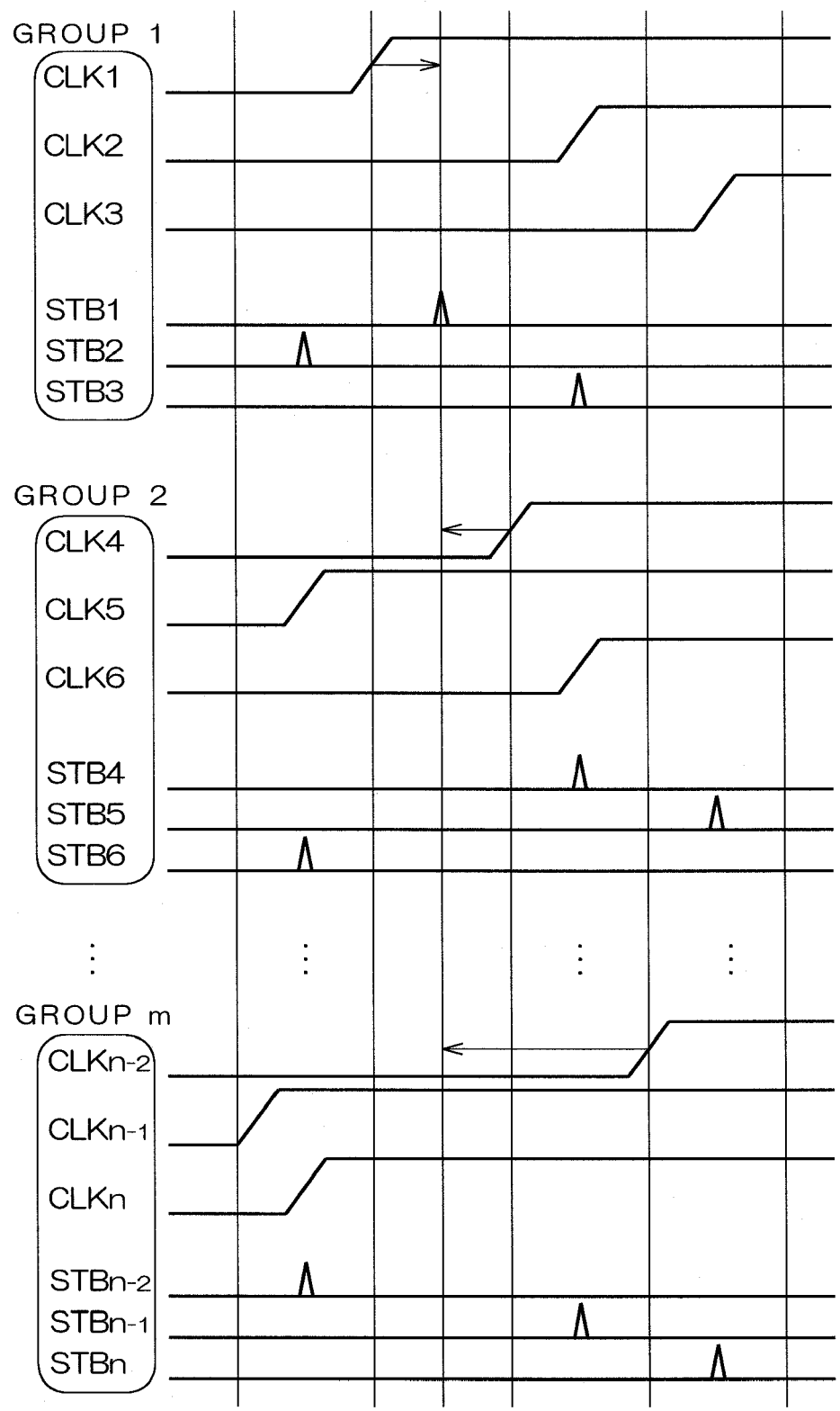
FIG. 33 is an illustration showing the outline of the clock signal phase adjustment to be executed in step 301 shown in FIG. 31.

FIG. 33 is an illustration showing the outline of the clock signal phase adjustment to be executed in step 301. First, the tester control section 12 notices the driver DR1 in the group 1, fixes the phase of the strobe signal STB1 input to the comparator CP1, that is, fixes the timing for performing comparison by the comparator CP1, thereby varies the phase of the clock signal CLK1, searches a position at which the level of an output of the comparator CP1 is inverted, and thus adjusts the phase of the clock signal CLK1. Then, the tester control section 12 notices the driver DR4 in the group 2, fixes the phase of the strobe signal STB1 input to the comparator CP1, thereby varies the phase of the clock signal CLK4, and searches a position at which the level of an output of the comparator CP1 is inverted, and thus adjusts the phase of the clock signal CLK4. Thus, the tester control section 12 notices one driver included in each group, fixes the phase of the strobe signal STB1 input to the comparator CP1, thereby varies the phase of a clock signal input to each driver, searches a position at which the level of an output of the comparator CP1 is inverted, and thus adjusts the phase of each clock signal.

Thus, the phase of a clock signal is adjusted on the basis of the common strobe signal STB1 every group. It is not always necessary to start the phase adjustment of a clock signal with the group 1 but it is allowed to start the phase adjustment with any group.

Thus, when adjustment of a clock signal input to an in-group common driver included in each group on the basis of the strobe signal STB1 input to the common comparator CP1 by using one calibration board 250A is completed, the other calibration board 250B is set (step 302). The calibration boards 250A and 250B may be set in steps 300 and 302 manually or by using an exclusive robot in order to automate working.

Then, the tester control section 12 adjusts the phase of each strobe signal on the basis of a clock signal whose phase adjustment is completed every group of the calibration board 250B (step 303).

Figure 34:
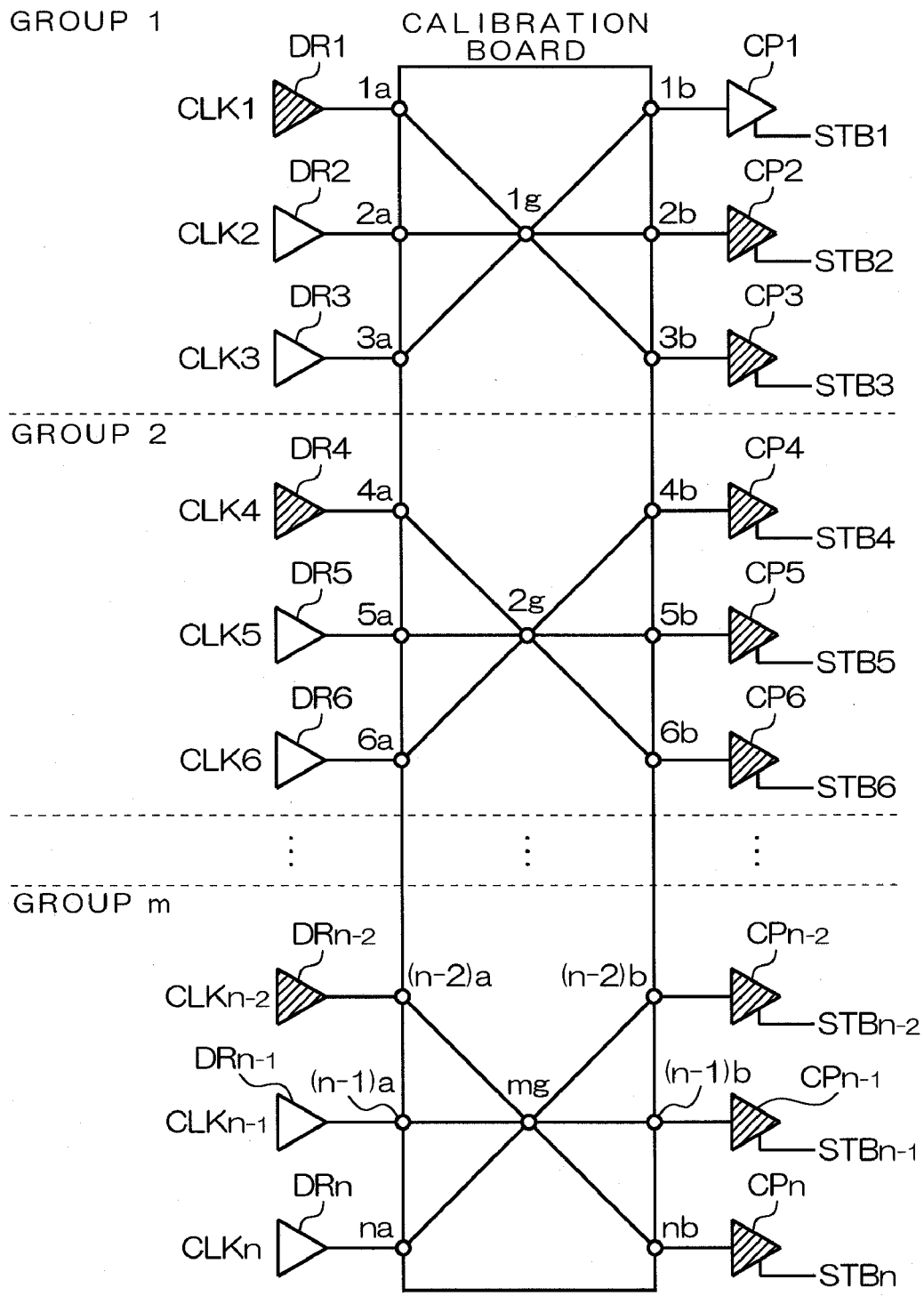
FIG. 34 is an illustration showing drivers and comparators to or from which signals are input or output correspondingly to step 303 shown in FIG. 31.

FIG. 34 is an illustration showing drivers and comparators to or from which signals are input or output correspondingly to step 303. As shown in FIG. 34, operations of the driver DR1 to which the clock signal CLK1 is input become valid and operations of two comparators CP2 and CP3 to which signals output from the driver DR1 are input via the short connection point 1g become valid in the group 1. Moreover, in the group 2, operations of the driver DR4 to which the clock signal CLK4 is input become valid and operations of three comparators CP4 to CP6 to which signals output from the driver DR4 are input via a short connection point 2g. Because cases of other groups are basically the same as the case of the group 2, detailed description is omitted.

Figure 35:
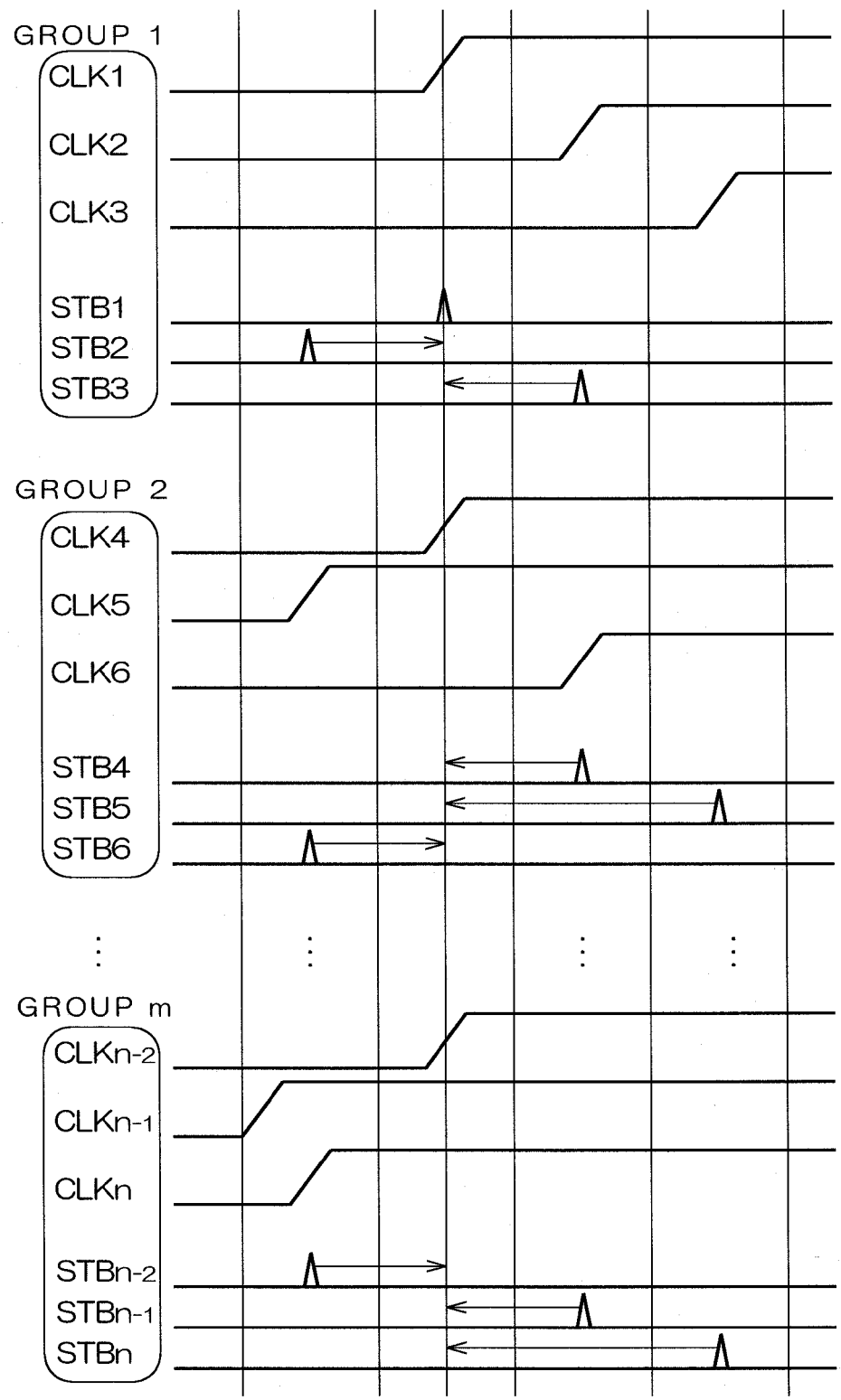
FIG. 35 is an illustration showing the outline of the strobe signal phase adjustment to be executed in step 303 shown in FIG. 31.

FIG. 35 is an illustration showing the outline of the strobe signal phase adjustment to be executed in step 303. First, the tester control section 12 notices the group 1, fixes the phase of the clock signal CLK1 input to the driver DR1, that is, fixes rise timings of signals input to two comparators CP2 and CP3 via the short connection point 1g, thereby varies phases of the strobe signals STB2 and STB3, searches positions at which levels of outputs of the comparators CP2 and CP3 are inverted, and thus adjusts phases of the strobe signals STB2 and STB3 on the basis of the clock signal CLK1. Then, the tester control section 12 notices the group 2, fixes the phase of the clock signal CLK4 input to the driver DR4, that is, fixes rise timings of signals input to three comparators CP4 to CP6 via the short connection point 2g, thereby varies phases of the strobe signals STB4 to STB6, searches positions at which levels of outputs of the comparators CP4 to CP6 are inverted, and thus adjusts phases of the strobe signals STB4 to STB6 on the basis of the clock signal CLK4. For groups 3 to m, the tester control section 12 fixes the phase of one clock signal whose phase adjustment is completed for each group, thereby varies the phase of a strobe signal, searches positions at which levels of outputs of three comparators, and thus adjusts the phase of each strobe signal on the basis of one clock signal.

Thus, phases of strobe signals are adjusted every group. It is not always necessary to start phase adjustment of strobe signals with the group 1. It is allowed to start the phase adjustment with any group or in parallel for groups.

Then, the tester control section 12 adjusts the phase of each clock signal on the basis of any strobe signal every group (step 304).

Figure 36:
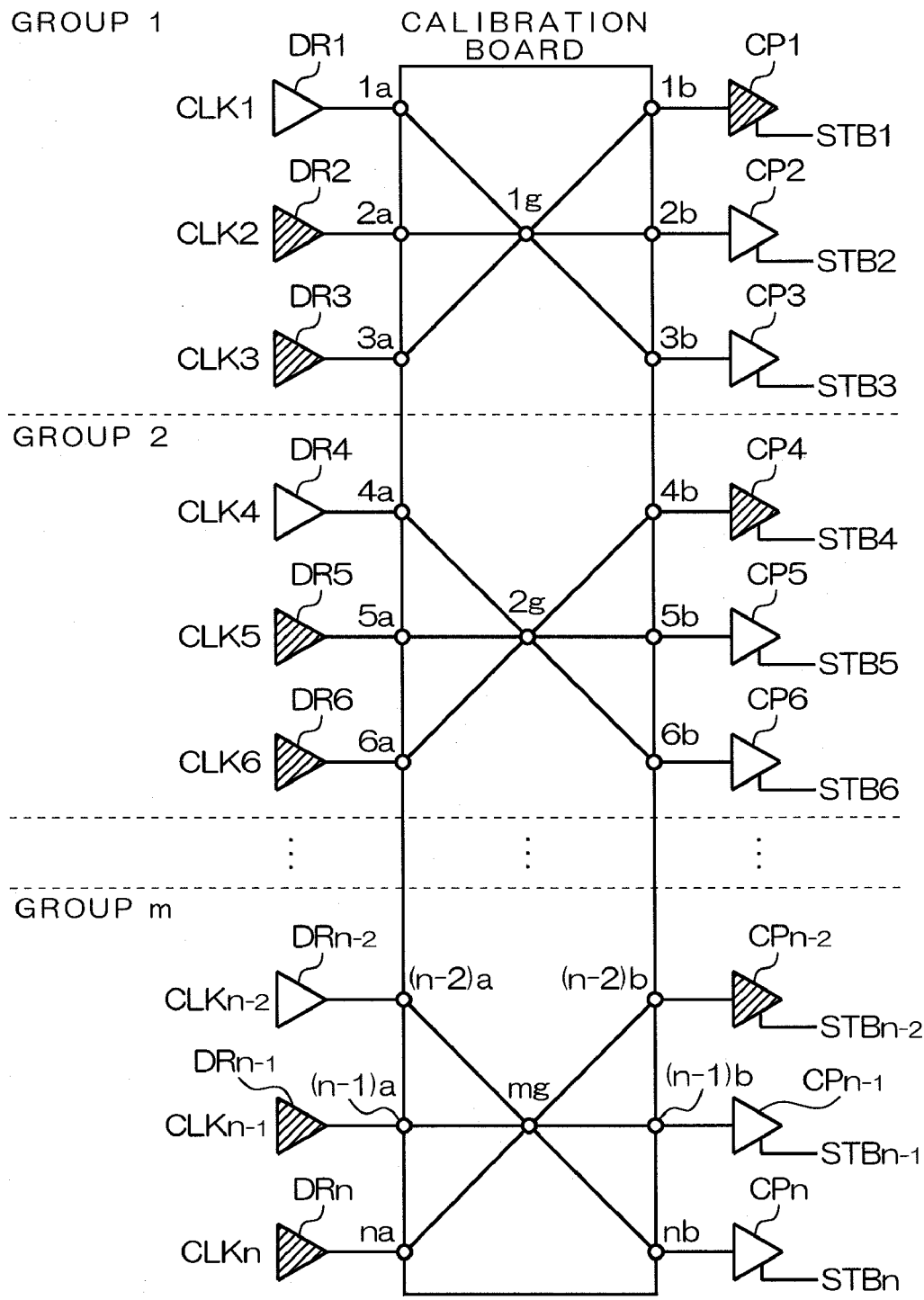
FIG. 36 is an illustration showing drivers and comparators to or from which signals are input or output correspondingly to step 304 shown in FIG. 31.

FIG. 36 is an illustration showing drivers and comparators to or from which signals are input or output correspondingly to step 304. As shown in FIG. 36, for example, in the group 1, operations of the drivers DR2 and DR3 to which two clock signals CLK2 and CLK3 whose phase adjustment is not completed are input become valid and operations of the comparator CP1 to which signals output from the drivers DR2 and DR3 are input via the short connection point 1g become valid. Because the same is applied to other groups, detailed description is omitted.

Figure 37:
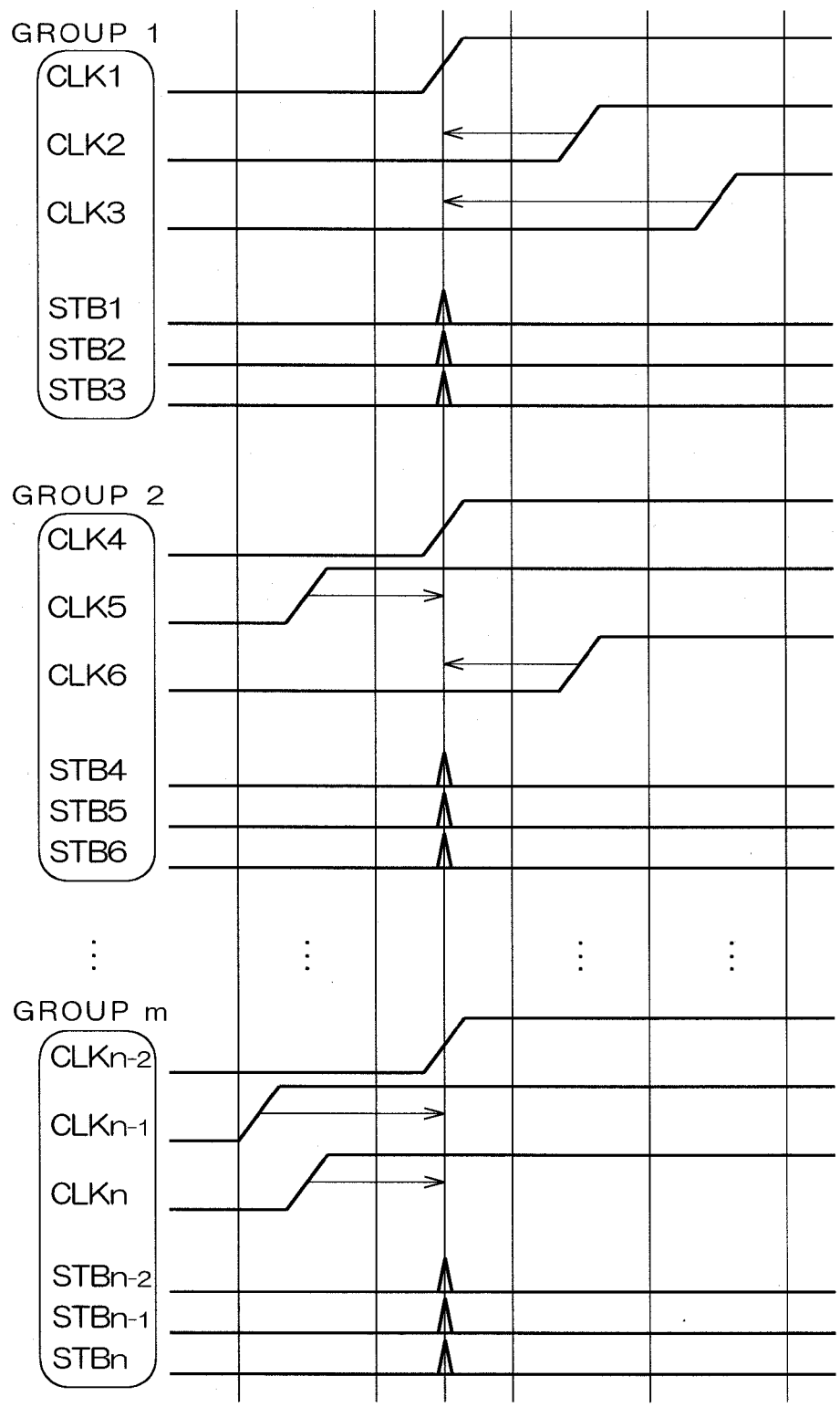
FIG. 37 is an illustration showing the outline of the clock signal phase adjustment to be executed in step 304 shown in FIG. 31.

FIG. 37 is an illustration showing the outline of the clock signal phase adjustment to be executed in step 304. First, the tester control section 12 notices the group 1, fixes the phase of the strobe signal STB1 input to the comparator CP1, that is, fixes the timing of the comparison performed by the comparator CP1, and thereby adjusts the phase of the clock signal CLK2 so that the rise timing of a signal output from the driver DR2 coincides with the comparison timing of the comparator CP1. When the phase adjustment corresponding to the driver DR2 is completed, the phase of the clock signal CLK3 is also performed for the driver DR3. Then, the tester control section 12 notices the group 2, fixes the phase of the strobe signal STB4 input to the comparator CP4, that is, fixes the timing of the comparison performed by the comparator CP4, and thereby adjusts the phase of the clock signal CLK5 so that the rise timing of a signal output from the driver DR5 coincides with the comparison timing of the comparator CP4. When the phase adjustment corresponding to the driver DR5 is completed, the phase of the clock signal CLK6 is also adjusted for the driver DR6. Thus, the tester control section 12 notices each group, fixes the phase of a strobe signal input to any comparator, varies the phase of a clock signal input to each driver, makes rise timings of outputs of two drivers whose phase adjustment is not completed coincide with the timing at which comparison is performed by the comparator, and thereby adjusts the phase of each clock signal.

In the above description, the comparator Cp1 is used as a common comparator in the group 1. However, it is allowed to use any one of other comparators CP2 and CP3 as a common comparator. The same is applied to other groups.

Thus, a series of calibrations for adjusting phases of all clock signals and strobe signals is completed.

As described above, in the case of the semiconductor test instrument of this embodiment, the phase of a clock signal input to an in-group common driver in each group is first adjusted on the basis of the strobe signal STB1 input to the common comparator CP1 by using one calibration board 250A. Then, by using the other calibration board 250B, the phase of each strobe signal is adjusted on the basis of the clock signal whose phase adjustment is completed every group and thereafter, phases of remaining clock signals whose phase adjustments is not completed are adjusted on the basis of any strobe signal whose phase adjustment is completed. Therefore, in the case of the calibration of the semiconductor test instrument of this embodiment, it is not necessary to contact a probe every device socket end but it is only necessary to set the calibration boards 250A and 250B. Therefore, the working contents necessary for calibration are simplified. Moreover, a special configuration such as a separate reference driver/comparator section or an exclusive robot for repeating contact and movement of a probe is unnecessary for calibration and thus, it is possible to greatly reduce the cost. Moreover, because only setting of the calibration boards 250A and 250B is the working followed by mechanical movement before calibration is completed, it is possible to greatly shorten the working time compared to the conventional case of repeating movement and contact of a probe by the number of device socket ends.

[Sixth Embodiment]

The above fifth embodiment uses the calibration board 250A in which m drivers DR1, DR4, . . . , and DRn-2 included in each group and one comparator CP1 are connected to the short connection point e. Instead, however, it is also allowed to use a calibration board 250c in which one driver (common driver) DR1 and m comparators (in-group common comparators) CP1, CP4 . . . , and CPn-2 included in each group are connected to the short connection point e as shown in FIG. 38.

Figure 38:
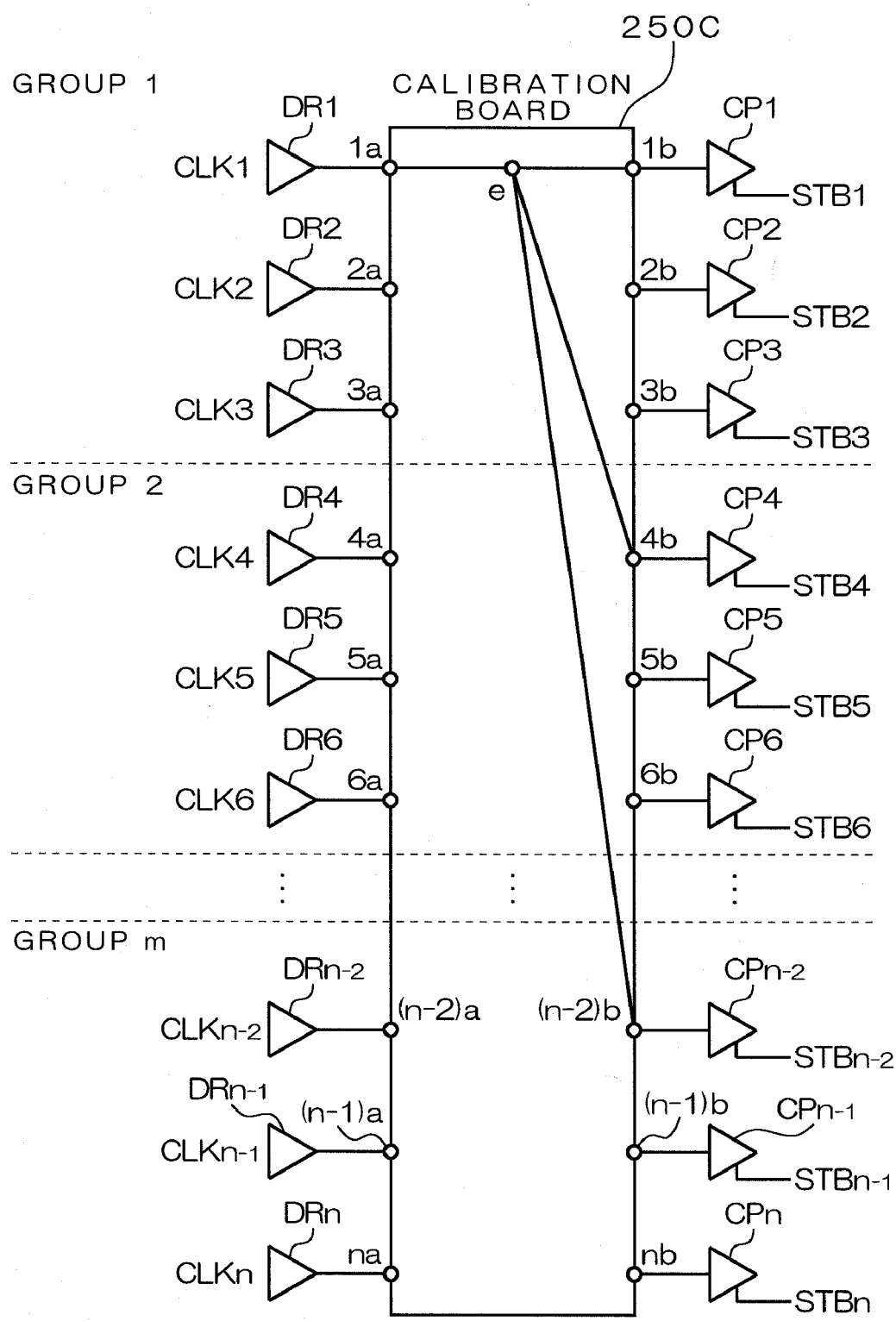
FIG. 38 is an illustration showing a configuration of one calibration board of a sixth embodiment.
Figure 39:
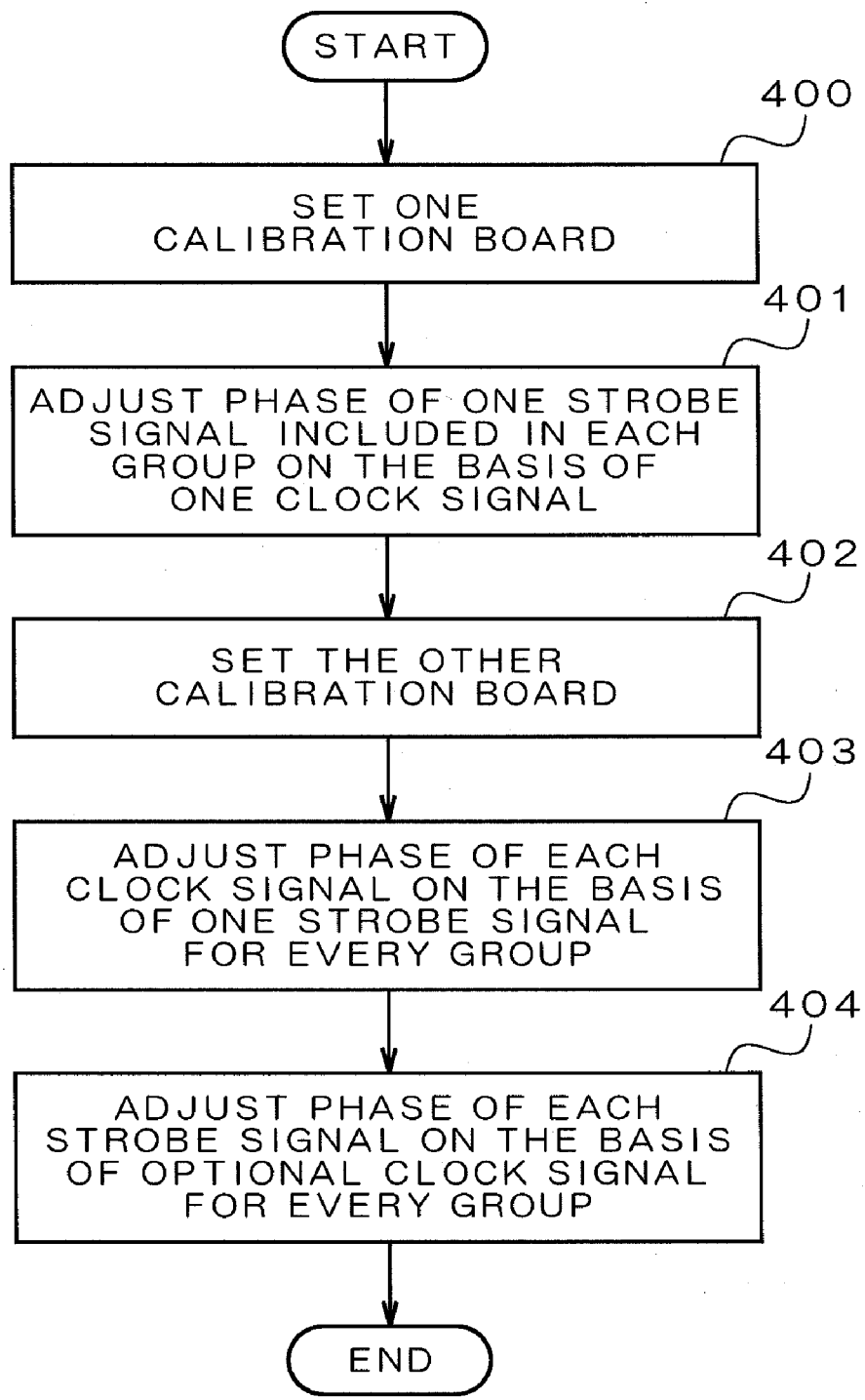
FIG. 39 is a flow chart showing a calibration procedure of the sixth embodiment.

FIG. 39 is a flowchart showing a calibration procedure of this embodiment performed by combining the calibration board 250C shown in FIG. 38 with the calibration board 250B shown in FIG. 30. After one calibration board 250C is set to a performance board 30 (step 400), the tester control section 12 adjusts phases of the strobe signals STB1, TB4, . . . , and STBn-2 corresponding to the comparators CP1, CP4, . . . , and CPn-2 included in each group on the basis of the phase of the clock signal CLK1 corresponding to the driver DR1 of the calibration board 250C (step 401).

As described above, when adjustments of phases of strobe signals input to one in-group common comparator included in each group on the basis of the clock signal CLK1 input to the common driver DR1 every group by using one calibration board 250C are completed, the other calibration board 250B is set (step 402).

Then, the tester control section 12 adjusts the phase of each clock signal on the basis of a strobe signal whose phase adjustment is completed every group of the calibration board 250B (step 403). Moreover, the tester control section 12 adjusts the phase of each strobe signal on the basis of any clock signal every group (step 404). Thus, a series of calibrations for adjusting phases of all clock signals and strobe signals is completed.

[Seventh Embodiment]

In the case of the above fifth and sixth embodiments, calibration is performed by using two types of calibration boards in order. However, it is also allowed to use one type of a calibration board having functions of these two types of calibration boards so as to save labor for exchange.

Figure 40:
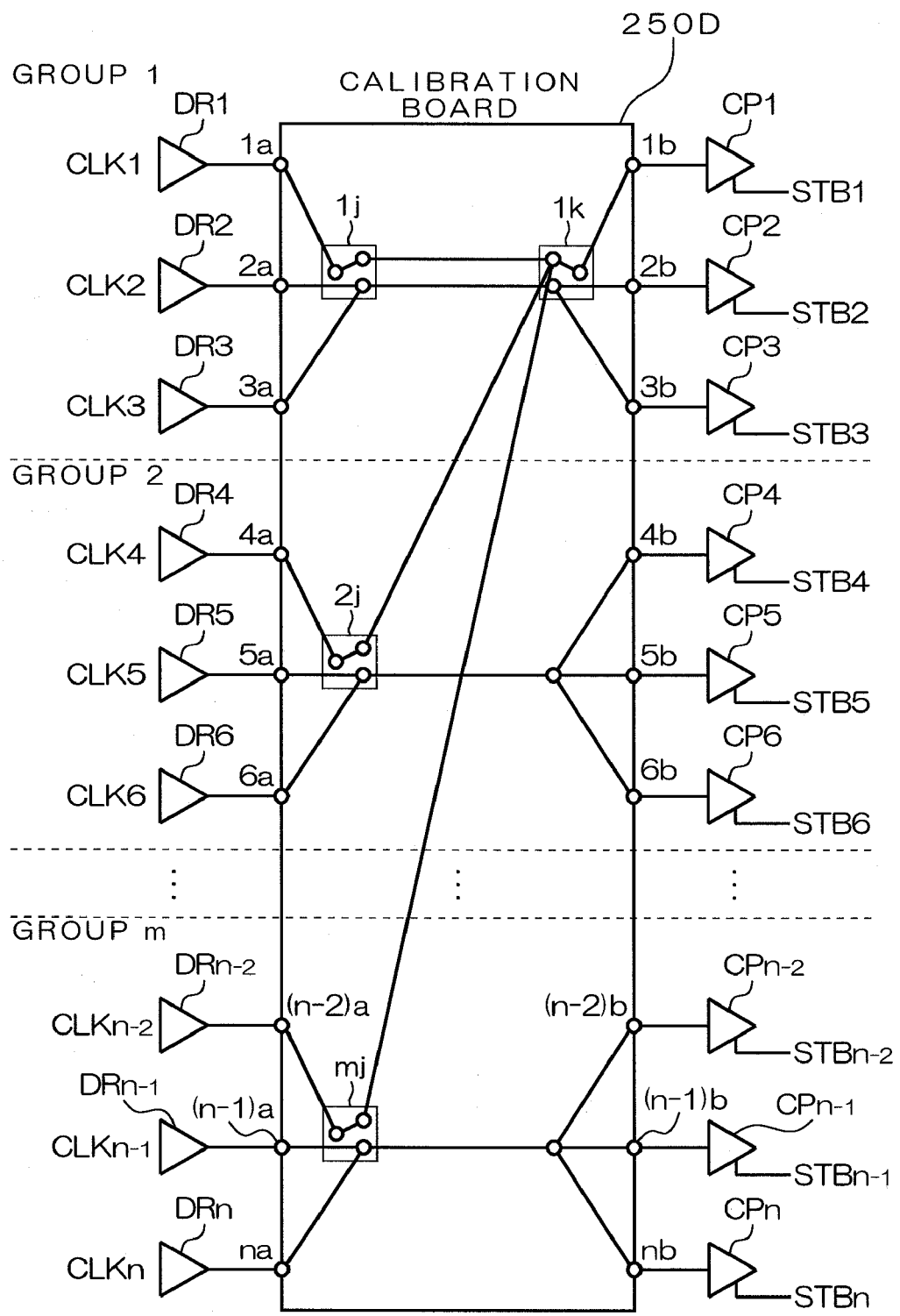
FIG. 40 is an illustration showing a configuration of a calibration board of a seventh embodiment having functions of two types of calibration boards different from each other in wiring contents.
Figure 41:
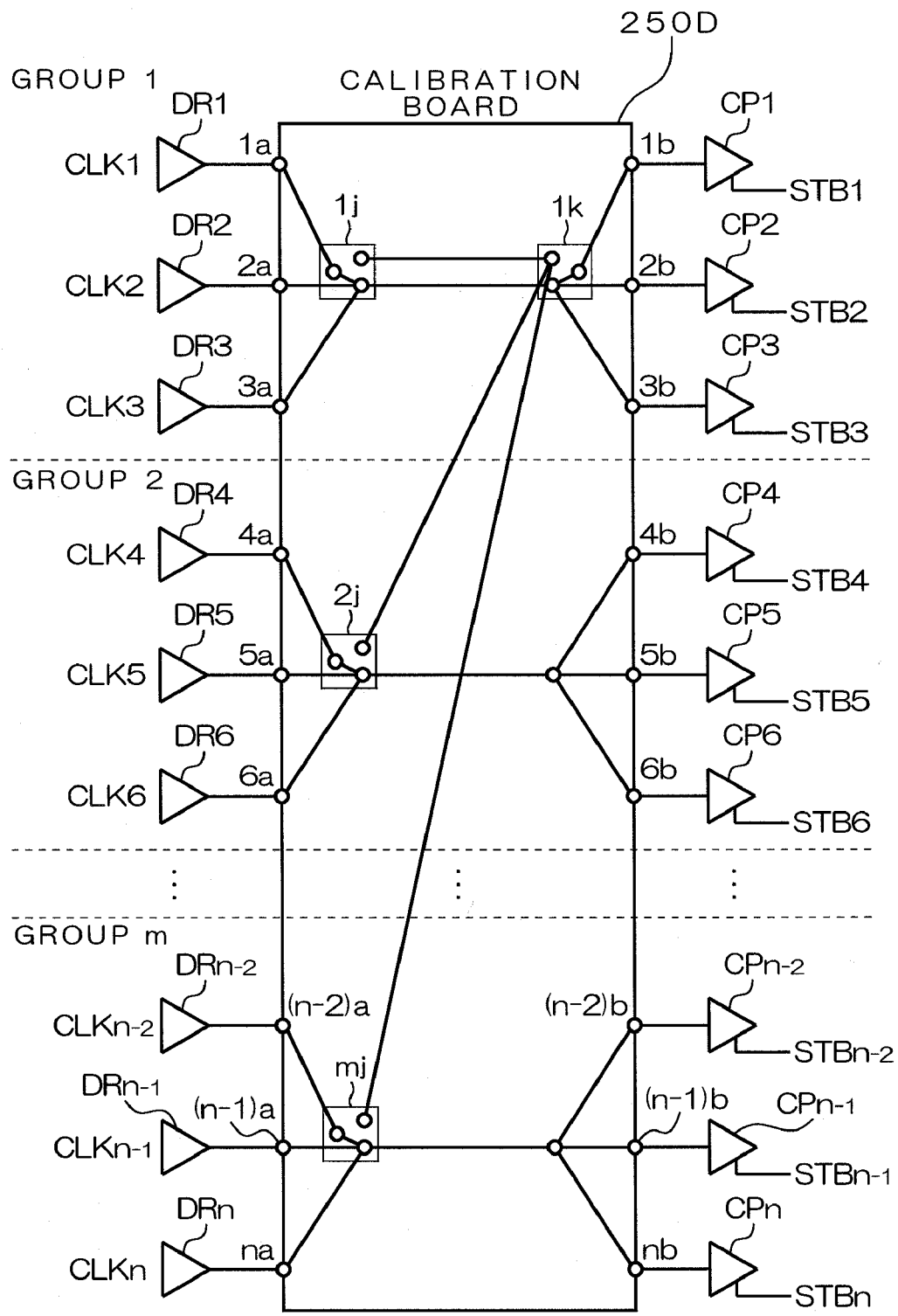
FIG. 41 is an illustration showing a configuration of a calibration board of the seventh embodiment having functions of two types of calibration boards different from each other in wiring contents.

FIGS. 40 and 41 are illustrations showing a configuration of a calibration board 250D of a seventh embodiment having functions of two types of calibration boards 250A and 250B different from each other in wiring contents. The calibration board 250D shown in FIGS. 40 and 41 has two changeover switches correspondingly to the group 1 and one changeover switch correspondingly to each group other than the group 1.

Specifically, a changeover switch 1j connected to each of output ends of three drivers DR1 to DR3 and a changeover switch 1k connected to each of input ends of three comparators CP1 to CP3 are set so as to correspond to the group 1. Moreover, a changeover switch 2j connected to each of output ends of three drivers DR4 to DR6 is set so as to correspond to the group 2. Furthermore, changeover switches are set to each of output ends of three drivers so as to correspond to each of other groups. By changing over connection states of the changeover switches 1j to mj and 1k, it is possible to selectively realize the connection state (FIG. 40) same as the case of one calibration board 250A shown in FIG. 29 and the connection state (FIG. 41) same as the case of the other calibration board 250B shown in FIG. 30. Therefore, by using the calibration board 250D and thereby changing over each changeover switch to perform calibration, exchange of calibration boards is unnecessary and it is possible to further simplify the working contents, reduce the cost, and shorten the working time.

FIGS. 42 and 43 are illustrations showing a configuration of a calibration board 250E of a modification of this embodiment having functions of two types of calibration boards 250C and 250B different from each other in wiring contents. The calibration board 250E shown in FIGS. 42 and 43 has two changeover switches correspondingly to the group 1 and one changeover switch correspondingly to each group other than the group 1.

Specifically, a changeover switch 1j connected to each of output ends of three drivers DR1 to DR3 and a changeover switch 1k connected to each of input ends of three comparators CP1 to CP3 are set so as to correspond to the group 1. Moreover, a changeover switch 2k connected to each of input ends of three comparators CP4 to CP6 is set so as to correspond to the group 2. Similarly, changeover switches are set to each of input ends of three comparators so as to correspond to each of other groups. By changing over connection states of the changeover switches 1j and 1k to mk set to the calibration board 250E, it is possible to selectively realize the connection state (FIG. 42) same as the case of one calibration board 250C shown in FIG. 38 and the connection state (FIG. 43) same as the case of the other calibration board 250B shown n FIG. 30. Therefore, by using the calibration board 250E and thereby changing over changeover switches to perform calibration, exchange of calibration boards is unnecessary and it is possible to further simplify the working contents, reduce the cost, and shorten the working time.

[Eighth Embodiment]

Then, a method for calibrating a semiconductor test instrument of an eighth embodiment using another calibration board is described below.

FIGS. 44 to 48 are illustrations showing wiring states of calibration boards used for the calibration method of this embodiment. Lengths of wirings for connecting short connection points 1p and 1q and the like with terminals 1a and 1b and the like shown in FIGS. 44 to 48 are set so that they are set so as to be all equalized.

Figure 44:
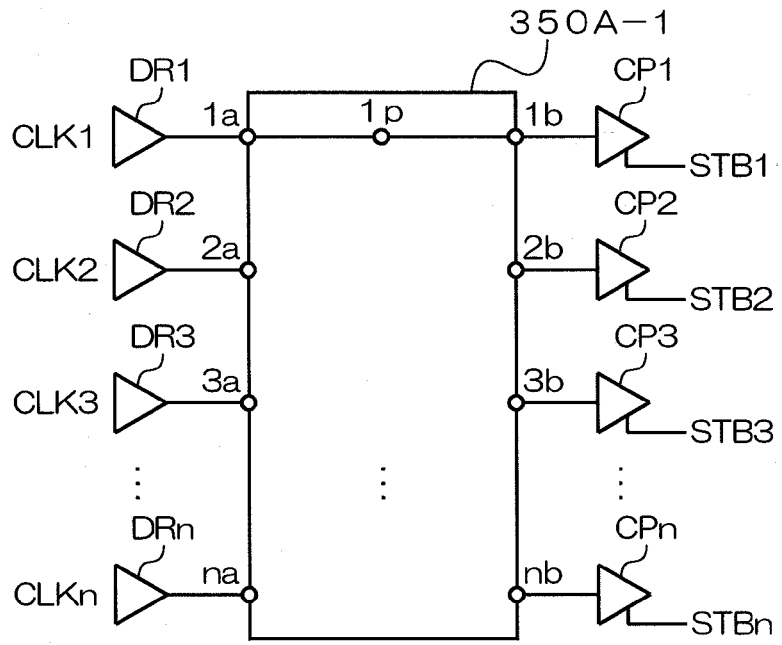
FIG. 44 is an illustration showing a wiring state of a calibration board used for a calibration method of an eighth embodiment.

FIG. 44 is an illustration showing a wiring state of one calibration board 350A-1 of this embodiment. In the case of the calibration board 350A-1, only a terminal 1a among n terminals 1a to na connected with n drivers DR1 to DRn respectively is connected to the short connection point 1p. Moreover, only a terminal 1b among n terminals 1b to nb connected with n comparators CP1 to CPn is connected to the above short connection point 1p. That is, by using the calibration board 350A-1, a signal output from the driver DR1 is input to the comparator CP1 via the short connection point 1p.

Figure 45:
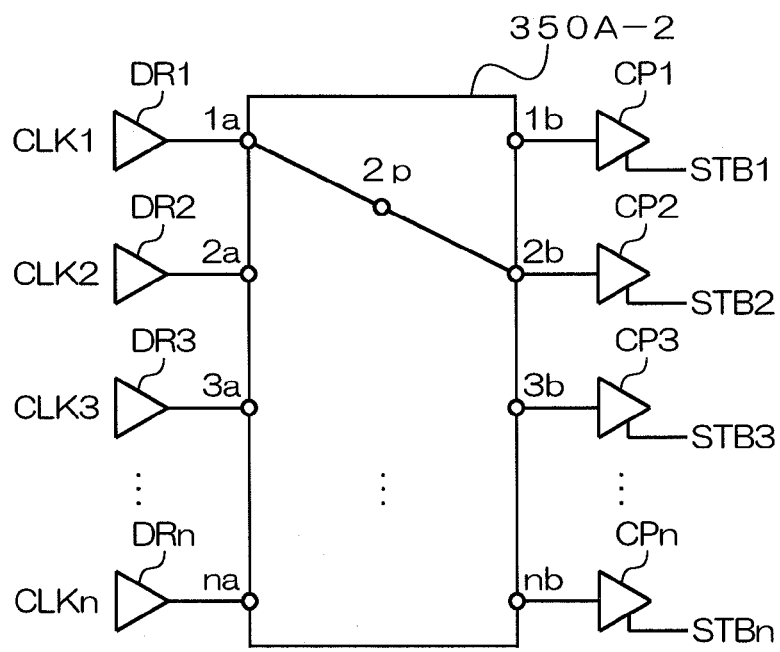
FIG. 45 is an illustration showing a wiring state of a calibration board used for the calibration method of the eighth embodiment.

FIG. 45 is an illustration showing a wiring state of another calibration board 350A-2. In the case of the calibration board 350A-2, only a terminal 1a among n terminals 1a to na connected to n drivers DR1 to DRn respectively is connected to a short connection point 2p. Moreover, only a terminal 2b among n terminals 1b to nb connected with n comparators CP1 to CPn respectively is connected to the above short connection point 2p. That is, by using the calibration board 350A-2, a signal output from the driver DR1 is input to the comparator CP2 via the short connection point 2p.

Figure 46:
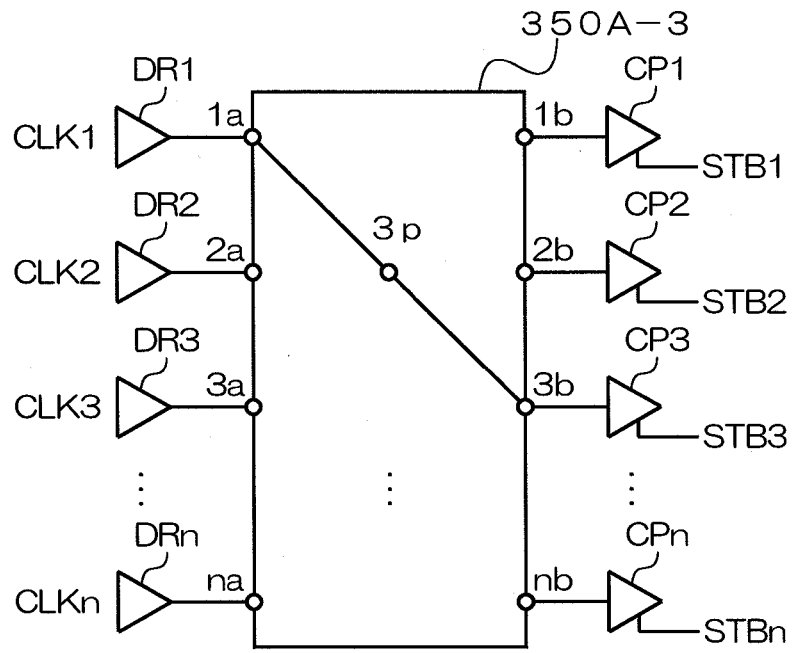
FIG. 46 is an illustration showing a wiring state of a calibration board used for the calibration method of the eighth embodiment.

FIG. 46 is an illustration showing a wiring state of another calibration board 350A-3 of this embodiment. In the case of the calibration board 350A-3, only a terminal 1a among n terminals 1a to na connected with n drivers DR1 to DRn respectively is connected to a short connection point 3p. Moreover, only a terminal 3b among n terminals 1b to nb connected with n comparators CP1 to CPn respectively is connected to the above short connection point 3p. That is, by using the calibration board 350A-3, a signal output from the driver DR1 is input to another comparator CP3 via the short connection point 3p.

Figure 47:
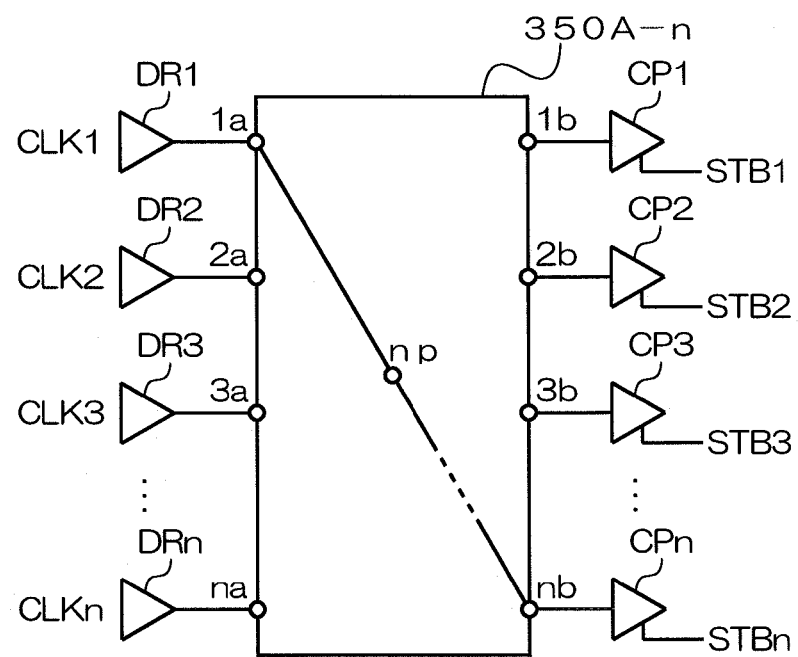
FIG. 47 is an illustration showing a wiring state of a calibration board used for the calibration method of the eighth embodiment.

FIG. 47 is an illustration showing a wiring state of another calibration board 350A-n of this embodiment. In the case of the calibration board 350A-n, only a terminal 1a among n terminals 1a to na connected with n drivers DR1 to DRn respectively is connected to a short connection point np. Moreover, only a terminal nb among n terminals 1b to nb connected with n comparators CP1 to CPn respectively is connected to the above short connection point np. That is, by using the calibration board 350A-n, a signal output from the driver DR1 is input to the comparator CPn via the short connection point np.

This embodiment uses n calibration boards 350A-1 to 350A-n in order to connect any one of n comparators CP1 to CPn with the driver DR1 through a short connection point.

Figure 48:
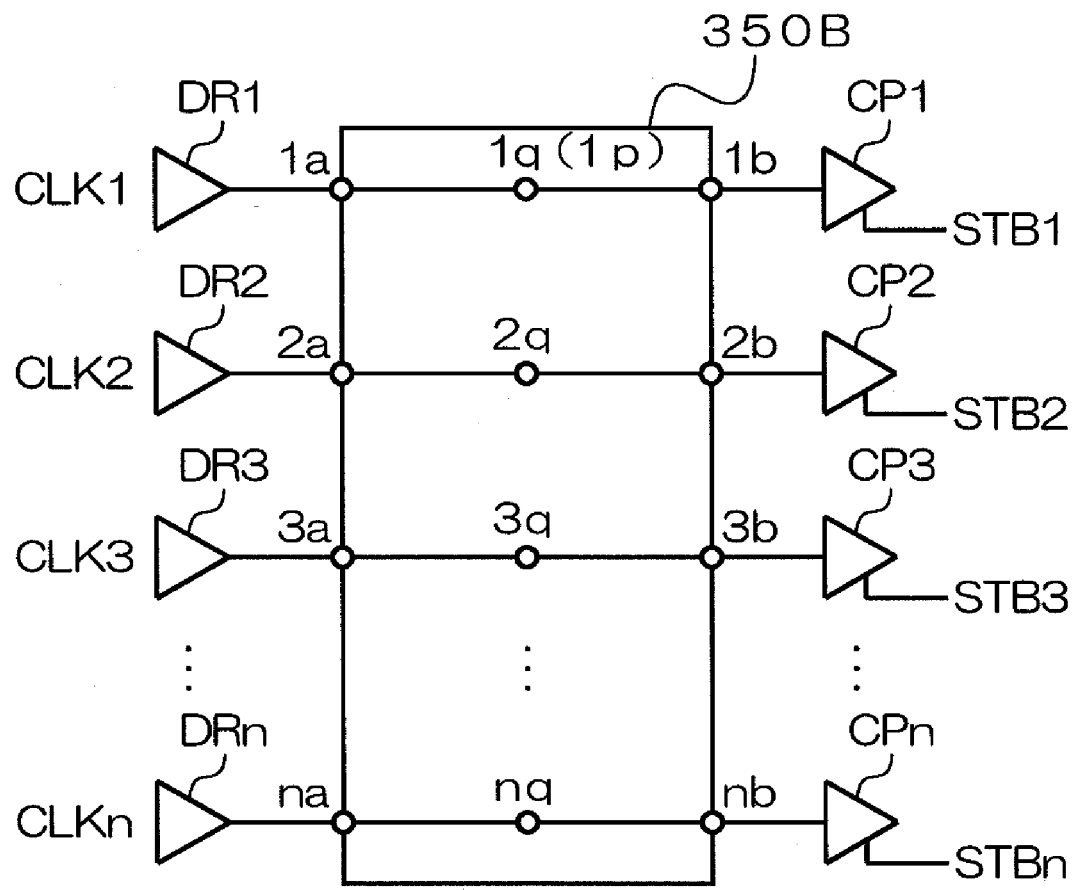
FIG. 48 is an illustration showing a wiring state of a calibration board used for the calibration method of the eighth embodiment.

Moreover, FIG. 48 is an illustration showing a wring state of another calibration board 350B of this embodiment. In the case of the calibration board 350B, n terminals 1a to na connected with n drivers DR1 to DRn are connected to short connection points 1q to nq in one-to-one correspondence. Moreover, these short connection points 1q to nq are also connected to n comparators CP1 to CPn respectively. Thereby, signals output from the drivers DR1 to DRn are input to the comparators CP1 to CPn via respectively corresponding separate short connection points 1q to nq.

Figure 49:
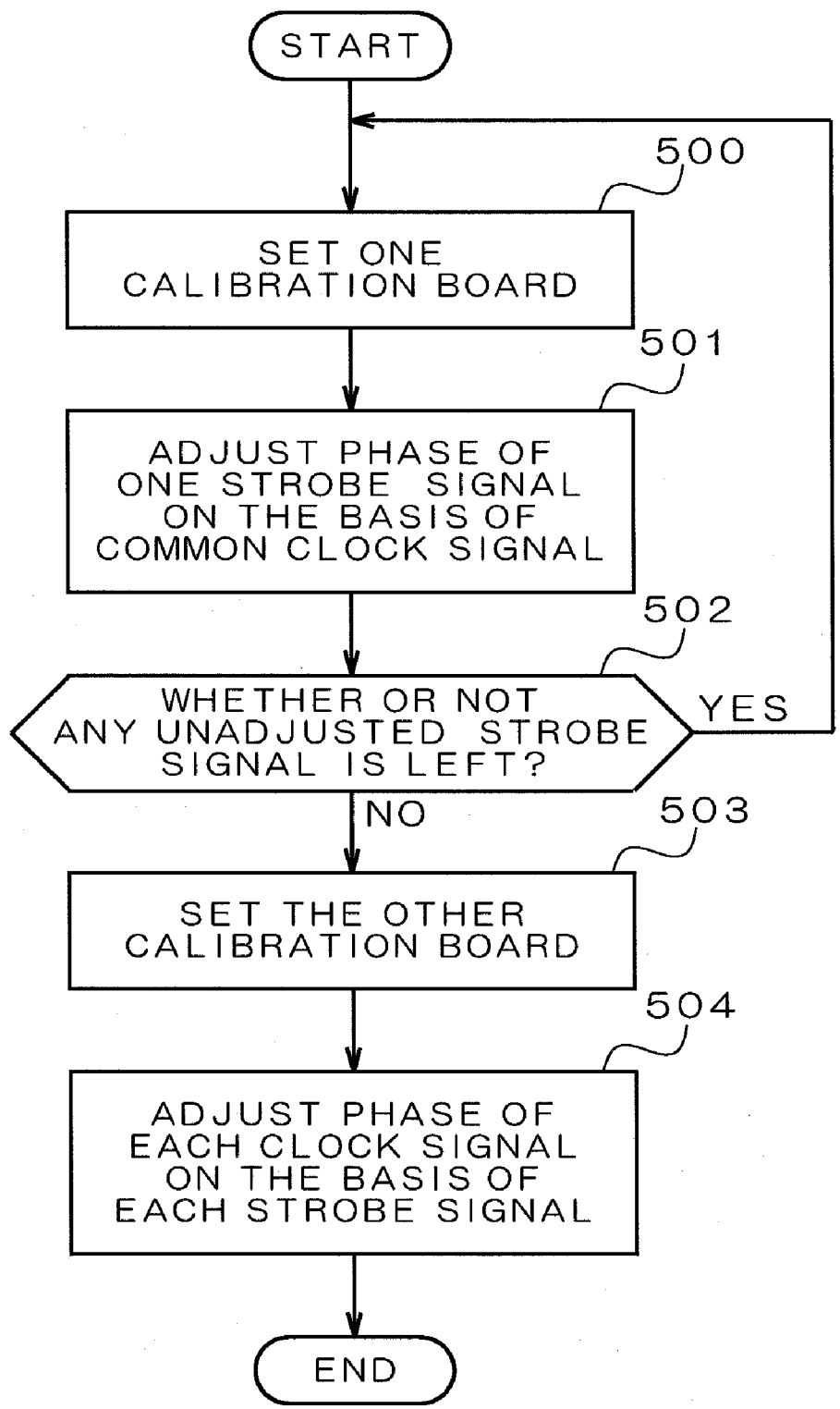
FIG. 49 is a flow chart showing a calibration procedure of the eighth embodiment.

FIG. 49 is a flowchart showing a calibration procedure of this embodiment. After one calibration board (e.g. calibration board 350A-1) is set to the performance board 30 (step 500), the tester control section 12 adjusts the phase of the strobe signal STB1 corresponding to the comparator CP1 of the calibration board 350A-1 connected with the driver DR1 through the short connection point 1p on the basis of the clock signal CLK1 corresponding to the driver DR1 (step 501).

In this step 501, the phase of the strobe signal STB1 is adjusted by varying the phase of the strobe signal STB1 and searching a position at which the level of an output of the comparator CP1 is inverted while fixing the phase of the clock signal CLK1 input to the driver DR1, that is, while fixing the rise timing of a signal input to the comparator CP1 via the short connection point 1p.

Then, the tester control section 12 determines whether any unadjusted strobe signal is left (step 502). When any unadjusted strobe signal is left, step 501 is restarted to repeat operations from the operation for setting the next calibration board (e.g. calibration board 350A-2) downward. Thus, by using the calibration boards 350A-1 to 350A-n shown in FIGS. 44 to 47, phases of strobe signals STB1 to STBn input to n comparators CP1 to CPn respectively are adjusted on the basis of the clock signal CLK1 input to the driver DR1.

Thus, when adjustments of phases of all strobe signals are completed (negative determination in step 502), another calibration board 350B is set (step 503). The calibration boards 350A-1 to 350A-n and 350B may be set in steps 500 and 503 manually or by using an exclusive robot in order to automate the working.

Then, the tester control section 12 adjusts the phase of each clock signal on the basis of each strobe signal whose phase adjustment is completed by using the calibration board 350B (step 504). As described above, in the case of the calibration board 350B, the driver DR1 is connected to the comparator CP1 through the short connection point 1q. Therefore, it is possible to adjust the phase of the clock signal CLK1 on the basis of the strobe signal STB1. Moreover, because the driver DR2 is connected to the comparator CP2 through the short connection point 2q, itis possible to adjust the phase of the clock signal CLK2 on the basis of the strobe signal STB2. Furthermore, because the driver DRn is connected to the comparator CPn through the short connection point nq, it is possible to adjust the phase of the clock signal CLKn on the basis of the strobe signal STBn.

Thus, a series of calibrations for adjusting phases of all strobe signals and clock signals is completed.

In the case of this embodiment, phases of n strobe signals STB1 to STBn are first adjusted on the basis of the clock signal CLK1 and then, phases of n clock signals CLK1 to CLKn are adjusted on the basis of each strobe signal. However, it is also allowed to first adjust phases of n clock signals CLK1 to CLKn on the basis of one strobe signal and then adjust phases of n strobe signals STB1 to STBn on the basis of each clock signal.

Figure 50:
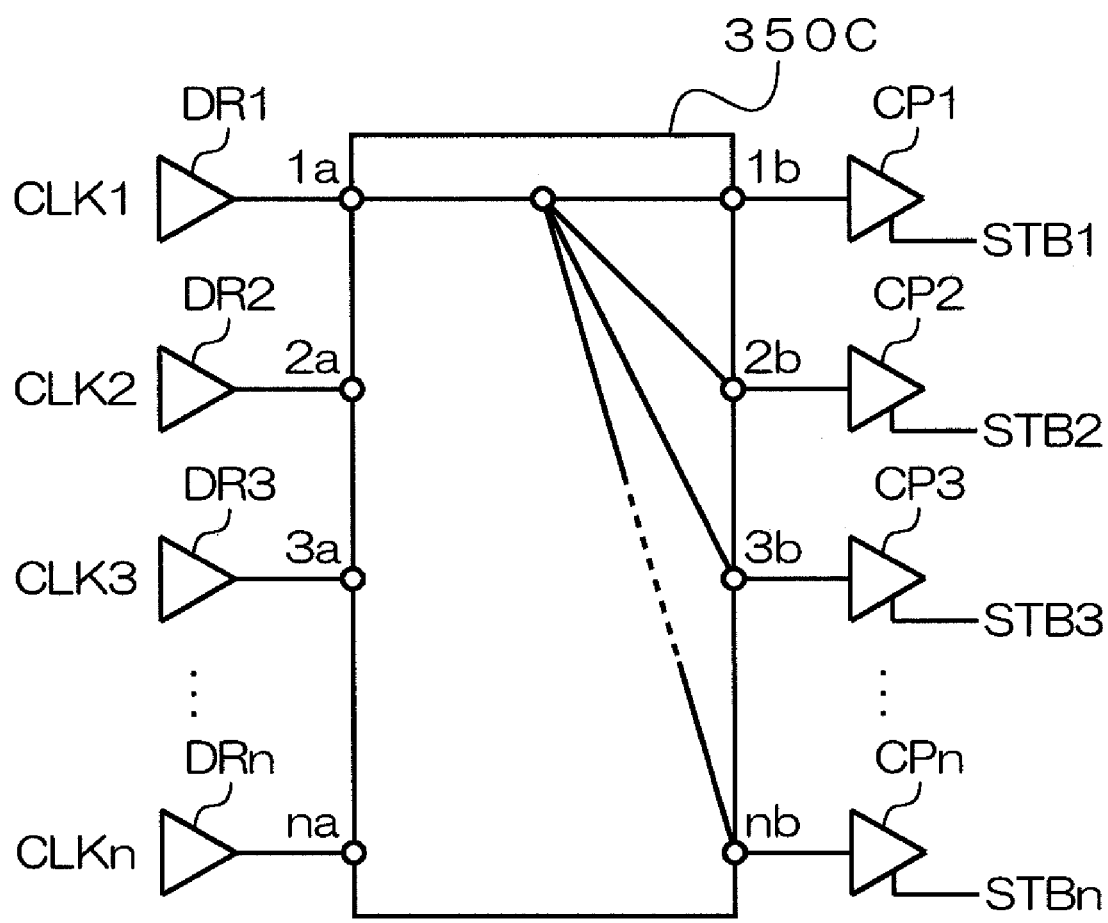
FIG. 50 is an illustration showing a modification of a calibration board of the eightht embodiment.

Moreover, in the case of this embodiment, n calibration boards 350A-1 to 350A-n are set in order to adjust phases of n strobe signals STB1 to STBn on the basis of the clock signal CLK1. However, as shown in FIG. 50, it is also allowed to adjust phases of the strobe signals STB1 to STBn by using a calibration board 350C in which n comparators CP1 to CPn are all connected to one short connection point.

Furthermore, though this embodiment uses the calibration board 250B in which each of the drivers DR1 to DRn corresponds one-to-one to each of the comparators CP1 to CPn, it is not always necessary that each of the drivers DR1 to DRn correspond to each of the comparators CP1 to CPn one-to-one.

[Ninth Embodiment]

The eighth embodiment, calibration performed by using n+1 calibration boards in order. However, it is also allowed to use one type of a calibration board having functions of these calibration boards so as to save labor.

Figure 51:
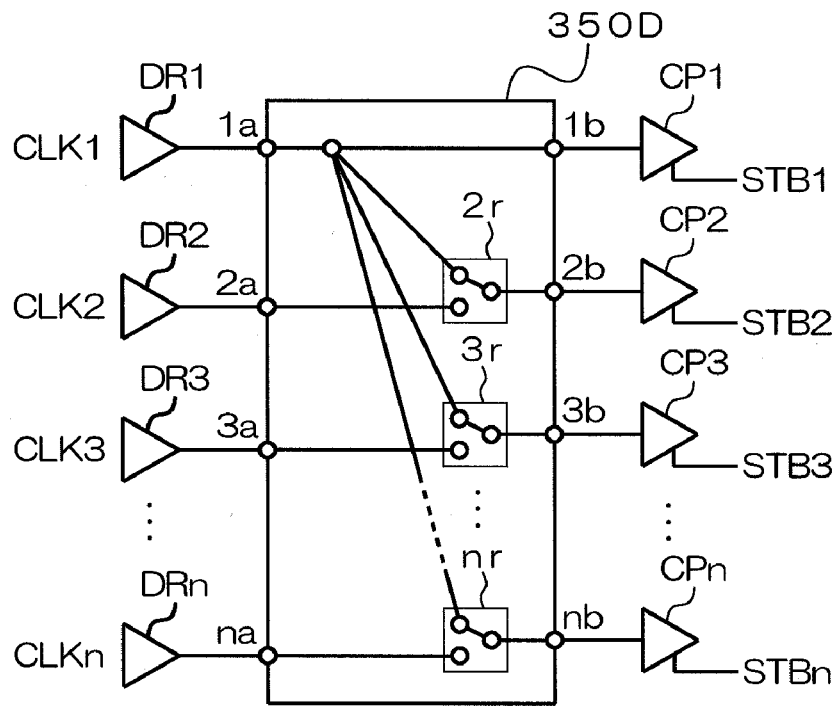
FIG. 51 is an illustration showing a configuration of a calibration board of a ninth embodiment having functions of n+1 types of calibration boards different from each other in wiring contents.

FIG. 51 is an illustration showing a configuration of a calibration board 350D of a ninth embodiment having functions of n+1 calibration boards 350A-1 to 350A-n and 350B.

The calibration board 350D shown in FIG. 51 has changeover switches 2r to nr corresponding to the comparators CP2 to CPn except the comparator CP1. By changing over connection states of these changeover switches 2r to nr, it is possible to selectively realize the connection state same as the case of each of calibration boards 350A-1 to 350A-n and the connection state same as the case of the calibration board 350B. Therefore, by using the calibration board 350D, the exchange of calibration boards is unnecessary and it is possible to further simplify the working contents, reduce the cost, and shorten the working time.

Figure 52:
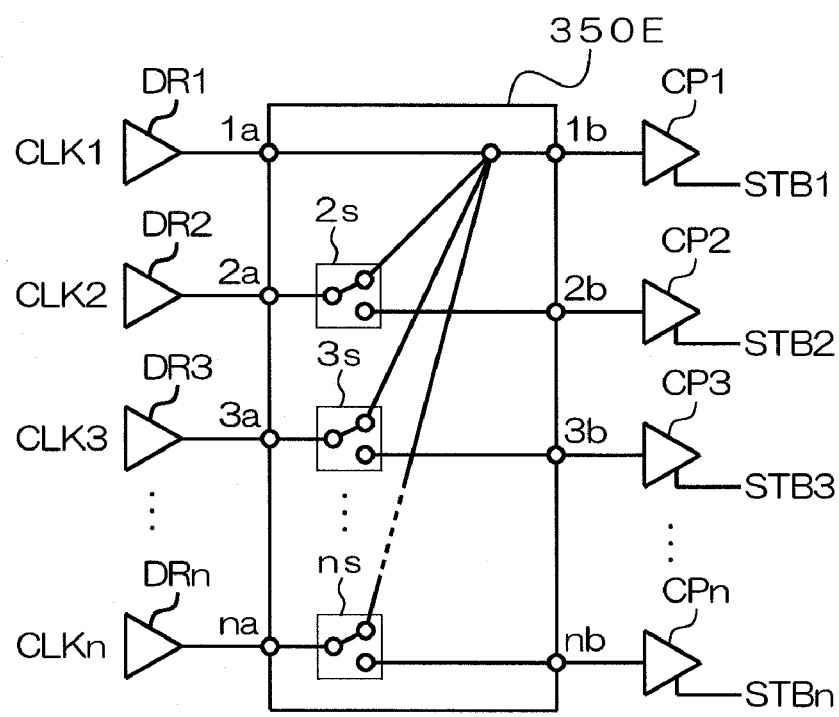
FIG. 52 is an illustration showing a modification of the calibration board shown in FIG. 51.

FIG. 52 is an illustration showing a modification of the calibration board 350D shown in FIG. 51. When first adjusting the phase of each clock signal on the basis of one strobe signal and then adjusting the phase of each strobe signal, it is allowed to change over connection states of switches 2s to ns by using the calibration board 350E shown in FIG. 52.

[Other Embodiments]

For each of the above embodiments, various calibration boards are set to the performance board 30. However, by considering an actual setting state, it is also allowed to mount a socket board and IC socket on the performance board 30 and moreover, set a calibration board on them.

Figure 53:
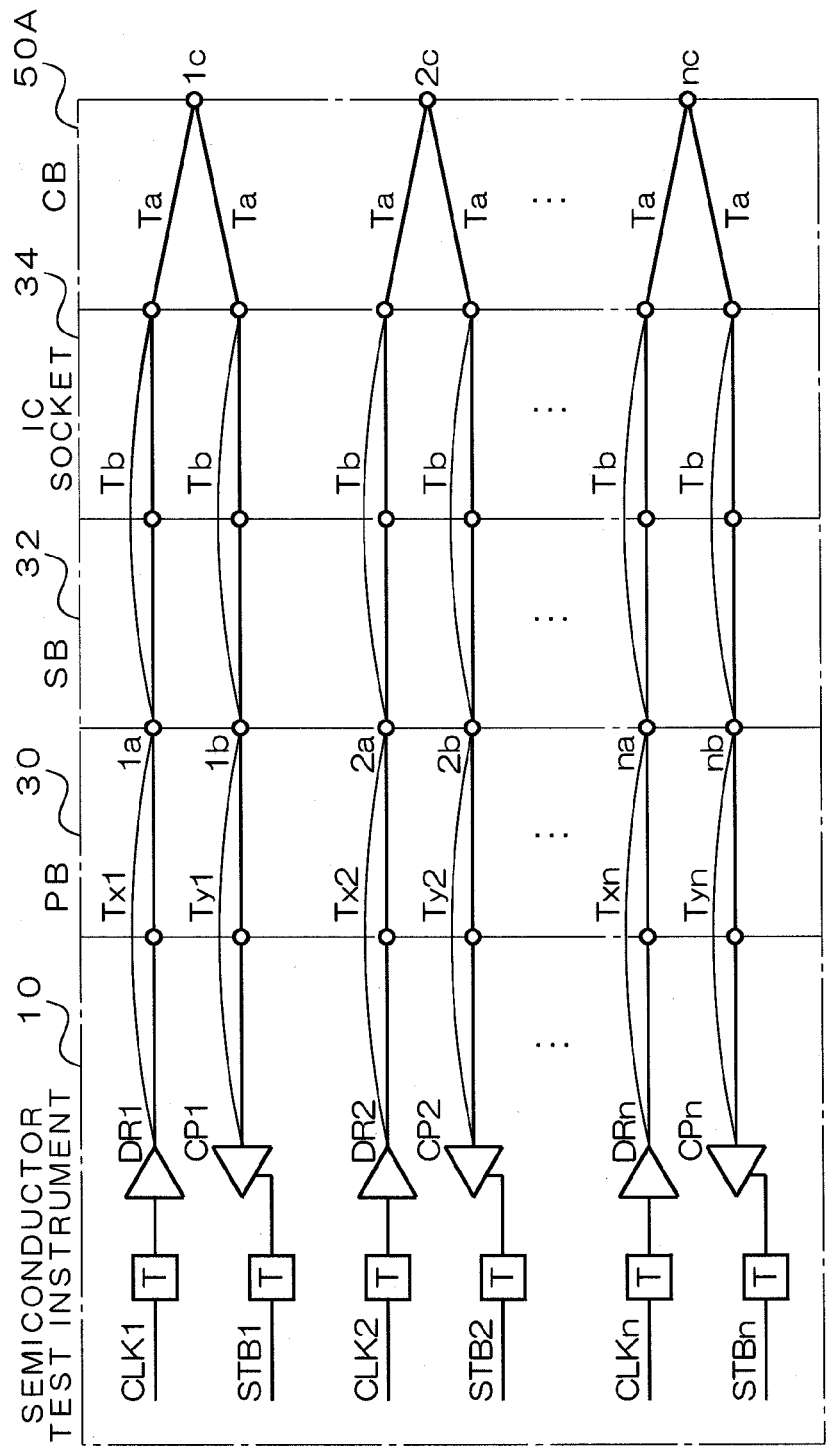
FIG. 53 is an illustration showing a modification in which the setting state of a calibration board is changed.

FIG. 53 is an illustration showing a modification in which the setting state of a calibration board is changed. In the case of the configuration shown in FIG. 53, a socket board (SB) 32 and an IC socket 34 are added between the performance board (PB) 30 and the calibration board (CB) 50A on the configuration shown in FIG. 5. That is, the calibration board 50A and the like are set while mounting the socket 32 and IC socket 34 used to actually apply various tests to a DUT. In this case, though the wiring length between the output end of each driver and each short connection point and the wiring length between each connection point and the input end of each comparator increase, it is possible to perform calibration in accordance with the procedure same as the case of each of the above embodiments.

Figure 54:
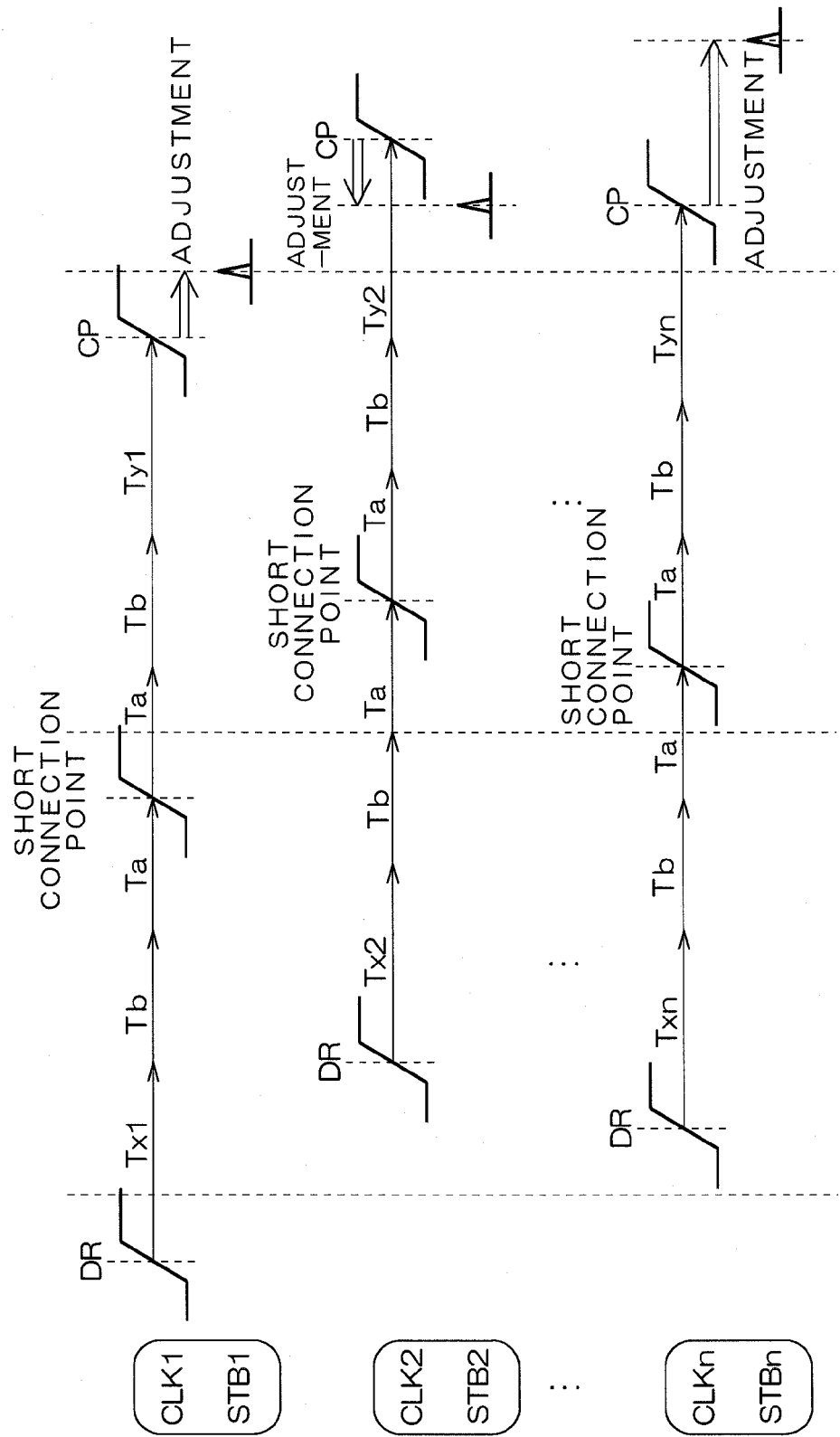
FIG. 54 is an illustration of the clock signal phase adjustment corresponding to the configuration shown in FIG. 53.

For example, when rewriting FIG. 7 by assuming the length of the wiring included in the socket board 32 and IC socket 34 as Tb, relations shown in FIG. 54 are obtained. The output timing of a signal by each driver and the input timing of a signal to each comparator shown in FIG. 54 are the same as the timings shown in FIG. 7. Therefore, it is found that timing calibration can be performed in accordance with the procedure same as the case of each embodiment while the socket board 32 and IC socket 34 are set.

Moreover, in the case of each of the above embodiments, timing calibration is performed by using various calibration boards. However, it is also allowed to use a calibration device or calibration wafer in the same wiring state instead of the above calibration boards.

Figure 55:
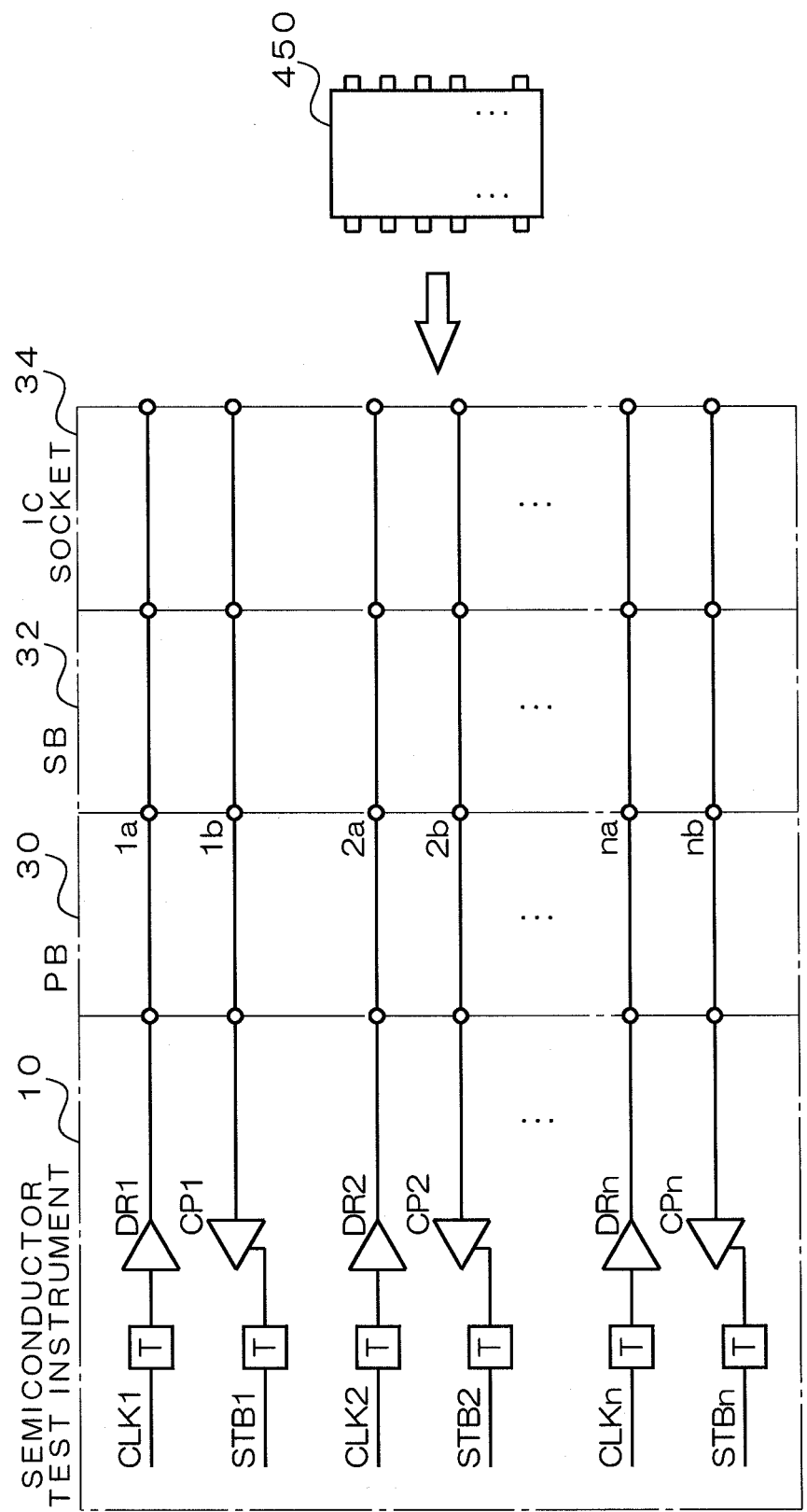
FIG. 55 is an illustration showing a connection state between a calibration device and a semiconductor test instrument.
Figure 56:
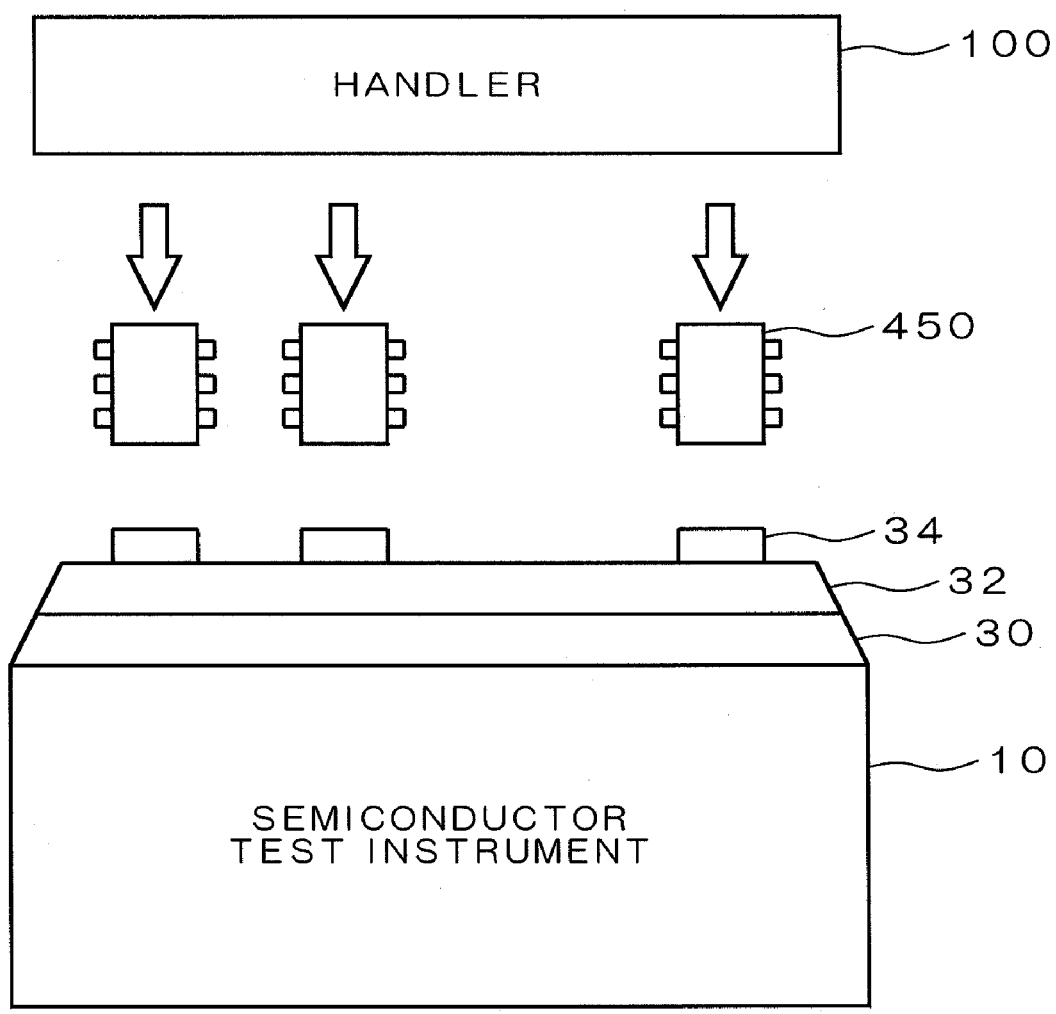
FIG. 56 is an illustration showing the outline of the timing calibration using a calibration device.

FIG. 55 is an illustration showing a connection state between a calibration device and a semiconductor test instrument. Moreover, FIG. 56 is an illustration showing the outline of the timing calibration using a calibration device. As shown in FIG. 55, a calibration device 450 is set while the performance board (PB) 30, socket board (SB) 32, and IC socket 34 are set to the semiconductor test instrument 10. The calibration device 450 has the same external shape and terminal shape as a DUT and the internal wiring state is set like the case of the calibration board of each embodiment. In the case of each of the above embodiments, it is necessary to exchange calibration boards manually or automatically by a robot according to necessity. However, when using the calibration device 450, it is possible to exchange the calibration device 450 by using a handler 100 for exchanging DUTs in the normal semiconductor test. Therefore, it is possible to save the labor for exchange compared to the case of performing manual exchange. Moreover, it is possible to reduce the cost compared to the case of performing automatic exchange by an exclusive robot because the robot is unnecessary.

Figure 57:
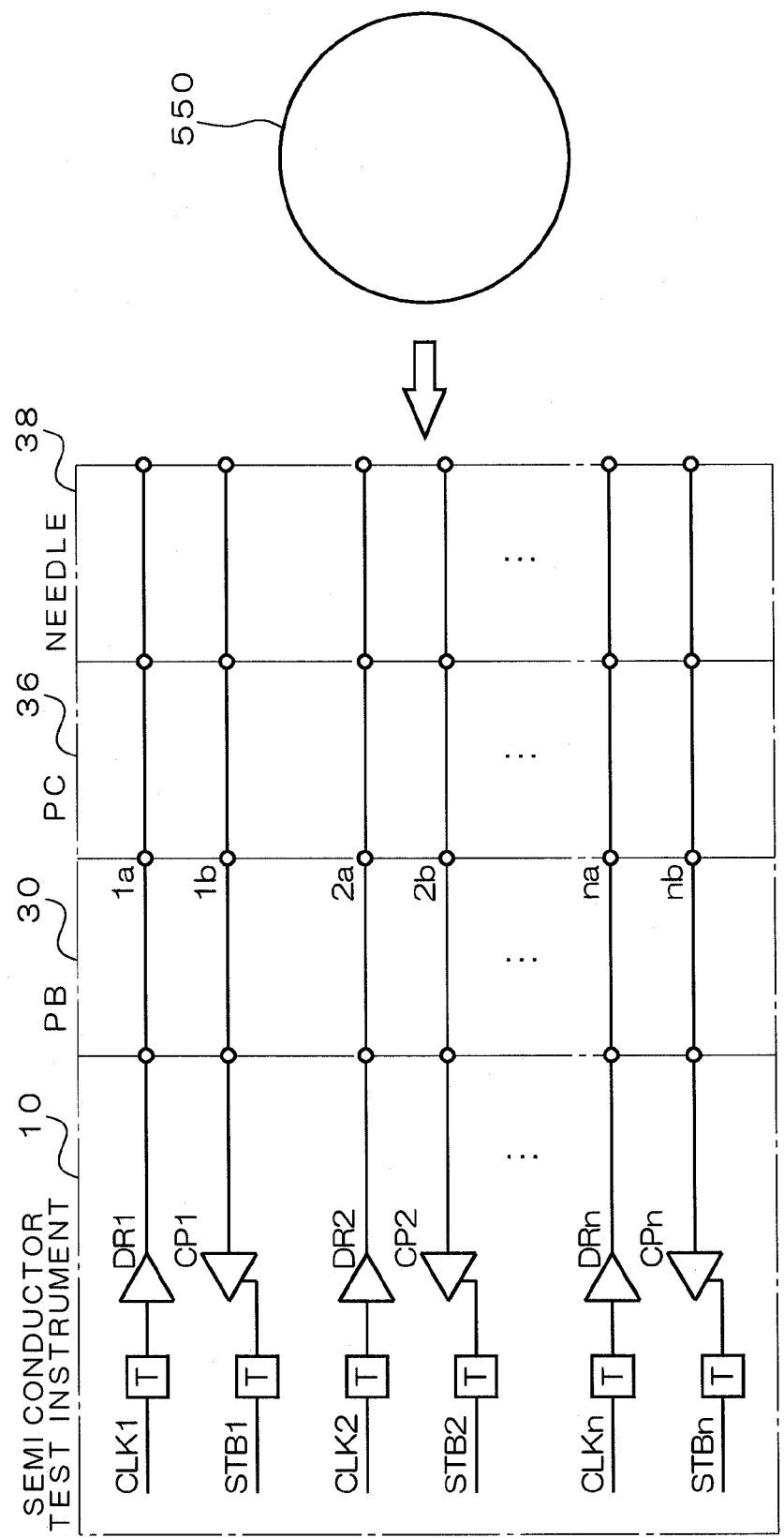
FIG. 57 is an illustration showing a connection state between a calibration wafer and a semiconductor test instrument.
Figure 58:
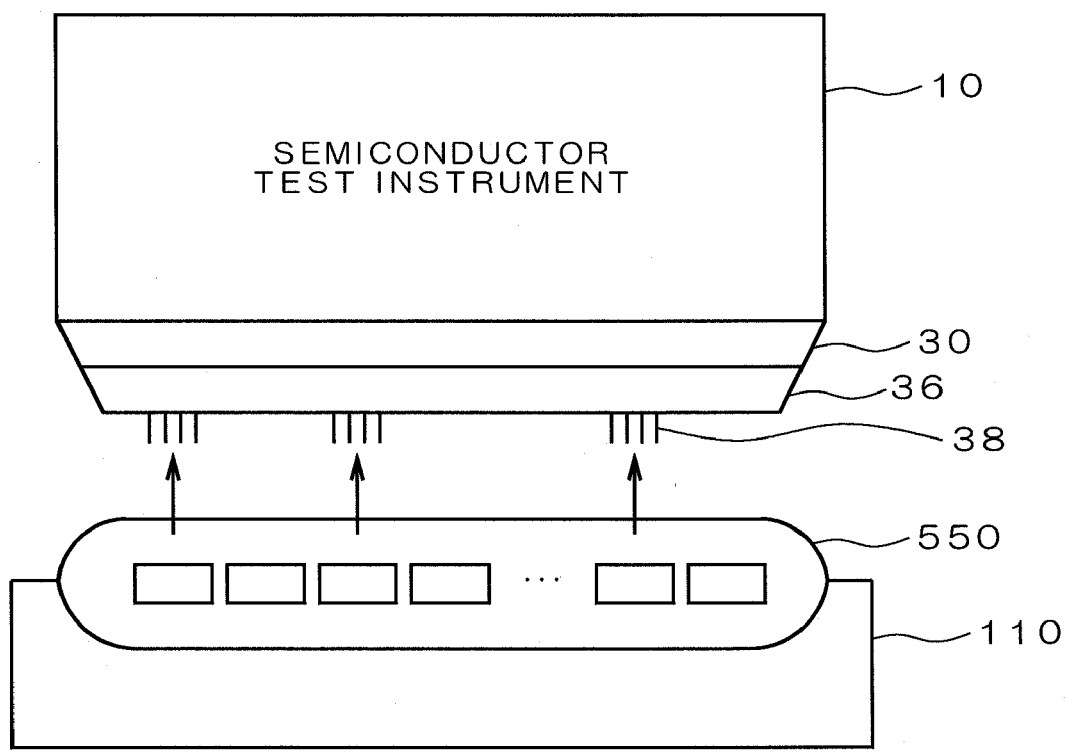
FIG. 58 is an illustration showing the outline of the timing calibration using a calibration wafer.

FIG. 57 is an illustration showing a connection state between a calibration wafer and a semiconductor test instrument. FIG. 58 is an illustration showing the outline oft the timing calibration using a calibration wafer. To test a DUT that formed on a wafer by using the semiconductor test instrument, a probe card (PC) 36 is set to the performance board 30 to bring a needle 38 protruded from the probe card 36 into contact with a pad formed on a wafer. Therefore, by replacing the wafer in which the DUT is formed with a calibration wafer 550 whose internal wiring state is set the same as the wiring state of the calibration board of each embodiment above described, it is possible to perform timing calibration. Moreover, in the case of each embodiment described above, it is necessary to manually exchange calibration boards or automatically exchange calibration boards by a robot. However, when using the calibration wafer 550, it is possible to exchange the calibration wafer 550 by using a chuck 110 for moving a wafer to be measured in the normal semiconductor test. Therefore, it is possible to save the labor for exchange compared to the case of performing manual exchange. Moreover, it is possible to reduce the cost compared to the case of performing automatic exchange by an exclusive robot because the robot is unnecessary In the case of examples shown in FIGS. 57 and 58, a semiconductor test instrument for securing an electrical contact with the calibration wafer 550 or a wafer in which a DUT is actually formed by the needle 38 on the probe card 36 is described. However, it is also allowed to secure an electrical contact by a method other than the needle 38 or through, for example, a bump.

Then, a specific example of the above calibration device 450 is described below.

Figure 59:
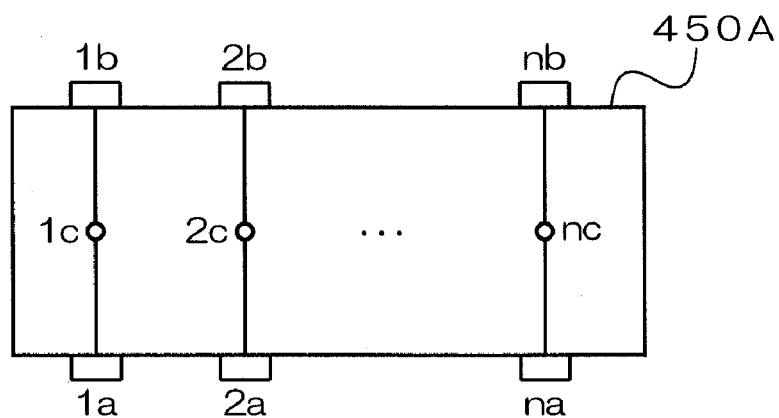
FIG. 59 is an illustration showing a calibration device realizing the same wiring state as the case of the calibration board used for the first embodiment.
Figure 60:
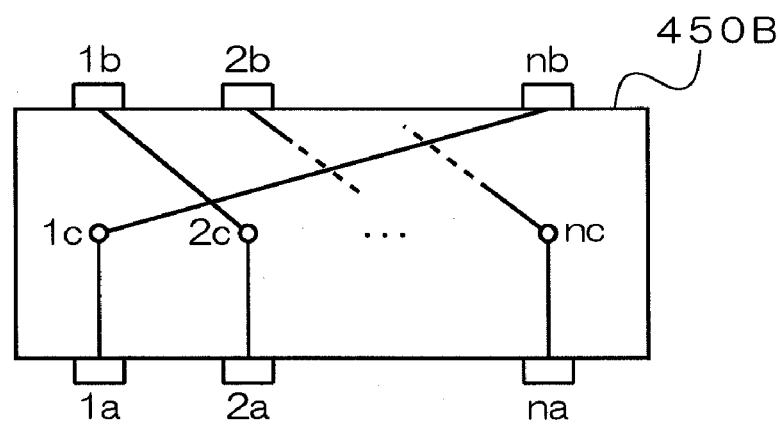
FIG. 60 is an illustration showing a calibration device realizing the same wiring state as the case of a calibration board used for the first embodiment.

FIGS. 59 and 60 are illustrations showing calibration devices realizing the same wiring state as the case of the calibration boards used for the above first embodiment. One calibration device 450A shown in FIG. 59 has the same wiring state as the calibration board 50A shown in FIG. 2. Moreover, the other calibration board 450B shown in FIG. 60 has the same wiring state as the calibration board 50B shown in FIG. 3. Terminals and short connection points of the calibration devices 450A and 450B shown in FIGS. 59 and 60 are provided with the same numeral numbers as corresponding terminals and short connection points of the calibration boards 50A and 50B shown in FIGS. 2 and 3. By setting these calibration devices 450A and 450B in order, it is possible to execute timing calibration in accordance with the procedure (operation procedure shown in FIG. 4) same as the case of the first embodiment using the calibration boards 50A and 50B.

Figure 61:
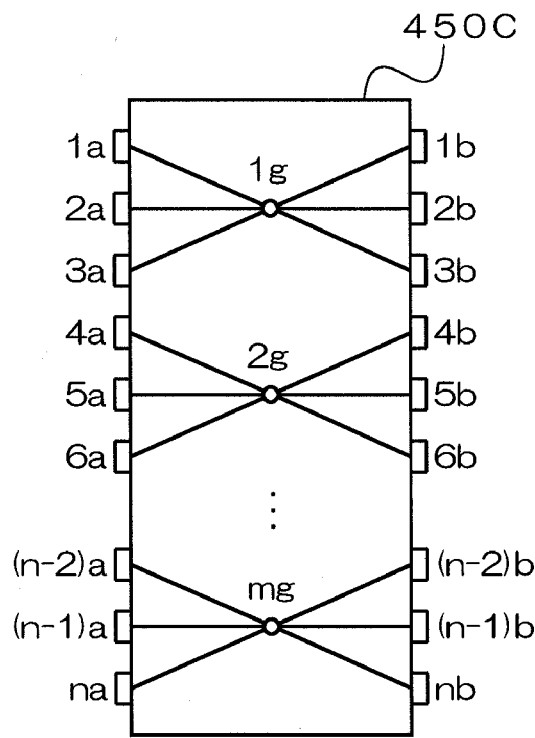
FIG. 61 is an illustration showing a calibration device realizing the same wiring state as the case of the calibration board used for the third embodiment.
Figure 62:
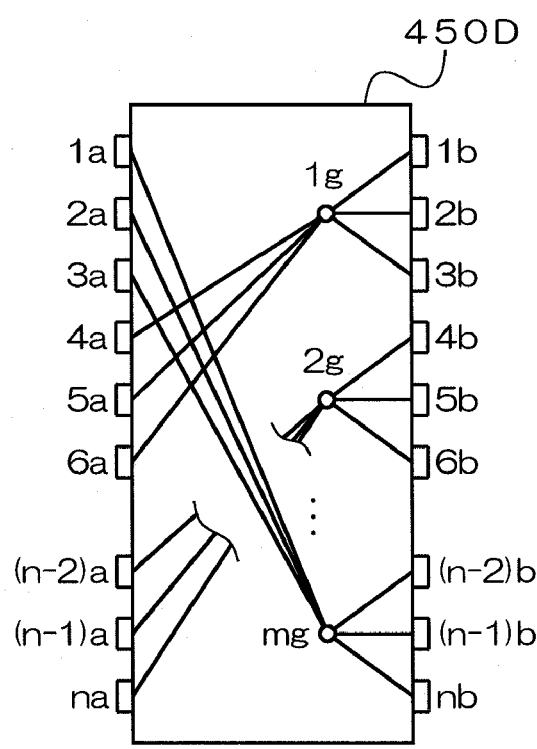
FIG. 62 is an illustration showing a calibration device realizing the same wiring state as the case of the calibration board used for the third embodiment.

FIGS. 61 and 62 are calibration devices realizing the same wiring state as the case of the calibration boards used for the above third embodiment. One calibration device 450C shown in FIG. 61 has the same wiring state as the calibration board 150A shown in FIG. 14. Moreover, the other calibration device 450D has the same wiring state as the calibration board 150B shown in FIG. 15. By setting these calibration devices 450C and 450D in order, it is possible to execute timing calibration in accordance with the procedure (operation procedure shown in FIG. 17) same as the case of the third embodiment using the calibration boards 150A and 150B.

Figure 63:
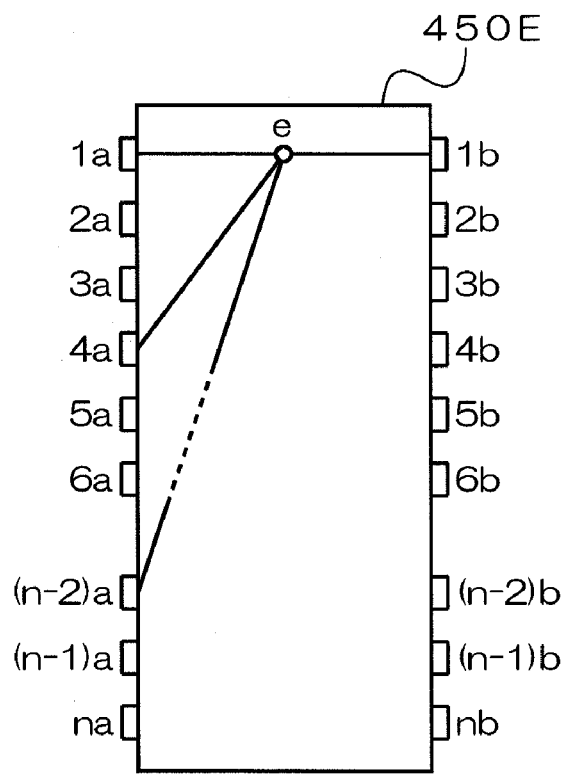
FIG. 63 is an illustration showing a calibration device realizing the same wiring state as the case of the calibration board used for the fifth embodiment.
Figure 64:
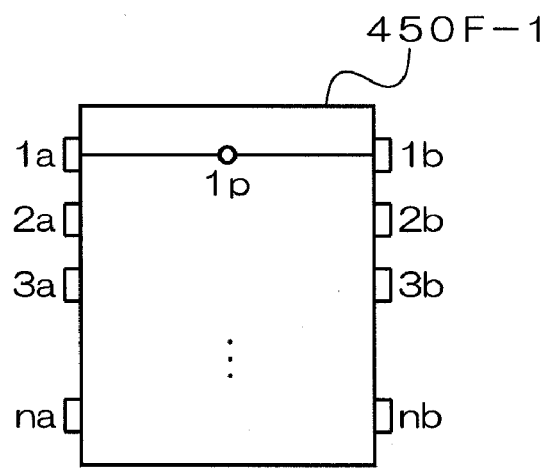
FIG. 64 is an illustration showing a calibration device realizing the same wiring state as the case of the calibration board used for the eighth embodiment.
Figure 65:
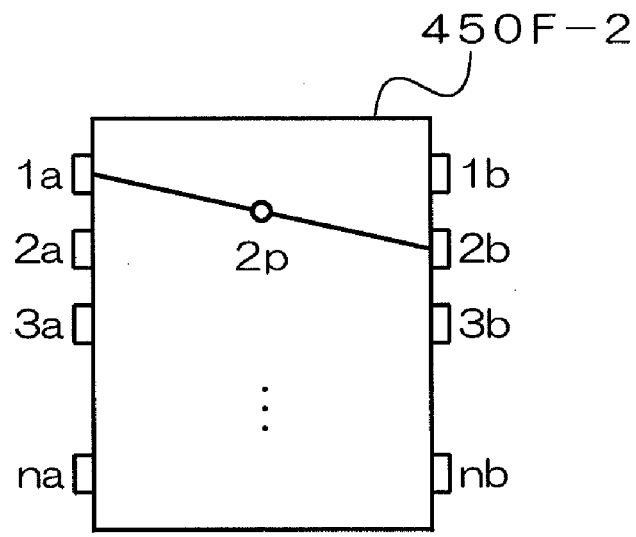
FIG. 65 is an illustration showing a calibration device realizing the same wiring state as the case of the calibration board used for the eighth embodiment.
Figure 66:
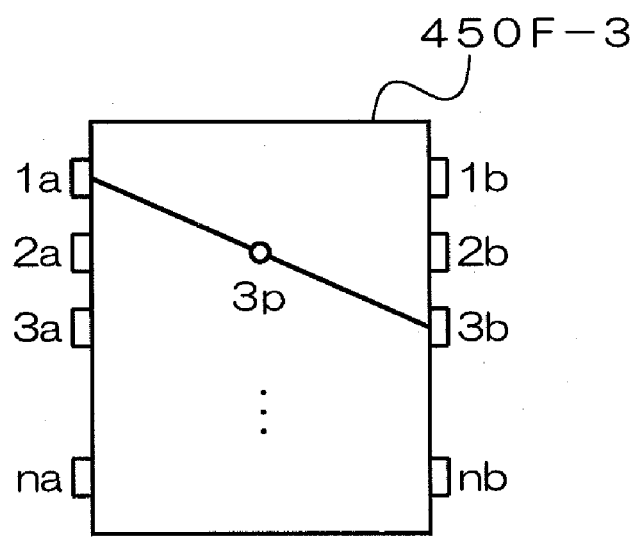
FIG. 66 is an illustration showing a calibration device realizing the same wiring state as the case of the calibration board used for the eighth embodiment.

FIG. 63 is an illustration showing a calibration device realizing the same wiring state as the case of the calibration boards used for the above fifth embodiment. The calibration device 450E shown in FIG. 63 has the same wiring state as the calibration board 250A shown in FIG. 29. Because the wiring state of the calibration board 250B shown in FIG. 30 is the same as the wiring state of the calibration device 450C shown in FIG. 61, the calibration device 450C is used by being combined with the above calibration device 450E. By setting these calibration devices 450E and 450C in order, it is possible to execute timing calibration in accordance with the procedure (operation procedure shown in FIG. 31) same as the case of the fifth embodiment using the calibration boards 250A and 250B.

FIGS. 64 to 68 are illustrations showing calibration devices realizing the same wiring state as the case of the calibration boards used for the above eighth embodiment. The calibration devices 450F-1 shown in FIG. 64 has the same wiring state as the calibration board 350A-1 shown in FIG. 44. The calibration device 450F-2 shown in FIG. 65 has the same wiring state as the calibration board 350A-2 shown in FIG. 45. The calibration device 450F-3 shown in FIG. 66 has the same wiring state as the calibration board 350A-3 shown in FIG. 46. The calibration device 450F-n has the same wiring state as the calibration board 350A-n shown in FIG. 47. Moreover, the calibration device 450G shown in FIG. 68 has the same wiring state as the calibration board 350B shown in FIG. 48. By setting these calibration devices 450F-1 t 450F-n and 450G in order, it is possible to execute timing calibration in accordance with the procedure (operation procedure shown in FIG. 49) same as the case of the eighth embodiment using the calibration boards 350A-1 to 350A-n and 350B.

Then, specific examples of the above calibration devices 450 are described below.

Figure 69:
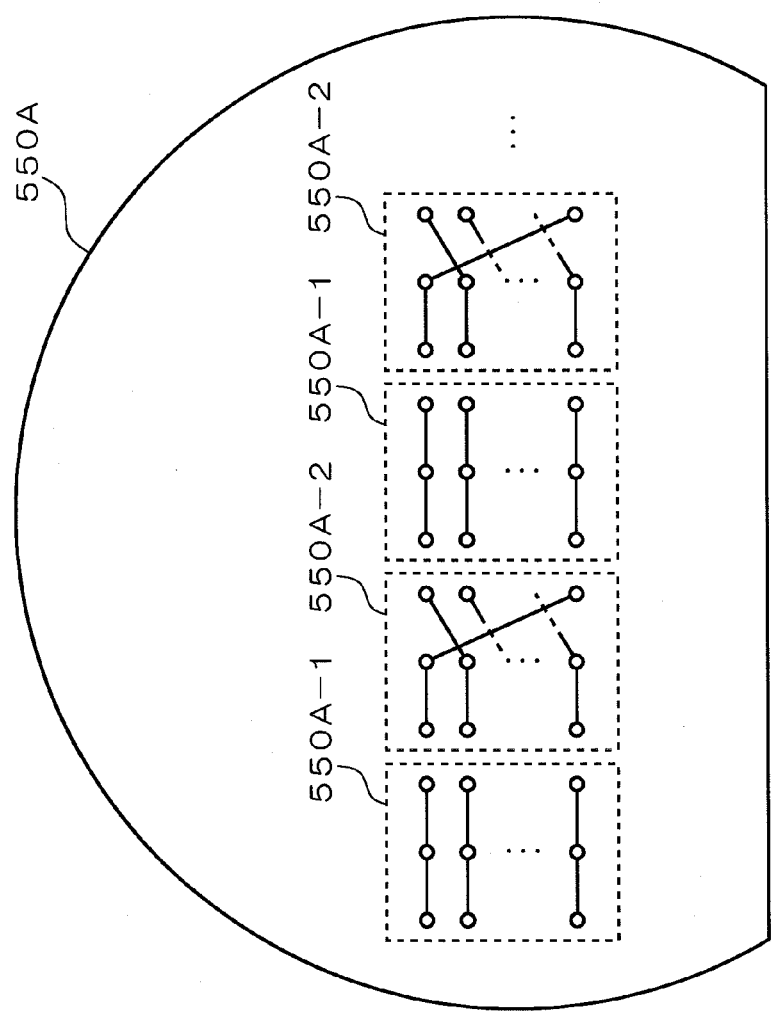
FIG. 69 is an illustration showing a calibration wafer realizing the same wiring state as the case of the calibration boards used for the first embodiment.

FIG. 69 is an illustration showing a calibration wafer realizing the same wiring state as the case of the calibration boards used for the above first embodiment. Because the calibration wafer shown in FIG. 69 or the like is used to realize the same wiring state as the case of the above calibration boards, it is not always necessary to use a wafer formed by a semiconductor material but it is allowed to form a calibration board by using an inexpensive material other than a semiconductor material such as epoxy resin.

The calibration wafer 550A shown in FIG. 69 includes a first region 550A-1 in which the same wiring as the case of the calibration board 50A shown in FIG. 2 is made and a second region 550A-2 in which the same wiring as the case of the calibration board 50B shown in FIG. 3 is made. By bringing the needle 38 of the probe card 36 into contact with these first and second regions 550A-1 and 550A-2 in order, it is possible to execute timing calibration in accordance with the procedure (operation procedure shown in FIG. 4) same as the case of the first embodiment using the calibration boards 50A and 50B.

Figure 70:
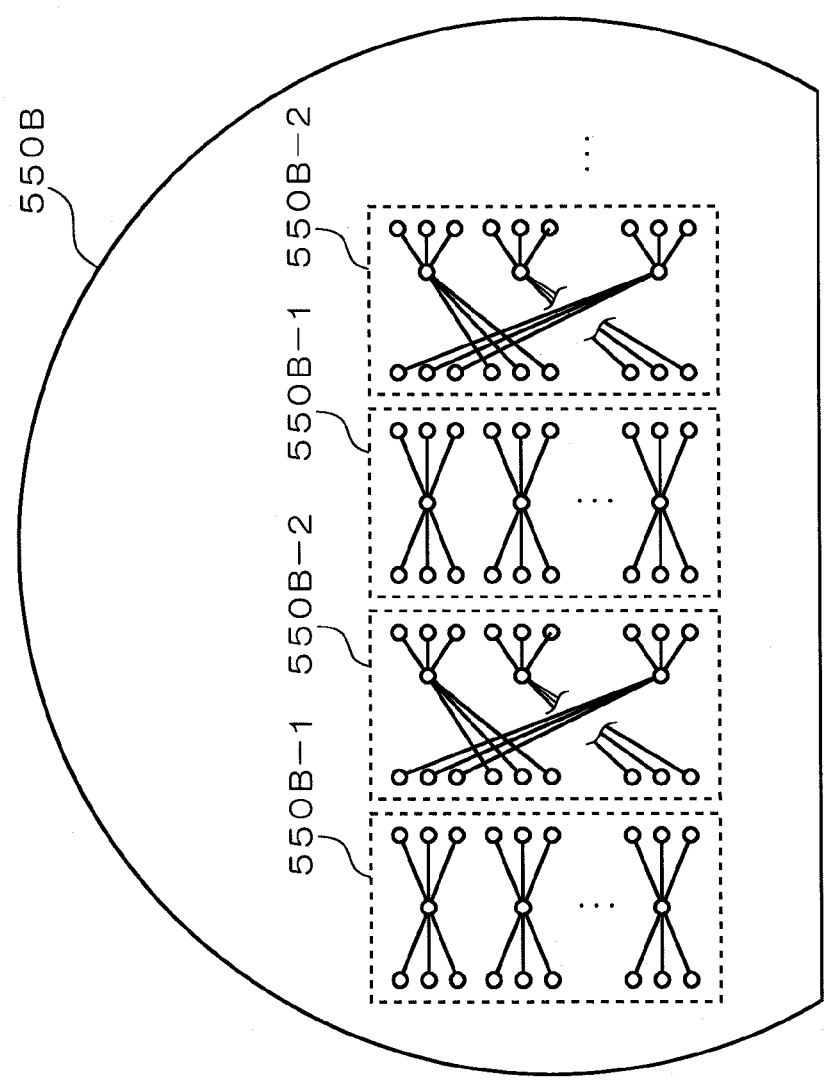
FIG. 70 is an illustration showing a calibration wafer realizing the same wiring state as the case of the calibration board used for the third embodiment.

FIG. 70 is an illustration showing a calibration wafer realizing the same wiring state as the case of the calibration board used for the above third embodiment. The calibration wafer 550B shown in FIG. 70 includes a first region 550B-1 in which the same wiring as the case of the calibration board 150A shown in FIG. 14 is made and a second region 550B-2 in which the same wiring as the case of the calibration board 250B in FIG. 15 is made. By bringing the needle 38 of the probe card 36 into contact with these first and second regions 550B-1 and 550B-2 in order, it is possible to execute timing calibration in accordance with the procedure (operation procedure shown in FIG. 17) same as the case of the third embodiment using the calibration boards 150A and 150B.

Figure 71:
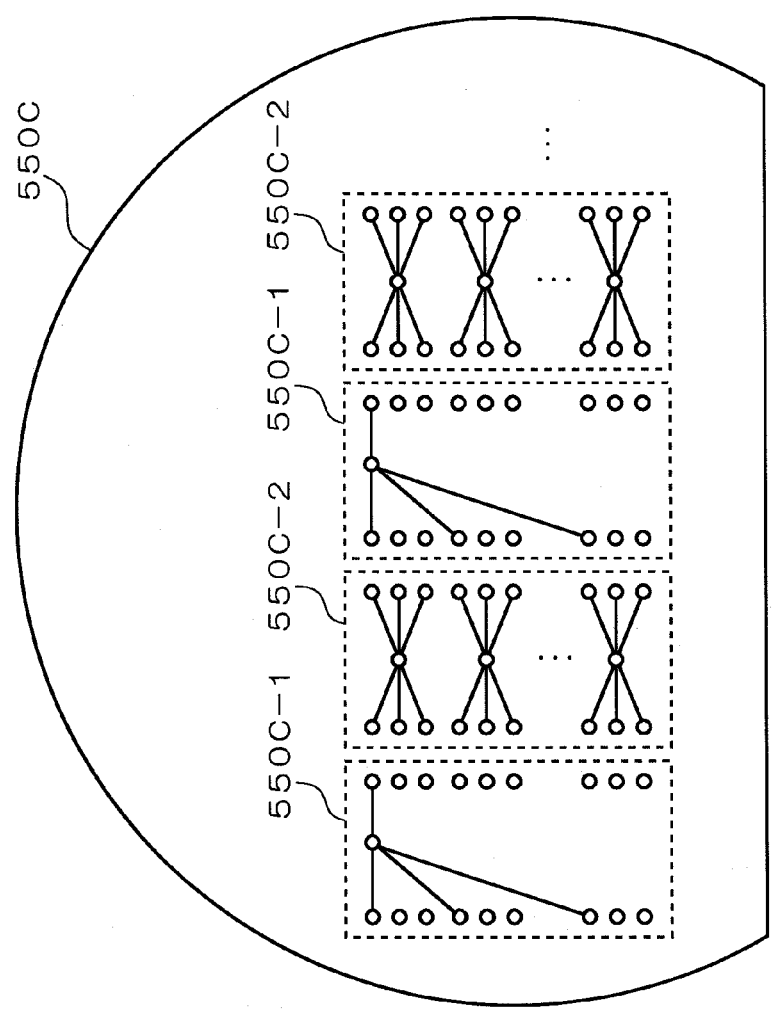
FIG. 71 is an illustration showing a calibration wafer realizing the same wiring state as the case of the calibration board used for the fifth embodiment.

FIG. 71 is an illustration showing a calibration wafer realizing the same wiring state as the case of the calibration boards used for the above fifth embodiment. The calibration wafer 550C shown in FIG. 71 includes a first region 550C-1 in which the same wiring as the case of the calibration board 250A shown in FIG. 29 is made and a second region 550C-2 in which the same wiring as the case of the calibration board 250B shown in FIG. 30 is made. By bringing the needle 38 of the probe card 36 into contact with these first and second regions 550C-1 and 550C-2 in order, it is possible to execute timing calibration in accordance with the procedure (operation procedure shown in FIG. 31) same as the case of the fifth embodiment using the calibration boards 250A and 250B.

Figure 72:
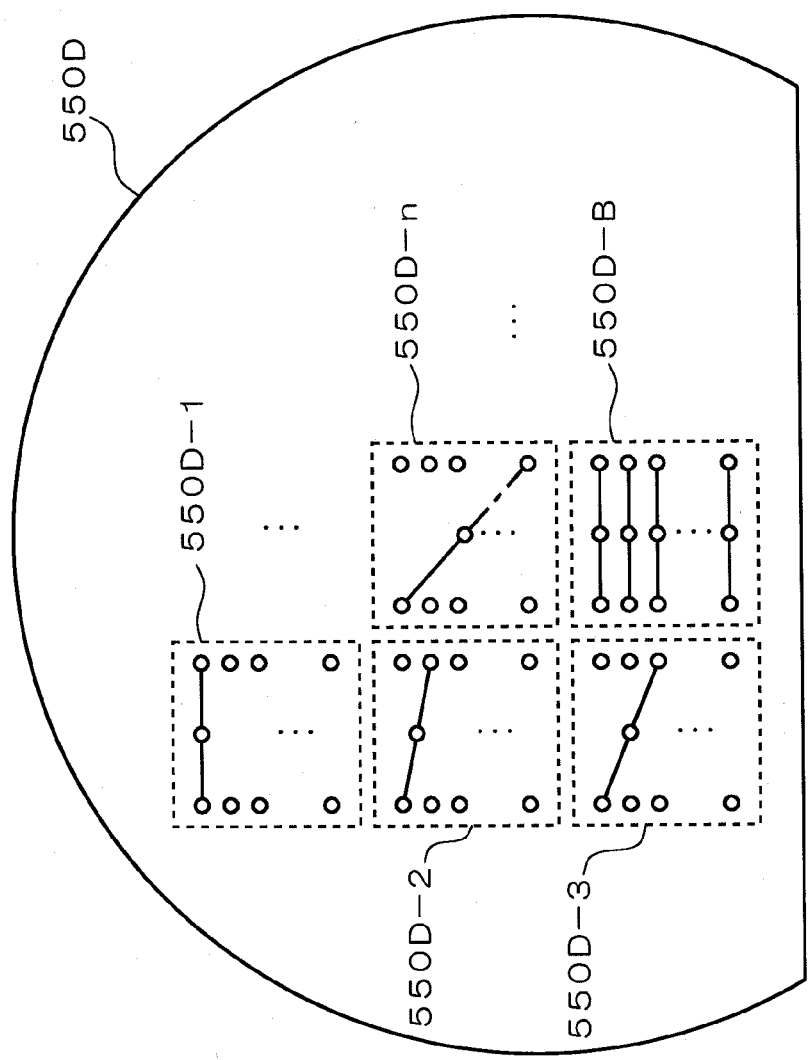
FIG. 72 is an illustration showing a calibration wafer realizing the same wiring state as the case of the calibration board used for the eighth embodiment.
Figure 73:
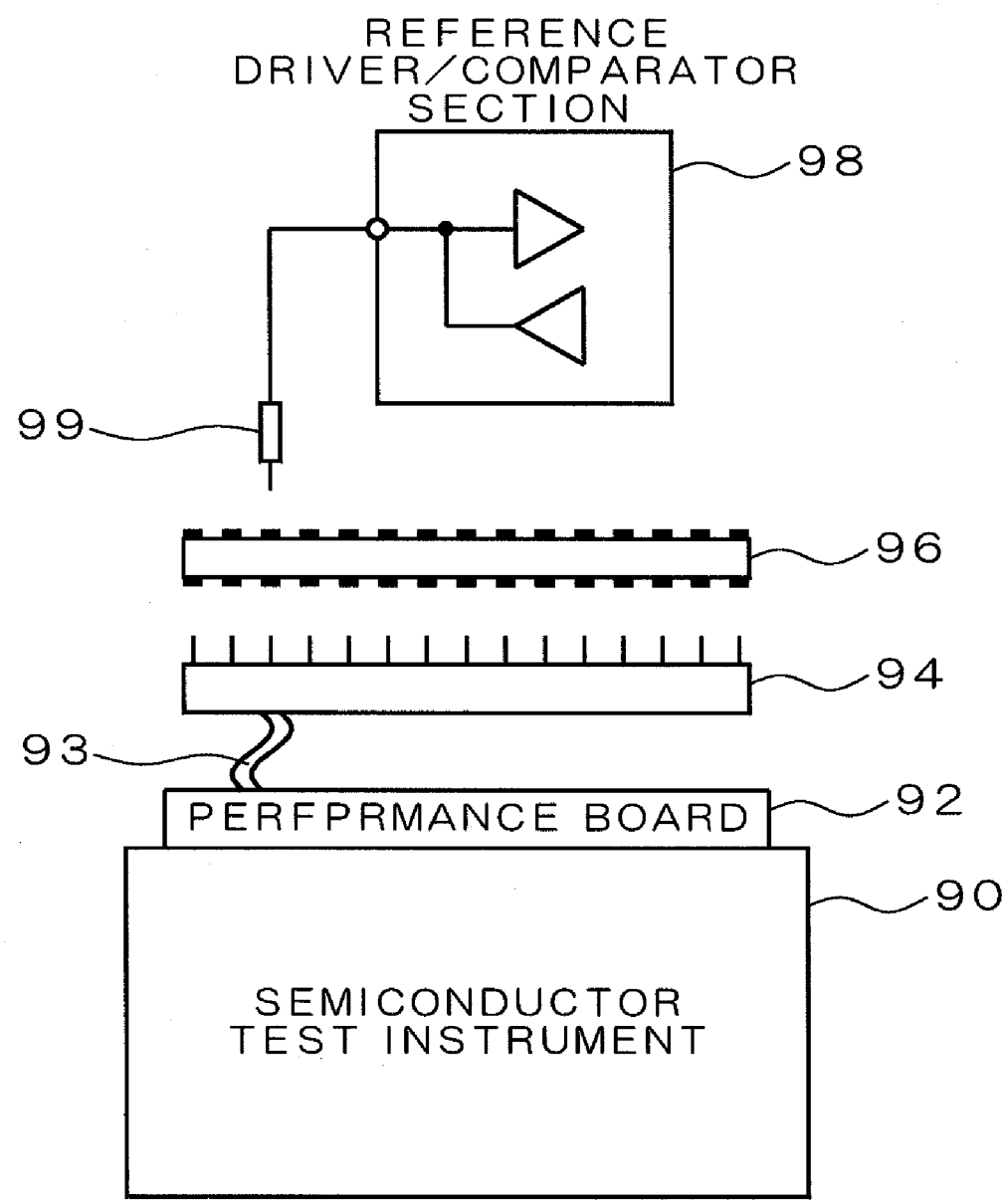
FIG. 73 is an illustration showing a conventional configuration for performing the timing calibration of a semiconductor test instrument.
Figure 74:
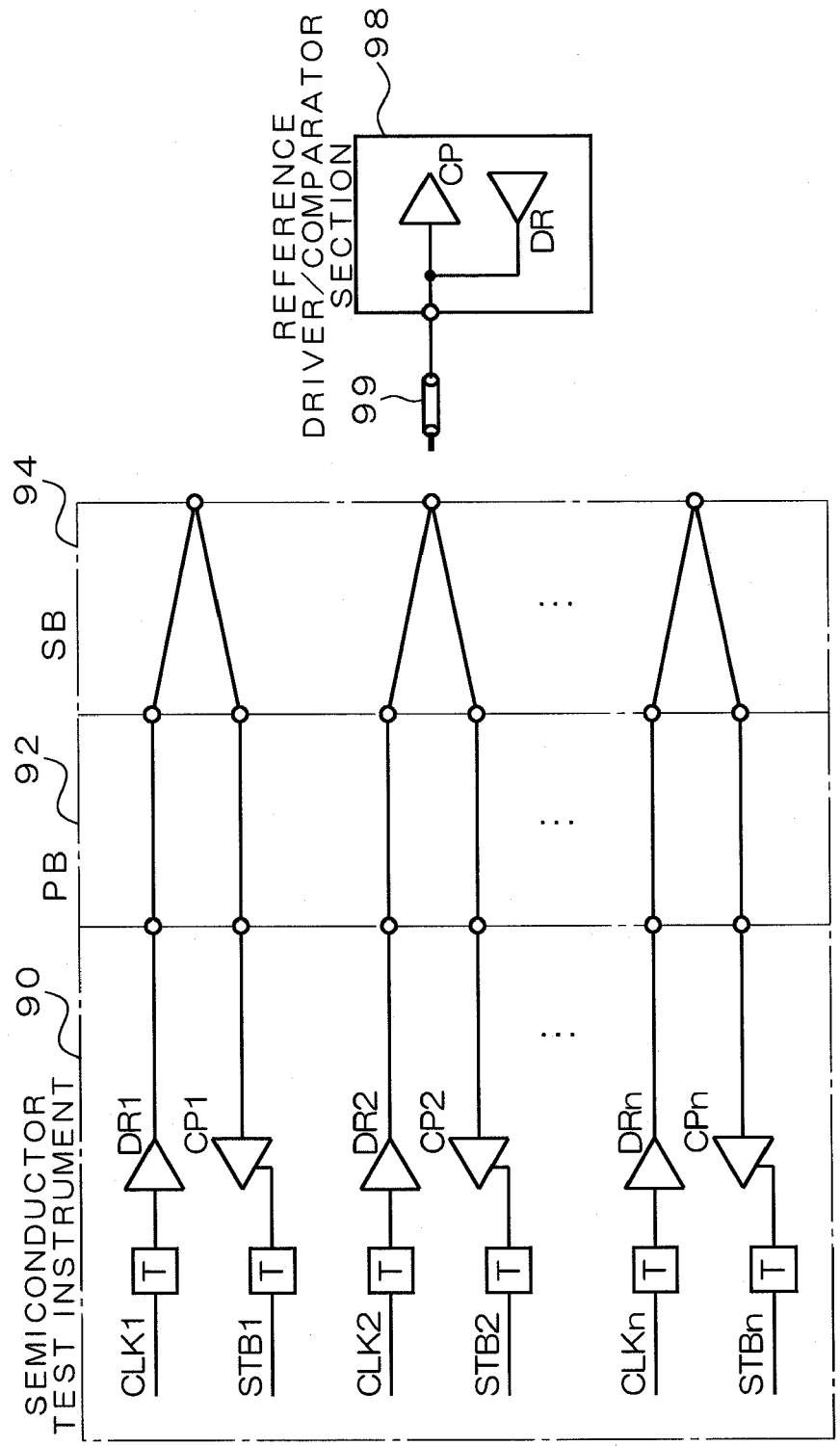
FIG. 74 is an electrical layout diagram of the conventional configuration shown in FIG. 73.
Figure 75:
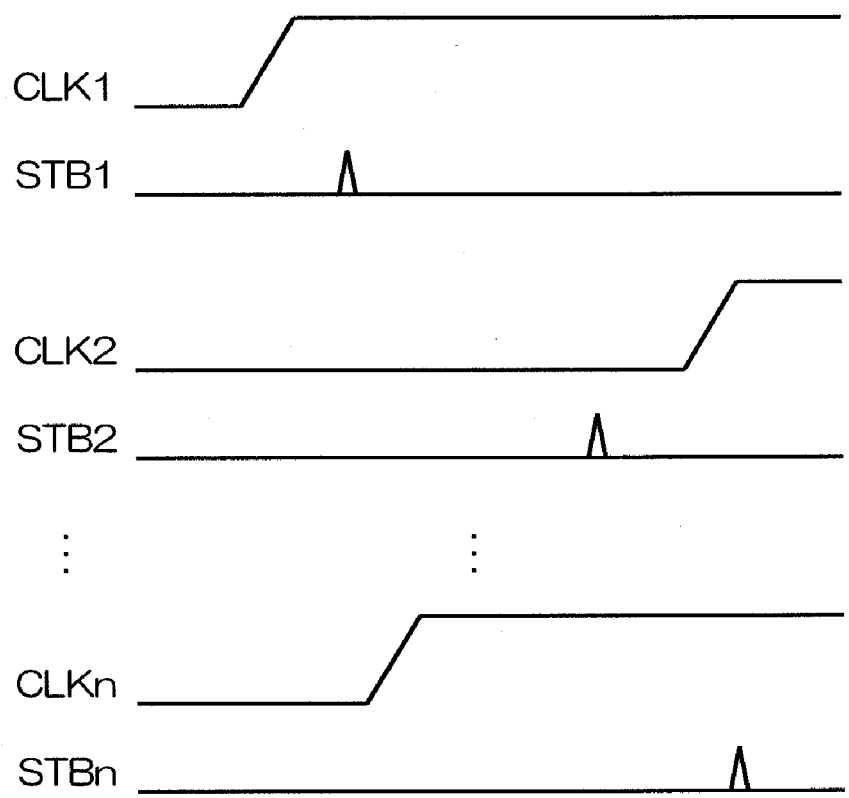
FIG. 75 is an illustration showing the outline of conventional timing calibration.
Figure 76:
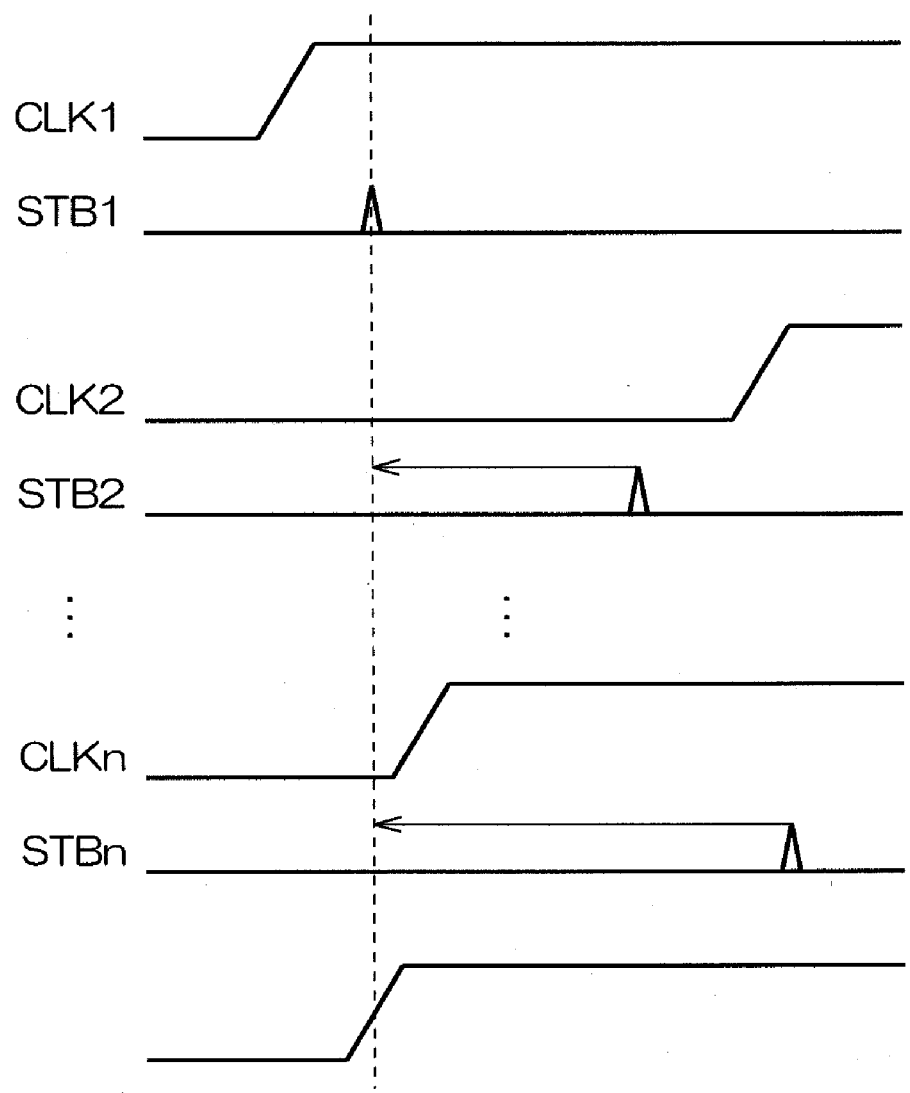
FIG. 76 is an illustration showing the outline of conventional timing calibration.
Figure 77:
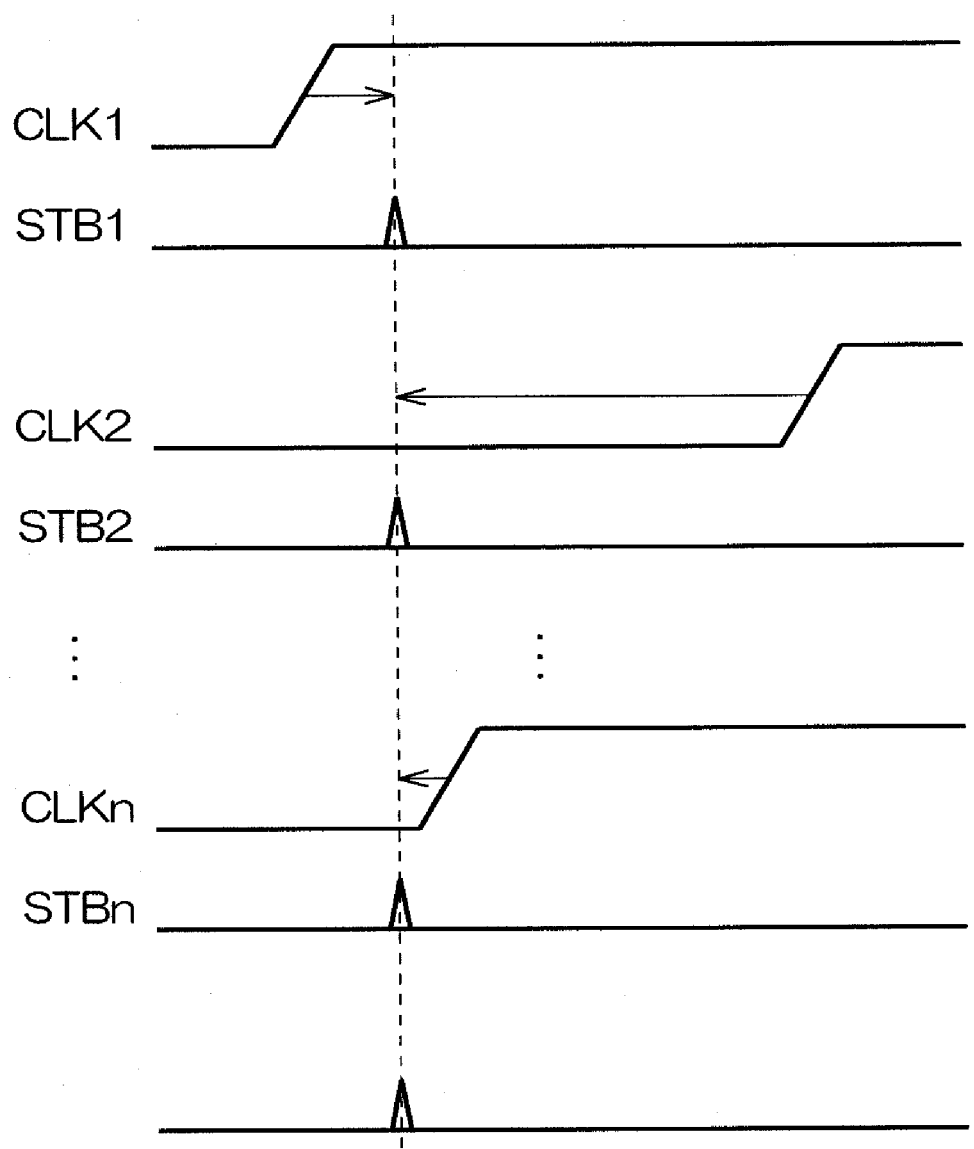
FIG. 77 is an illustration showing the outline of conventional timing calibration.

FIG. 72 is an illustration showing a calibration wafer realizing the same wiring state as the case of the calibration boards used for the above eighth embodiment. The calibration wafer 550D shown in FIG. 72 includes a region 550D-1 in which the same wiring as the case of the calibration board 350A-1 shown in FIG. 44 is made, a region 550D-2 in which the same wiring as the case of the calibration board 350A-2 shown in FIG. 45, a region 550D-3 in which the same wiring as the case of the calibration board 350A-3 shown in FIG. 46, a region 550D-n in which the same wiring as the case of the calibration board 350A-n shown in FIG. 47, and a region 550D-B in which the same wiring as the case of the calibration board 350B shown in FIG. 48. By bringing the needle 38 of the probe card 36 into contact with these regions 550D-1 to 550D-n and 550D-B in order, it is possible to execute timing calibration in accordance with the procedure (operation procedure shown in FIG. 49) same as the case of the eighth embodiment using the calibration boards 350A-1 to 350A-n and 350B.

The present invention is not restricted to the above embodiments. Various modifications can be embodied in the range of the gist of the present invention. For example, though exclusive calibration boards 50A, 50B, 150A, and 150B are used for the above embodiment, it is also allowed to change wiring contents by applying the same wiring as the case of the calibration board 50B, 150A, or 150B to a socket board and properly changing over changeover switches at the time of calibration operation.

Moreover, though a case in which the output end of a driver and the input end of a comparator both of which constitute a set are separately connected to a short connection point is considered for the above embodiments, it is also possible to apply the present invention to a case in which the output end of a driver and the input end of a comparator are connected each other in the semiconductor test instrument 10 or performance board 30 and the connection point and the input end and a short connection point are connected each other through one wiring. However, because an object of phase correction through the calibration in the above case is the range up to the above connection point, it is necessary to previously measure the time length of the wiring between the connection point and the short connection point.

INDUSTRIAL APPLICABILITY

As described above, according to the present invention, it is unnecessary to use a reference driver/comparator section, a probe connected to the section, and exclusive robot for automating movement and contact of the probe only to perform timing calibration. Therefore, it is possible to greatly reduce the cost.

Moreover, it is possible to adjust phases of a clock signal and a strobe signal and measure the phase difference between strobe signals by using a first or second calibration board. Therefore, it is possible to simplify working contents compared to the conventional method in which the phase of a clock signal or strobe signal is adjusted every device socket end by using a probe. Particularly, because mechanical working includes only exchange of a first calibration board to a second calibration board, it is possible to greatly shorten the working time of the whole timing calibration.

The invention claimed is:

1. A method for calibrating a semiconductor test instrument for performing timing calibration of a semiconductor test instrument having drivers for generating signals synchronizing with clock signals and comparators for performing comparisons synchronizing with strobe signals, comprising:
   a first step of adjusting phases of said strobe signals corresponding to an in-group common comparator by using one of said comparators included in each group as the in-group common comparator on the basis of said clock signals corresponding to a common driver by using one of said drivers as the common driver while said drivers and said comparators are divided into m number of groups so that two or more of said drivers or said comparators are included;
   a second step of adjusting phases of said clock signals on the basis of said strobe signals corresponding to said in-group common comparator in each of said m number of groups; and
   a third step of adjusting phases of said strobe signals corresponding to said comparators included in the same group on the basis of said clock signals corresponding to any one of said drivers in each of said m number of groups.

2. The method for calibrating a semiconductor test instrument according to claim 1, characterized in that the phase adjustment to be executed in said first step is performed by varying phases of said strobe signals input to said in-group common comparators so that timings for performing comparisons by said each of in-group common comparators in accordance with said strobe signals coincide with timings at which signals output from said common drivers and input to said in-group common comparators are changed.

3. The method for calibrating a semiconductor test instrument according to claim 1, characterized in that the phase adjustment to be executed in said second step is performed by varying phase of said clock signals so that timings for performing comparisons by said in-group common comparators in accordance with said strobe signals coincide with timings at which signals output from said drivers and input to said in-group common comparators are changed.

4. The method for calibrating a semiconductor test instrument according to claim 1, characterized in that the phase adjustment to be executed in said third step is performed by varying phases of said strobe signals so that timings for performing comparisons by said comparators in accordance with said strobe signals coincide with timings at which signals output from said drivers and input to said comparators are changed.

5. The method for calibrating a semiconductor test instrument according to claim 1, characterized in that a delay element for varying the phase of a signal is inserted into each of supply routes of said clock signals to said drivers and each of supply routes of said strobe signals to said comparators.

6. The method for calibrating a semiconductor test instrument according to claim 1, characterized in that said first step is executed by using a first calibration board in which output ends of said common drivers and input ends of said in-group common comparators are connected each other through a first common short connection point.

7. The method for calibrating a semiconductor test instrument according to claim 6, characterized in that said second and third steps are executed by using a second calibration board in which output ends of said drivers and input ends of said comparators are connected each other through a second common short connection point for each of said groups.

8. The method for calibrating a semiconductor test instrument according to claim 7, characterized in that lengths of wirings for connecting said drivers with said first and second short connection points and lengths of wirings for connecting said comparators with said first and second short connection points are set so as to be all equalized.

9. The method for calibrating a semiconductor test instrument according to claim 7, characterized in that a fourth step of exchanging said first calibration board with said second calibration board is included between said first step and said second step.

10. The method for calibrating a semiconductor test instrument according to claim 1, characterized in that said first step is executed by using a third calibration board in which output ends of said common drivers and input ends of said in-group common comparators included in each of said number of groups are connected each other through wirings having equal time lengths for all of said groups, and said second and third steps are executed by changing over wiring states of said third calibration board so that output ends of said drivers and input ends of said comparators included in each of said groups are connected each other through wirings having equal time lengths for all of said groups.

11. The method for calibrating a semiconductor test instrument according to claim 10, characterized in that said third calibration board includes a plurality of changeover switches for changing over wiring states and operations of said first, second, and third steps are executed by changing over connection states of these changeover switches.

12. The method for calibrating a semiconductor test instrument according to claim 1, characterized in that said first step is executed by using a first calibration device in which output ends of said common drivers and input ends of said in-group common comparators are connected each other through a first common short connection point.

13. The method for calibrating a semiconductor test instrument according to claim 12, characterized in that said second and third steps are executed by using a second calibration device in which output ends of said drivers and input ends of said comparators are connected each other through a second common short connection point for each of said groups.

14. The method for calibrating a semiconductor test instrument according to claim 13, characterized in that a fourth step of exchanging said first calibration device with said second calibration device by a handler is included between said first step and said second step.

15. The method for calibrating a semiconductor test instrument according to claim 1, characterized in that
said first step is executed by using a first region in a first calibration wafer in which output ends of said common drivers and input ends of said in-group common comparators are connected each other through a first common short connection point, and said second and third steps are executed by using a second region in a second calibration wafer in which output ends of said drivers and input ends of said comparators are connected each other through a second common short connection point for each of said groups.

16. The method for calibrating a semiconductor test instrument according to claim 15, characterized in that said first calibration wafer and said second calibration wafer are said same wafer and said first and second regions are formed in said same wafer.

* * * * *